(12) United States Patent
Kutsumizu et al.

(10) Patent No.: US 10,710,333 B2
(45) Date of Patent: Jul. 14, 2020

(54) HEAT TRANSPORT STRUCTURE AND MANUFACTURING METHOD THEREOF

(71) Applicant: KANEKA CORPORATION, Osaka-shi (JP)

(72) Inventors: Makoto Kutsumizu, Settsu (JP); Satoshi Oku, Settsu (JP); Yusuke Kato, Settsu (JP); Yasushi Nishikawa, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 322 days.

(21) Appl. No.: 15/539,253

(22) PCT Filed: Dec. 25, 2015

(86) PCT No.: PCT/JP2015/086358
§ 371 (c)(1),
(2) Date: Jun. 23, 2017

(87) PCT Pub. No.: WO2016/104759
PCT Pub. Date: Jun. 30, 2016

(65) Prior Publication Data
US 2017/0368795 A1 Dec. 28, 2017

(30) Foreign Application Priority Data

Dec. 25, 2014 (JP) .................. 2014-263444
Aug. 19, 2015 (JP) .................. 2015-162288

(51) Int. Cl.
*B32B 3/10* (2006.01)
*B32B 9/04* (2006.01)
(Continued)

(52) U.S. Cl.
CPC .................. *B32B 9/04* (2013.01); *B32B 9/00* (2013.01); *B32B 9/007* (2013.01); *B32B 9/045* (2013.01);
(Continued)

(58) Field of Classification Search
None
See application file for complete search history.

(56) References Cited

U.S. PATENT DOCUMENTS

2015/0375480 A1  12/2015  Kutsumizu et al.

FOREIGN PATENT DOCUMENTS

JP  7-109171      4/1995
JP  9-213311 A    8/1997
(Continued)

OTHER PUBLICATIONS

Machine Translation of JP 2002284514 Oct. 2002.*
(Continued)

*Primary Examiner* — Christopher M Polley
(74) *Attorney, Agent, or Firm* — Oblon, McClelland, Maier & Neustadt, L.L.P.

(57) ABSTRACT

In order to provide a thermal transport structure excellent in bendability, heat dissipation property, and lightweight property and also a thermal transport structure having a high reliability against vibrations and an excellent heat transport performance, used is a thermal transport structure (5, 201) including stacked graphite sheets (1, 213). This thermal transport structure (5, 201) includes a fixing portion (10, 202, 301) in which the stacked graphite sheets (1, 213) are fixed to each other; and a thermally conductive portion (11, 203) in which the stacked graphite sheets (1, 213) are not fixed to each other.

6 Claims, 14 Drawing Sheets

(51) Int. Cl.
- *C04B 35/52* (2006.01)
- *F28F 3/00* (2006.01)
- *H01L 23/36* (2006.01)
- *H05K 7/20* (2006.01)
- *B32B 9/00* (2006.01)
- *C01B 32/20* (2017.01)
- *B32B 27/28* (2006.01)
- *B32B 27/32* (2006.01)
- *B32B 27/36* (2006.01)
- *C01B 32/182* (2017.01)

(52) U.S. Cl.
CPC ............ *B32B 27/281* (2013.01); *B32B 27/32* (2013.01); *B32B 27/36* (2013.01); *C01B 32/20* (2017.08); *C04B 35/52* (2013.01); *F28F 3/00* (2013.01); *H01L 23/36* (2013.01); *H05K 7/20* (2013.01); *C01B 32/182* (2017.08); *H01L 2924/0002* (2013.01)

(56) References Cited

FOREIGN PATENT DOCUMENTS

| JP | 2002-284514 A | 10/2002 |
| JP | 2002284514 A * | 10/2002 |
| JP | 2006-203014 | 8/2006 |
| JP | 2010-10599 | 1/2010 |
| JP | 2010-34422 A | 2/2010 |
| JP | 2012-160503 A | 6/2012 |
| WO | WO 2013/108597 A1 | 7/2013 |
| WO | WO-2013108597 A1 * | 7/2013 |
| WO | WO 2014/119666 A1 | 8/2014 |

OTHER PUBLICATIONS

Machine Translation of WO 2013108597 Jul. 2013.*
Extended European Search Report dated Nov. 13, 2018 in Patent Application No. 15873327.9, 20 pages.
Partial Supplementary European Search Report dated Jul. 25, 2018 in European Patent Application No. 15873327.9, 18 pages.
International Preliminary Report on Patentability and Written Opinion dated Jul. 6, 2017 in PCT/JP2015/086358 filed Dec. 25, 2015 (English translation only).
International Search Report dated Feb. 9, 2016 in PCT/JP2015/086358 filed Dec. 25, 2015.
Japanese Office Action dated Jan. 29, 2019 in Japanese Patent Application No. 2016-566552 (with unedited computer generated English translation), 9 pages.

* cited by examiner

HEAT TRANSPORT STRUCTURE AND MANUFACTURING METHOD THEREOF

TECHNICAL FIELD

The present invention relates to a thermal transport structure and a method for producing the thermal transport structure.

BACKGROUND ART

There has been a demand for a thermally conductive material capable of transferring heat from a heat source to a cooling source or a thermally conductive material capable of being used in a bent state during transfer of heat from a heat source to a cooling source. This demand is intended to deal with complication of internal structures of electronic devices. As such a thermally conductive material, conventionally, a metal material (e.g., copper or aluminum) such as metal foil has been used.

However, in recent years, the amount of heat which electronic devices generate has been increasing. Accordingly, a required thickness of a metal material has increased. This has been leading to insufficient flexibility of the metal material. Meanwhile, an increase in weight of the metal material has been also a problem. As a possible material which may solve the above problems, there is a graphite composite material in which graphite sheets each having a high thermal conductivity and lightweight properties are stacked in a layer stack. However, there has been a problem that bendability of a graphite composite material decreases in a case where graphite sheets are stacked via an adhesive or the like so as to form a layer stack as in Patent Literature 1. On the other hand, in a case where graphite sheets are stacked via no bonding layer, a gap is produced between graphite sheets, so that a contact thermal resistance disadvantageously increases. This has led to a problem that heat conductivity largely deteriorates at a part where heat from a heat source is received.

Further, in recent years, the amount of heat which electronic devices generate tends to increase as performance of the electronic devices improves. This has caused a problem that a required amount of a thermally conductive material to be used increases. Further, in a case where an electronic device is provided in a device such as a mobile medium or a driving section, vibrations generated by the device is transmitted directly to the electronic device. There has been a concern that such vibrations may cause a serious adverse effect to the electronic device. Further, there has been also a concern that the vibrations may cause metal fatigue of a thermally conductive material and may consequently lead to a decrease in heat conductivity of the thermally conductive material. In this way, reliability against vibrations has been low in a case where the metal material is used as a thermally conductive material. The phrase "reliability against vibrations is low" means that vibrations largely damage an electronic device and consequently, heat conductivity of the thermally conductive material is likely to deteriorate. Meanwhile, the phrase "reliability against vibrations is high" or "reliability against vibrations is sufficient" means that damage to an electronic device is small and accordingly, heat conductivity of the thermally conductive material is unlikely to deteriorate.

Patent Literature 1 discloses a thermally conductive body formed by laminating graphite films via a polymer layer. However, Patent Literature 1 does not disclose any thermal transport body capable of efficiently transporting heat. Further, Patent Literature 1 discloses a structure in which strip-shaped graphite sheets are bundled. However, in this structure, a part at which the graphite sheets are bundled is covered by another material. Accordingly, it is difficult to use the structure as a thermal transport structure which can be freely bent or which can prevent reliability deterioration caused by vibrations.

CITATION LIST

Patent Literature

[Patent Literature 1] Japanese Patent Application Publication Tokukaihei No. 7-109171 (Publication date: Apr. 25, 1995)

SUMMARY OF INVENTION

Technical Problem

An embodiment of the present invention is attained in view of the above conventional problems. An object of an embodiment of a first invention is to provide a thermal transport structure excellent in bendability, heat dissipation property, and lightweight property. An object of an embodiment of a second invention is to provide a thermal transport structure which has a high reliability against vibrations and an excellent heat transport performance.

Solution to Problem

In view of the above problems, the inventors of the present invention have found that in order to provide a graphite composite material excellent in bendability, heat dissipation property, and lightweight property, it is effective to form a plurality of fixing portions and a thermally conductive portion provided between adjacent fixing portions in a thermal transport structure in which a plurality of graphite sheets are stacked. As a result, the inventors have accomplished the present invention (first invention).

Further, in view of the above problems, the inventors of the present invention have found that in order to provide a thermal transport structure which has a high reliability against vibrations, it is effective to arrange, as follows, a thermal transport structure including a thermally conductive sheet each provided with at least two fixing portions and a thermally conductive portion between the at least two fixing portions. That is, the inventors has found that it is effective to set a resilience against bending to not more than 40 N/cm in a case where (i) the thermally conductive portion is bent such that the thermally conductive portion is compressed by 10% in length and (ii) then, the fixing portions at both ends are fixed so as not to move. As a result, the inventors have accomplished the present invention (second invention).

The following (1) to (26) correspond to embodiments of the first invention, and the following (27) to (34) correspond to embodiments of the second invention.

(1) In order to solve the above problem, a thermal transport structure in accordance with an embodiment of the present invention is a thermal transport structure including at least two graphite sheets or at least two graphite composite sheets each including a graphite sheet and a covering layer, the covering layer covering at least part of (i) a surface and (ii) an edge of the graphite sheet, the at least two graphite sheets or the at least two graphite composite sheets being stacked on top of each other as layers, the thermal transport structure including: at least two fixing portions; and a thermally conductive portion between the fixing portions, in each of the fixing portions, the graphite sheets or the graphite composite sheets being kept in a state in which the graphite sheets or the graphite composite sheets are in contact with each other or bonded to each other, and in the thermally conductive portion, the graphite sheets or the graphite composite sheets being at least partially out of contact with each other or at least partially not bonded to each other.

(2) The thermal transport structure in accordance with an embodiment of the present invention is preferably arranged such that: the at least two graphite sheets are stacked on top of each other as layers; and in each of the fixing portions, a bonding layer is present between the graphite sheets and the graphite sheets are kept in a state in which the graphite sheets are bonded to each other via the bonding layer.

(3) The thermal transport structure in accordance with an embodiment of the present invention is preferably arranged such that: the bonding layer is further provided on at least part of (i) a surface of any one or more of the graphite sheets in the thermally conductive portion and (ii) an outer peripheral edge of any one or more of the graphite sheets of the thermal transport structure.

(4) The thermal transport structure in accordance with an embodiment of the present invention is preferably arranged such that: the bonding layer is further provided on at least part of (i) a surface of the thermally conductive portion of the thermal transport structure and (ii) an outer peripheral edge of the thermal transport structure.

(5) The thermal transport structure in accordance with an embodiment of the present invention is preferably arranged such that: the at least two graphite composite sheets are stacked on top of each other as layers; the graphite sheet included in each of the graphite composite sheets has both surfaces entirely covered by the covering layer; and in each of the fixing portions, the graphite composite sheets are kept in a state in which the graphite composite sheets are bonded to each other via the covering layer present at the surfaces of each of the graphite composite sheets.

(6) The thermal transport structure in accordance with an embodiment of the present invention is preferably arranged such that: the covering layer is further provided at at least part of an outer peripheral edge of each of the graphite composite sheets.

(7) The thermal transport structure in accordance with an embodiment of the present invention is preferably arranged such that: in the thermally conductive portion, a no n-bonding layer is provided between the graphite composite sheets.

(8) The thermal transport structure in accordance with an embodiment of the present invention is preferably arranged such that: the non-bonding layer includes two non-bonding layers provided between the graphite composite sheets.

(9) The thermal transport structure in accordance with an embodiment of the present invention is preferably arranged such that: the non-bonding layer is one non bonding layer between the graphite composite sheets; and the non-bonding layer has at least one surface provided with a release layer.

(10) The thermal transport structure in accordance with an embodiment of the present invention is preferably arranged such that: the bonding layer or the covering layer has a thickness of not less than 0.1 µm and not more than 20 µm.

(11) The thermal transport structure in accordance with an embodiment of the present invention is preferably arranged such that: the non-bonding layer has a thickness of not less than 0.001 µm and not more than 20 µm.

(12) The thermal transport structure in accordance with an embodiment of the present invention is preferably arranged such that: each of the at least two graphite sheets or the graphite sheet of each of the at least two graphite composite sheets has a thickness of not less than 1 µm and not more than 100 µm.

(13) The thermal transport structure in accordance with an embodiment of the present invention is preferably arranged such that: a protective layer provided at at least part of an outer surface of the thermal transport structure.

(14) The thermal transport structure in accordance with an embodiment of the present invention is preferably arranged such that: two or more of the fixing portions are provided on top of each other in a direction in which the graphite sheets are stacked on top of each other as layers.

(15) The thermal transport structure in accordance with an embodiment of the present invention is preferably arranged to further include: a flat plate provided on at least one side of any one or more of the fixing portions, the each fixing portion and the flat plate having through holes, respectively, and the each fixing portion and the flat plate being fixed by a bolt inserted through the through holes such that the graphite sheets or the graphite composite sheets are kept in a state in which the graphite sheets or the graphite composite sheets are in contact with each other.

(16) In order to solve the above problem, a method in accordance with an embodiment of the present invention is a method for producing a thermal transport structure including at least two graphite sheets or at least two graphite composite sheets each including a graphite sheet and a covering layer, the covering layer covering at least part of (i) a surface and (ii) an edge of the graphite sheet, the at least two graphite sheets or the at least two graphite composite sheets being stacked on top of each other as layers, the method including the step of: forming a fixing portion in which the graphite sheets or the graphite composite sheets are kept in a state in which the graphite sheets or the graphite composite sheets are in contact with each other or bonded to each other, the fixing portion being formed in a multilayer body in which the at least two graphite sheets or the at least two graphite composite sheets are stacked on top of each other as layers.

(17) In order to solve the above problem, a method in accordance with an embodiment of the present invention is a method for producing a thermal transport structure in which at least two graphite sheets are stacked on top of each other as layers, the method including the step of: forming, in the thermal transport structure, a fixing portion in which the graphite sheets are bonded to each other via a bonding layer by applying pressure or applying pressure and heat to a multilayer body in which any of the graphite sheets and the bonding layer have been alternately stacked on top of each other.

(18) In order to solve the above problem, a method in accordance with an embodiment of the present invention is a method for producing a thermal transport structure in which at least two graphite sheets are stacked on top of each other as layers, the method including the steps of: forming a bonding layer on at least part of the graphite sheets such that at least two fixing portions and a thermally conductive portion provided between the fixing portions are formed in the thermal transport structure, the at least part of the graphite sheets being located in the fixing portions; and bonding the graphite sheets to each other via the bonding layer by applying pressure or applying pressure and heat to the graphite sheets after the graphite sheets have been stacked on top of each other.

(19) In order to solve the above problem, a method in accordance with an embodiment of the present invention is a method for producing a thermal transport structure in which at least two graphite composite sheets are stacked on top of each other as layers, the graphite composite sheets each including a graphite sheet and a covering layer which covers all over both surfaces of the graphite sheet, the method including the steps of: preparing each of the graphite composite sheets by forming the covering layer all over the both surfaces of the graphite sheet; and bonding the graphite composite sheets via part of the covering layer, by applying pressure or applying pressure and heat to a multilayer body in which any of the graphite composite sheets and a non-bonding layer have been alternately stacked on top of each other.

(20) In order to solve the above problem, a method in accordance with an embodiment of the present invention is a method for producing a thermal transport structure in which at least two graphite composite sheets are stacked on top of each other as layers, the graphite composite sheets each including a graphite sheet and a covering layer which covers all over both surfaces of the graphite sheet, the method including the steps of: preparing each of the graphite composite sheets by forming the covering layer all over the both surfaces of the graphite sheet; and bonding the graphite composite sheets via part of the covering layer, by applying pressure or applying pressure and heat to a multilayer body in which any of the graphite composite sheets and a release layer or a non-bonding layer have been alternately stacked on top of each other, the non-bonding layer having at least one surface where a release layer is formed.

(21) The method in accordance with an embodiment of the present invention is preferably arranged to further include the step of: detaching the release layer or the non-bonding layer having the at least one surface where the release layer is formed.

(22) In order to solve the above problem, a method in accordance with an embodiment of the present invention is a method for producing a thermal transport structure in which at least two graphite composite sheets are stacked on top of each other as layers, the graphite composite sheets each including a graphite sheet and a covering layer which covers all over both surfaces of the graphite sheet, the method including the steps of: preparing each of the graphite composite sheets by forming the covering layer all over the both surfaces of the graphite sheet; and bonding the graphite composite sheets via part of the covering layer, by applying pressure or applying pressure and heat to part of each of the graphite composite sheets after the graphite composite sheets have been stacked on top of each other.

(23) The method in accordance with an embodiment of the present invention is preferably arranged such that: the non-bonding layer includes a plurality of non-bonding layers between the graphite composite sheets.

(24) The method in accordance with an embodiment of the present invention is preferably arranged such that: in the step of preparing each of the graphite composite sheets, the covering layer is formed so as to cover at least part of an outer peripheral edge of the graphite sheet, in addition to covering all over the both surfaces of the graphite sheet.

(25) The method in accordance with an embodiment of the present invention is preferably arranged such that: the bonding layer or the covering layer exhibits adhesiveness in response to application of heat and pressure; and in the step of bonding, the graphite sheets or the graphite composite sheets are bonded to each other at one time by application of heat and pressure.

(26) The method in accordance with an embodiment of the present invention is preferably arranged such that: the bonding layer or the covering layer has an adhesion force of not more than 1 N/25 mm at 25° C.

(27) In order to solve the above problem, a thermal transport structure in accordance of an embodiment of the present invention includes: at least two fixing portions; and a thermally conductive portion between the fixing portions, the thermal transport structure having a resilience against bending of not more than 40 N/cm in a case where a distance between the fixing portions is shortened and the thermally conductive portion is compressed by 10% in length, the fixing portions and the thermally conductive portion being provided with at least two thermally conductive sheets, and the thermally conductive sheets each being a graphite sheet or a graphite composite sheet obtained by covering, by a covering layer, at least part of (i) a surface and (ii) an edge of the graphite sheet.

(28) The thermal transport structure in accordance with an embodiment of the present invention is preferably arranged such that: the graphite sheet has a thermal conductivity in a plane direction of not less than 500 W/k·K.

(29) The thermal transport structure in accordance with an embodiment of the present invention is preferably arranged such that: in the graphite composite sheet, all faces of the graphite sheet are completely covered by the covering layer, the all faces including both surfaces and all edges of the graphite sheet.

(30) The thermal transport structure in accordance with an embodiment of the present invention is preferably arranged such that: the graphite sheet has a thickness of not less than 1 μm and not more than 100 μm.

(31) The thermal transport structure in accordance with an embodiment of the present invention is preferably arranged such that: in each of the fixing portions, the thermally conductive sheets are kept in a state in which the thermally conductive sheets are bonded to each other via a bonding layer which contains at least one of a thermosetting resin, a thermoplastic resin, and a sticky resin.

(32) The thermal transport structure in accordance with an embodiment of the present invention is preferably arranged such that: the covering layer contains at least one of a thermosetting resin, a thermoplastic resin, and a sticky resin; and in each of the fixing portions, the covering layer is subjected to thermal curing or thermal welding, or made adhesive, so that the thermally conductive sheets are kept in a state in which the thermally conductive sheets are bonded to each other.

(33) The thermal transport structure in accordance with an embodiment of the present invention is preferably arranged such that: in each of the fixing portions, the bonding layer is subjected to thermal curing or thermal welding, or made adhesive, so that the thermally conductive sheets are kept in a state in which the thermally conductive sheets are bonded to each other.

(34) The thermal transport structure in accordance with an embodiment of the present invention is preferably arranged to further include: a flat plate provided on at least one side of any one or more of the fixing portions, the each fixing portion and the flat plate having through holes, respectively, and the each fixing portion and the flat plate being fixed by a bolt inserted through the through holes such that the thermally conductive sheets are kept in a state in which the thermally conductive sheets are in contact with each other.

(35) The thermal transport structure in accordance with an embodiment of the present invention is preferably arranged such that: in each of the fixing portions, the thermally conductive sheets are kept in a state in which the thermally conductive sheets are in contact with each other or bonded to each other; and the thermally conductive portion, the thermally conductive sheets are at least partially out of contact with each other or at least partially not bonded to each other.

Advantageous Effects of Invention

An embodiment of the present invention (first invention) makes it possible to provide a thermal transport structure having good bendability, a good heat dissipation property, and a good lightweight property.

An embodiment of the present invention (second invention) makes it possible to provide a thermal transport structure having a high reliability against vibrations and an excellent heat transport performance.

DESCRIPTION OF EMBODIMENTS

Figure 1:
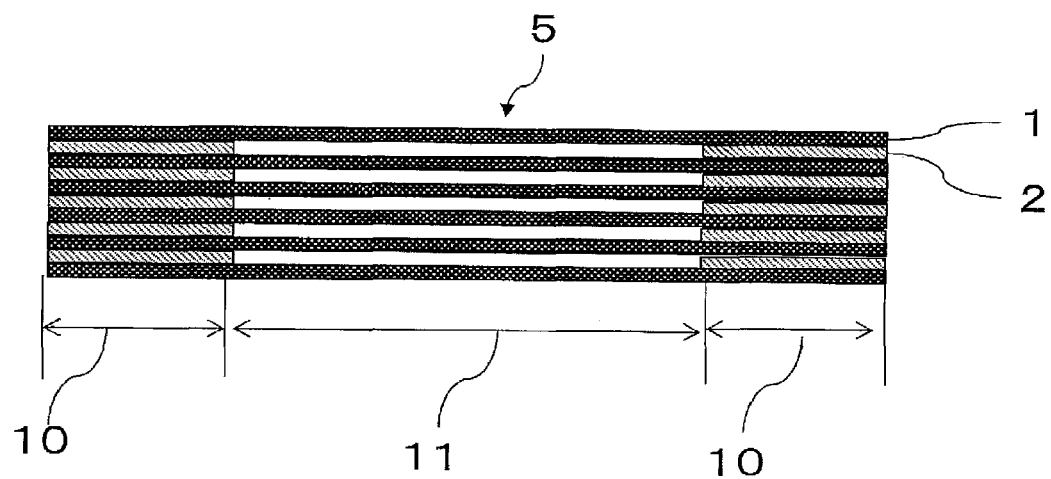
FIG. 1 is a cross sectional view of a thermal transport structure in accordance with an embodiment of the present invention.

The description below will deal with embodiments of the present invention. Note, however, that the present invention is not limited to the embodiment. The present invention is not limited to the description of the arrangements below but can be altered in various ways within the scope of the claims. Any embodiment or example based on a proper combination of technical means disclosed in different embodiments and examples is also encompassed in the technical scope of the present invention. All academic and patent literatures listed herein are incorporated herein by reference. Unless otherwise specified herein, any numerical range expressed as "A to B" is intended to mean "not less than A (A or more) and not more than B (B or less)".

The first invention mentioned above will be described in [Embodiment A] and <Examples A> below, and the second invention mentioned above will be described in [Embodiment B] and <Examples B>.

Embodiment A

Embodiment A of the present invention is a thermal transport structure including at least two graphite sheets or at least two graphite composite sheets each including a graphite sheet and a covering layer, the covering layer covering at least part of (i) a surface and (ii) an edge (e.g., all faces including both surfaces and all edges) of the graphite sheet, the at least two graphite sheets or the at least two graphite composite sheets being stacked on top of each other as layers. The thermal transport structure includes: at least two fixing portions; and a thermally conductive portion between the fixing portions. In each of the fixing portions, the graphite sheets or the graphite composite sheets are kept in a state in which the graphite sheets or the graphite composite sheets are in contact with each other or bonded to each other (in other words, in each of the fixing portions, the graphite sheets or the graphite composite sheets are fixed in a state in which the graphite sheets or the graphite composite sheets are in contact with each other or bonded to each other). In the thermally conductive portion, the graphite sheets or the graphite composite sheets are at least partially out of contact with each other or at least partially not bonded to each other (in other words, in the thermally conductive portion, the graphite sheets or the graphite composite sheets are at least partially not fixed in a state in which the graphite sheets or the graphite composite sheets are in contact with each other or bonded to each other).

It should be noted that the expression "a state in which . . . are in contact with . . . " herein means a state in which components are always in contact with each other. On the other hand, the expression "a state in which . . . are out of contact with . . . " herein means not only a state in which components are simply not in contact with each other but also a state in which even if components are currently in contact with each other, the components may be out of contact with each other in a case where force is applied to the components (e.g., when the components are bent).

Each arrangement of Embodiment A of the present invention can be used compatibly with each arrangement of a subsequently-described Embodiment. For example, the fixing portions and the thermally conductive portion of Embodiment A can be used in Embodiment B. Conversely, fixing portions and thermally conductive portion of Embodiment B can be also used in Embodiment A.

Embodiment 1 of the present invention is a thermal transport structure (herein, the "thermal transport structure" is also referred to as a "graphite composite material") in which at least two graphite sheets are stacked on top of each other as layers. The thermal transport structure includes at least two fixing portions (herein, the "fixing portion" is also referred to as a "bonding portion") and a thermally conductive portion (herein, the "thermally conductive portion" is also referred to as a "non-bonding portion"). In each of the fixing portions, a bonding layer is present between graphite sheets and the thermally conductive portion is provided between these two fixing portions.

Further, Embodiment 2 of the present invention is a thermal transport structure including at least two graphite composite sheets stacked on top of each other as layers. In each of the graphite composite sheets, a covering layer is provided on all faces including both surfaces and all edges of a graphite sheet. The thermal transport structure includes at least two fixing portions and a thermally conductive portion. In each of the fixing portions, the covering layer is present between graphite sheets.

In a case where graphite sheets are bonded to each other via a bonding layer or the like when the graphite sheets are stacked on top of each other so as to be a stack of layers, heat conductivity between the graphite sheets improves as compared to a case where graphite sheets are not bonded to each other. Then, a resultant thermal transport structure exhibits a better heat dissipation property. On the other hand, in a case where graphite sheets are not bonded to each other, a resultant thermal transport structure can be freely bent. Accordingly, a thermal transport structure is preferably arranged such that: (i) graphite sheets are bonded to each other, for example, at a position (hereinafter, also referred to as a heat-receiving position) of the thermal transport structure through which position heat from a heat source is transferred and at a position (hereinafter, also referred to as a heat dissipating position) of the thermal transport structure for transferring, to another member, the heat having been transferred to the thermal transport structure; and (ii) the graphite sheets are not bonded to each other in an area where thermal transport structure needs to be bent.

The following will discuss each embodiment.

Embodiment 1

FIG. 1 is a cross sectional view schematically illustrating an example of a thermal transport structure in accordance with Embodiment 1 of the present invention. Embodiment 1 is a thermal transport structure 5 in which at least two graphite sheets 1 are stacked on top of each other as layers. The thermal transport structure 5 includes at least two fixing portions 10 and a thermally conductive portion 11. The fixing portions 10 are preferably provided at least at a heat-receiving position and a heat dissipating position, respectively. The thermally conductive portion 11 is provided between fixing portions 10. Further, in each of the fixing portions 10, a bonding layer 2 is provided between graphite sheets 1.

(Fixing Portion)

The fixing portions in accordance with an embodiment of the present invention are each a portion where the graphite sheets of all layers are bonded to each other via a bonding layer when the graphite sheets are viewed in a direction in which the graphite sheets are stacked. The fixing portions each function to transfer heat mainly between graphite sheets. In each of the fixing portions provided at the heat-receiving position and the heat dissipating position, respectively, the graphite sheets are preferably bonded to each other via a bonding layer.

In a case where graphite sheets are simply stacked on top of each other via no bonding layer, air is trapped by fine projections and depressions at surfaces of the graphite sheets. Then, such a part where air is trapped produces a large contact thermal resistance. However, bonding of graphite sheets via a bonding layer reduces such air trap at a fixing portion. This allows the thermal transport structure to transfer heat well. Meanwhile, in a case where the graphite sheets are bonded to each other via a bonding layer, it is preferable to have an arrangement which does not cause trapping of air between the bonding layer and each of the graphite sheets, formation of wrinkles of the graphite sheets or the bonding layer, and the like so that thermal resistance between the graphite sheets can be further reduced.

The at least two fixing portions can be provided so as to overlap with each other in a direction in which the graphite sheets are stacked on top of each other as layers. In other words, the thermal transport structure in accordance with an embodiment of the present invention can be formed by stacking at least two thermal transport structures on top of each other. More specifically, the thermal transport structure in accordance with an embodiment of the present invention can be formed by keeping respective fixing portions of at least two component thermal transport structures in a state in which these fixing portions are in contact with each other or bonded to each other.

For example, one thermal transport structure can be formed by integrating at least two component thermal transport structures (in other words, by keeping the at least two component thermal transport structures in contact with each other or bonded to each other). Each of the at least two component thermal transport structures here has a substantially identical shape (e.g., quadrangular prism) and includes fixing portions at substantially identical positions (e.g., both ends of the quadrangular prism), and the at least two component thermal transport structures are integrated with each other in a state in which respective fixing portions of the at least two component thermal transport structures are overlapped with each other in a direction in which the graphite sheets are stacked on top of each other as layers.

More specifically, the following describes a quadrangular prism-shaped first thermal transport structure having a fixing portion A and a fixing portion B at both ends, respectively, and a quadrangular prism-shaped second thermal transport structure having a fixing portion C and a fixing portion D at both ends, respectively. It is possible to produce one thermal transport structure by integrating the first thermal transport structure and the second thermal transport structure that are provided in a state in which the fixing portion A and the fixing portion C are overlapped with each other and the fixing portion B and the fixing portion D are overlapped with each other in a direction in which graphite sheets are stacked on top of each other as layers (for example, one thermal transport structure can be produced by uniting the fixing portion A and the fixing portion C to each other and uniting the fixing portion B and the fixing portion D to each other). In this case, in the thermal transport structure thus newly formed, new fixing portions are formed by a combined portion of the fixing portion A and the fixing portion C and a combined portion of the fixing portion B and the fixing portion D, respectively. In another aspect, one thermal transport structure can be made of a plurality of thermal transport structures by: (i) uniting the fixing portion A and the fixing portion C that are provided so as to overlap with each other but not uniting the fixing portion B and the fixing portion D that are provided so as to overlap with each other; or (ii) not uniting the fixing portion A and the fixing portion C that are provided so as to overlap with each other, but uniting the fixing portion B and the fixing portion D that are provided so as to overlap with each other.

Alternatively, one thermal transport structure can be produced by integrating the first thermal transport structure and the second thermal transport structure that are provided in a state in which the fixing portion A and the fixing portion C are overlapped with each other but the fixing portion B and the fixing portion D are not overlapped with each other (e.g., by uniting the fixing portion A and the fixing portion C). In this case, in the thermal transport structure thus newly formed, a combined portion of the fixing portion A and the fixing portion C, the fixing portion B, and the fixing portion D form new fixing portions, respectively.

Figure 27:
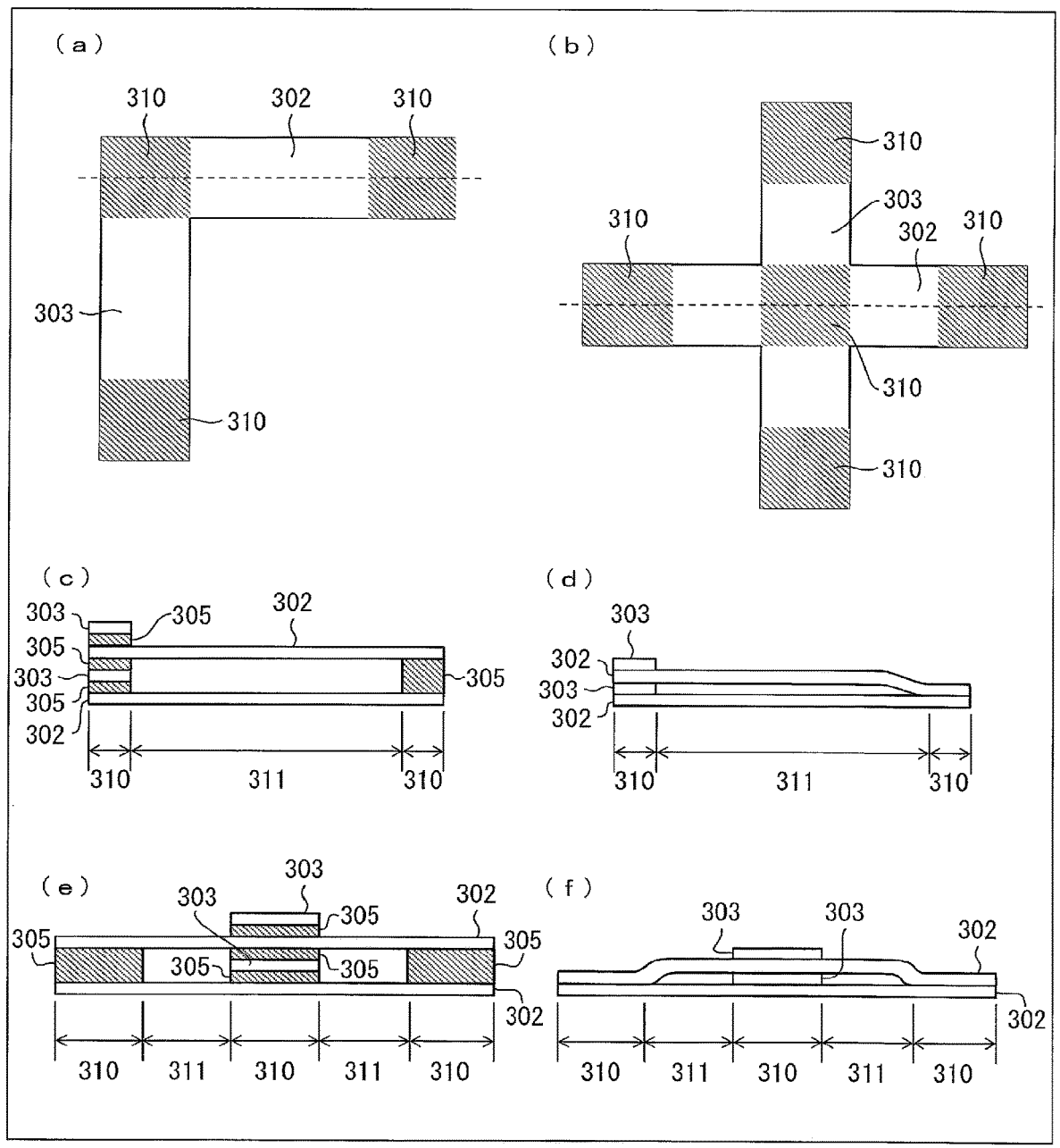
FIG. 27 is a view illustrating an embodiment of an arrangement of various sheets in accordance with the present invention.

As another alternative, a new thermal transport structure can be formed by replacing a thermally conductive sheet 302 and a thermally conductive sheet 303 illustrated in any one of (a) to (f) of FIG. 27 with thermal transport structures, respectively, and integrating the thermal transport structures with each other. It should be noted that (a) to (f) of FIG. 27 will be discussed later, and therefore a description thereof will be omitted here.

(Bonding layer)

As described earlier, the bonding layer is provided in a fixing portion. It is preferable that the bonding layer be further provided on at least part of (i) a surface(s) of any one or more of the graphite sheets in a portion other than the fixing portion, that is, a surface(s) of any one or more of the graphite sheets in a thermally conductive portion, and (ii) an outer peripheral edge(s) of any one or more of the graphite sheets of the thermal transport structure. Since a graphite sheet is a layered compound constituted by a stack of many graphite layers, powder falling readily occurs. Powder falling is a phenomenon in which a part of the layered compound (powder of a graphite sheet) flakes off. If powder falling occurs in an electronic device, a short circuit may be caused because the powder is electrically conductive. In order to prevent or reduce this powder falling, it is preferable to employ a structure in which at least part of a surface(s) of any one or more of the graphite sheets in a thermally conductive portion and/or an outer peripheral edge(s) of any one or more of the graphite sheets of the thermal transport structure is covered by a bonding layer made from an insulating material.

It is more preferable that, after the thermal transport structure is formed, the bonding layer be further provided on at least part of (i) a surface(s) other than the surfaces of the fixing portion of the thermal transport structure, that is, a surface(s) of the thermally conductive portion of the thermal transport structure and (ii) an outer peripheral edge(s) of the thermal transport structure. When at least part of (i) a surface(s) of the thermally conductive portion of the thermal transport structure and (ii) an outer peripheral edge(s) of the thermal transport structure is covered by the bonding layer, the powder falling of the graphite sheets can be reduced to a greater extent.

Figure 13:
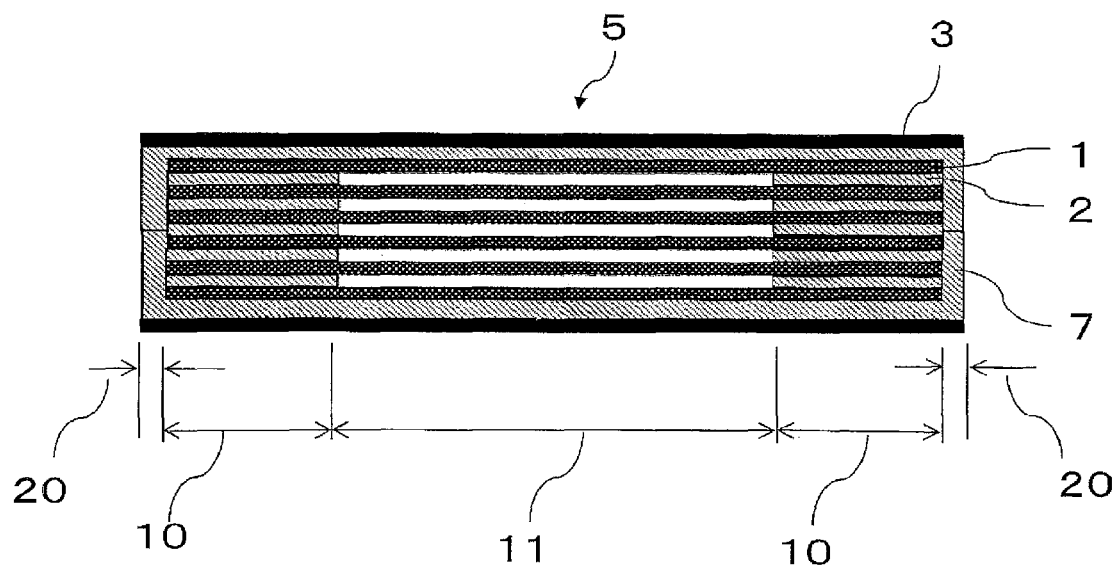
FIG. 13 is a cross sectional view of a thermal transport structure in accordance with an example of the present invention.

Furthermore, since a graphite sheet is a layered compound, delamination readily occurs. Therefore, it is more preferable that not only the surfaces of the fixing portions of the thermal transport structure 5 but also the surface(s) of the thermally conductive portion 11 and the outer peripheral edge(s) of the thermal transport structure 5 be covered by the bonding layer 7 as illustrated in FIG. 13.

It should be noted that the expression "the outer peripheral edge(s) of the thermal transport structure 5 is/are covered by the bonding layer 7" means that the thermal transport structure 5 is covered by the bonding layer 7 in a manner such that the covering part of the outer peripheral edge(s) has a thickness 20. In view of reducing powder falling of the thermal transport structure 5 to a greater extent, it is preferable that at least part of (i) the surface(s) of the thermally conductive portion of the thermal transport structure and (ii) the outer peripheral edge(s) of the thermal transport structure be covered by the bonding layer. It is particularly preferable that the surfaces of the thermally conductive portion of the thermal transport structure and the outer peripheral edges of the thermal transport structure be entirely covered by the bonding layer.

(Thickness of Bonding Layer)

A thickness of the bonding layer is preferably not less than 0.1 µm and not more than 20 µm, more preferably not less than 1 µm and not more than 20 µm, still more preferably not less than 3 µm and not more than 12 µm. When the thickness of the bonding layer is not less than 0.1 µm (more preferably not less than 1 µm), the bonding layer absorbs unevenness in the surface of a graphite sheet and this reduces the contact thermal resistance between graphite sheets. Therefore, the thermal transport structure is able to transfer heat efficiently. Furthermore, a bonding layer having a thickness of not less than 0.1 µm (more preferably not less than 1 µm) is good because such a bonding layer has good adhesiveness.

In the meantime, the thermal conductivity of a bonding layer is much less than the thermal conductivity of a graphite sheet. Therefore, when the thickness of the bonding layer is controlled to be not more than 20 µm, heat conduction between graphite sheets is not inhibited and heat is transferred well.

In a case where the bonding layer is further provided in the thermally conductive portion, the thickness of the bonding layer is preferably not less than 0.1 µm and not more than 20 µm (more preferably not less than 1 µm and not more than 20 µm) in view of keeping good bendability of the thermal transport structure.

(Type of Bonding Layer)

The bonding layer is not limited to a particular kind, provided that the bonding layer is a resin having an adhesion force. It is preferable that the bonding layer have an adhesion force of not more than 1 N/25 mm at 25° C. before the bonding and become adhesive when heated.

When many graphite sheets are stacked one over another, there would be a high risk of trapping of air between the sheets and the occurrence of wrinkles. Therefore, by making the bonding layer substantially non-adhesive at room temperature, specifically, by controlling the adhesion force of the bonding layer at 25° C. at not more than 1 N/25 mm, it is possible to stack many graphite sheets and bonding layers together without wrinkles. After the graphite sheets and bonding layers are stacked together, pressure is applied to the bonding layers, whereby the bonding layers can be made adhesive. However, in view of reduction of trapping of air by impregnation of the resin of the bonding layers into unevenness in the graphite sheets, it is preferable to also apply heat to the bonding layers when applying pressure to the bonding layers. It should be noted that a method of measuring the adhesion force of a bonding layer before the bonding step will be described in Examples below and therefore is not described here.

Examples of the resin constituting the bonding layer include thermosetting resins and thermoplastic resins.

Examples of thermosetting resins include polyurethane (PU), phenolic resins, urea resins, melamine-based resins, guanamine resins, vinylester resins, unsaturated polyester, oligoester acrylate, diallyl phthalate, DKF resin (a kind of resorcinol-based resin), xylene resin, epoxy resin, furan resin, polyimide-based (PI) resins, polyetherimide (PEI) resins, polyamide imide (PAI) resins, and polyphenylene ether (PPE). Preferred of these resins are resins containing an epoxy resin and/or a urethane resin, because such resins have a variety of options and great adhesiveness with graphite sheets.

Examples of thermoplastic resins include ionomers, isobutylene-maleic anhydride copolymer, acrylonitrile-acrylic rubber-styrene copolymer (AAS), acrylonitrile-ethylene-styrene copolymer (AES), acrylonitrile-styrene copolymer (AS), acrylonitrile-butadiene-styrene copolymer (ABS), acrylonitrile-chlorinated polyethylene-styrene copolymer (ACS), methyl methacrylate-butadiene-styrene copolymer (MBS), ethylene-vinyl chloride copolymer, ethylene-vinyl acetate copolymer (EVA), ethylene-vinyl acetate copolymer based resins (EVA based resins), ethylene vinyl alcohol copolymer (EVOH), polyvinyl acetate, chlorinated polyvinyl chloride, chlorinated polyethylene, chlorinated polypropylene, carboxyvinyl polymer, ketone resins, norbornene resins, vinyl propionate, polyethylene (PE), polypropylene (PP), polymethylpentene (TPX), polybutadiene, polystyrene (PS), styrene-maleic anhydride copolymer, methacrylic resins, ethylene-methacrylic acid copolymer (EMAA), polymethylmethacrylate (PMMA), polyvinyl chloride (PVC), polyvinylidene chloride, polyvinyl alcohol (PVA), polyvinyl ether, polyvinyl butyral, polyvinyl formal, cellulose based resins, Nylon 6, Nylon 6 copolymer, Nylon 66, Nylon 610, Nylon 612, Nylon 11, Nylon 12, copolymer nylon, Nylon MXD, Nylon 46, methoxymethylated nylon, aramid, polyethylene terephthalate (PET), polybutyrene terephthalate (PBT), polycarbonate (PC), polyacetal (POM), polyethylene oxide, polyphenylene ether (PPE), modified polyphenylene ether (PPE), polyether ether ketone (PEEK), polyether sulphone (PES), polysulphone (PSO), polyamine sulphone, polyphenylene sulfide (PPS), polyalylate (PAR), polyparavinyl phenol, polyparamethylene styrene, polyallylamine, aromatic polyester, liquid crystal polymer, polytetrafluoroethylene (PTFE), tetrafluoroethylene-ethylene copolymer (ETFE), tetrafluoroethylene-hexafluoropropylene copolymer (FEP), tetrafluoroethylene-hexafluoropropylene-perfluoroalkyl vinyl ether copolymer (EPE), tetrafluoroethylene-perfluoroalkyl vinyl ether copolymer (PFA), polychloro-trifluoroethylene copolymer (PCTFE), ethylene-chlorotrifluoroethylene copolymer (ECTFE), polyvinylidene fluoride based resins (PVDF), and polyvinyl fluoride (PVF).

Any of these thermosetting resins and thermoplastic resins, which can be used to form a bonding layer, may be dissolved in water or an organic solvent to give a material for a bonding layer, and the material for a bonding layer may be subjected to a coating to form a bonding layer. Alternatively, any of these thermosetting resins and thermoplastic resins, which can be used to form a bonding layer, may be formed into a film shape in advance and then such films may be, for example, laminated to thereby form a bonding layer.

(Thermally Conductive Portion)

A thermally conductive portion of an embodiment of the present invention is provided between fixing portions. Specifically, as shown in Embodiment 1 of the present invention in FIG. 1, the thermally conductive portion 11 lies between the fixing portions 10. Since the thermally conductive portion 11 is provided in this manner, it is possible to readily bend the thermal transport structure 5 even in a case where many graphite sheets 1 are stacked together. Therefore, the thermally conductive portion 11 is preferably provided in an area that is to be bent. It should be noted that the thermal transport structure 5 may have two or more thermally conductive portions 11. Therefore, it is also possible to employ a structure in which a fixing portion 10 lies between thermally conductive portions 11.

The thermally conductive portion 11 of an embodiment of the present invention means a portion in which, when graphite sheets are viewed in a direction in which the graphite sheets are stacked on top of each other, the graphite sheets are at least partially not bonded to each other via a bonding layer. That is, in the thermally conductive portion 11, it is not necessary for all the graphite sheets to be in an unbonded state. For example, the graphite sheets may be in the unbonded state every two or more layers. In a case where the graphite sheets are in the unbonded state every two or more layers, the thickness of the bonded layers, that is, the entire thickness of graphite sheets, a bonding layer(s), and a protective layer(s) bonded together, is preferably not more than 100 μm for the bendability of the thermal transport structure 5 to be maintained.

(Type of Graphite Sheet)

A graphite sheet for use in an embodiment of the present invention is not limited to a particular kind, and may be a polymer-based graphite sheet or may be a graphite sheet obtained by expanding natural graphite, which is a raw material. The polymer-based graphite sheet has great heat conductivity. Therefore, using a polymer-based graphite sheet provides a thermal transport structure having a greater heat dissipation property.

A first process for producing a graphite sheet for use in an embodiment of the present invention is to obtain a graphite sheet by expanding natural graphite, which is a raw material. Specifically, graphite powder is soaked in an acid such as sulfuric acid to obtain an intercalated graphite, and thereafter the graphite powder is treated with heat to expand to thereby detach the graphite layers. After the graphite layers are detached from each other, the graphite powder is washed and thereby the acid is removed, so that graphite powder in the form of a thin film is obtained. The graphite powder thus obtained is further pressed and rolled to be molded. In this way, a graphite sheet is obtained.

A second process for producing a graphite sheet suitable for an object of an embodiment of the present invention is to prepare a polymer-based graphite sheet by treating a polymer film made of, for example, a polyimide resin with heat. Specifically, a graphite sheet is obtained from a polymer film in the following manner. First, a polymer film, which is a starting material, is preheated to approximately 1000° C. under reduced pressure or in an inert gas to be carbonated, so that a carbonated film is obtained. After that, the carbonated film is heated to a temperature of 2800° C. or higher in an inert gas atmosphere and thereby graphitized. In this way, a good graphite crystal structure is formed. A graphite sheet having great heat conductivity is thus obtained.

(Thickness of Graphite Sheet)

A thickness of a graphite sheet of an embodiment of the present invention is not less than 1 μm and not more than 100 μm, preferably not less than 10 μm and not more than 100 μm, and more preferably not less than 20 μm and not more than 80 μm. A graphite sheet having a thickness of not less than 1 μm (preferably not less than 10 μm) is good because, for a fixed thickness of the thermal transport structure, the number of stacked graphite sheets decreases as compared to when graphite sheets having a thickness less than 1 μm are used, and therefore bonding layers, which have poor thermal conductivity, can be reduced. Furthermore, when the graphite sheets have a thickness of not more than 100 μm, the bendability of the thermal transport structure is maintained and the thermal transport structure becomes greatly bendable.

(Measurement of Thickness of Graphite Sheet)

The thickness of a graphite sheet can be measured in the following manner: thicknesses at any ten locations of a film measuring 50 mm×50 mm are measured in a thermostatic chamber at 25° C. with the use of a thickness gage (HEIDENHAIN-CERTO, manufactured by HEIDENHAIN) and the mean of the thicknesses is used as the thickness of the graphite sheet.

(Thermal Conductivity in Plane Direction of Graphite Sheet)

The thermal conductivity in a plane direction of a graphite sheet is preferably not less than 1000 W/k·K, more preferably not less than 1100 W/k·K, and still more preferably 1200 W/k·K. The use of a graphite sheet having a thermal conductivity in a plane direction of not less than 1000 W/k·K makes it possible to obtain a thermal transport structure having a better heat dissipation property. Furthermore, in a case where the number of graphite sheets to be stacked is determined to achieve a heat dissipation performance equivalent to that of copper or aluminum, the weight of the resulting thermal transport structure significantly decreases since graphite has a heat conductivity that is three or more times as high as the heat conductivity of a metal material such as copper or aluminum. Therefore, the use of such a graphite sheet also contributes to weight reduction of electronic devices.

(Calculation of Thermal Conductivity in Plane Direction of Graphite Sheet)

The thermal conductivity of a graphite sheet can be calculated using the following Equation (1):

$$A = \alpha \times d \times Cp \quad (1)$$

where A represents a thermal conductivity, α represents a thermal diffusivity, d represents a density, and Cp represents a specific heat capacity. It should be noted that the thermal diffusivity, density, and specific heat capacity of the graphite sheet can be found by the following methods.

(Measurement of Thermal Diffusivity in Plane Direction of Graphite Sheet Using Light Alternating-Current Method)

The thermal diffusivity of a graphite sheet can be measured in the following manner. The thermal diffusivity of a sample measuring 4 mm×40 mm cut from a graphite sheet is measured with the use of a measuring instrument using a light alternating-current method (Laser Pit available from ULVAC, Inc.) in an atmosphere of 20° C. with alternating current at 10 Hz.

(Measurement of Specific Heat Capacity of Graphite Sheet)

The specific heat capacity of a graphite sheet can be measured with the use of a differential scanning calorimeter DSC220CU, which is a thermal analysis system manufactured by SII NanoTechnology Inc., in the condition in which temperature is raised from 20° C. to 260° C. at 10° C./min.

(Measurement of Density of Graphite Sheet)

The density of a graphite sheet can be found in the following manner. A sample measuring 100 mm×100 mm cut from the graphite sheet is measured for weight and thickness and the value of the weight is divided by the value of the volume.

(Protective Layer)

Figure 6:
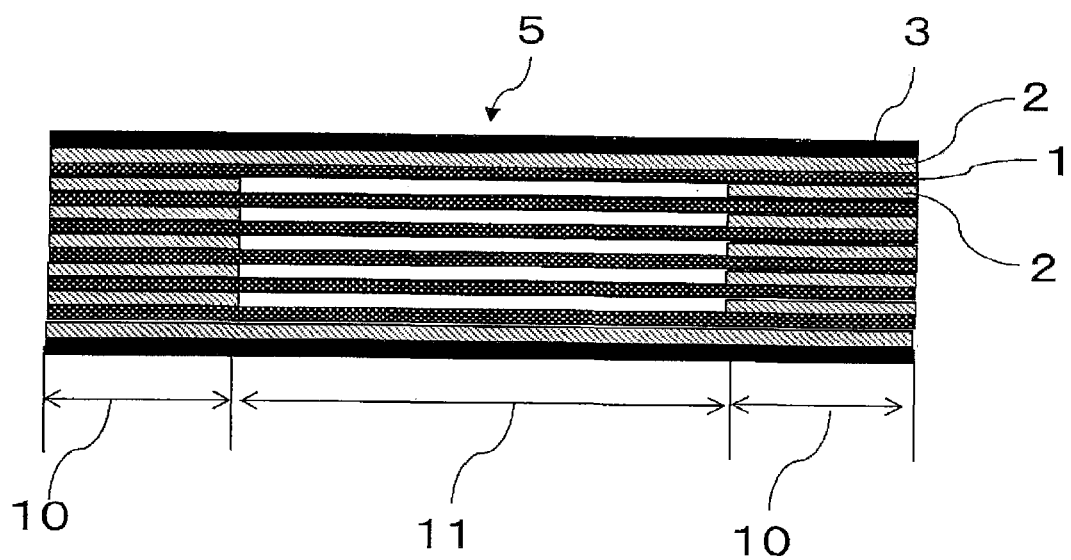
FIG. 6 is a cross sectional view of a thermal transport structure in accordance with an example of the present invention.

It is preferable that, as illustrated in FIG. 6, a protective layer 3 be provided at at least part of an outer surface(s) of the thermal transport structure 5 with a bonding layer 2 therebetween. Providing the protective layer 3 is good because the surface(s) of a graphite sheet 1 of such a thermal transport structure 5 becomes more protected and becomes resistant to mechanical scratching, friction, and the like. It should be noted that, if the protective layer 3 is adhesive, the protective layer 3 may be disposed on the thermal transport structure 5 without the bonding layer 2.

Type of Protective Layer

There is no particular limitation on the protective layer, and any of a variety of films may be used. Examples of such films include polyethylene terephthalate (PET) films, polypropylene films, polyethylene films, polystyrene films, and polyimide films.

(Thickness of Protective Layer)

A thickness of the protective layer is preferably not less than 1 μm and not more than 20 μm, more preferably not less than 1 μm and not more than 10 μm, and still more preferably not less than 2 μm and not more than 7 μm. A protective layer having a thickness of not less than 1 μm is good because the surface(s) of a graphite sheet of such a thermal transport structure becomes more protected and becomes resistant to mechanical scratching, friction, and the like. Furthermore, a protective layer having a thickness of not more than 20 μm is good because the bendability of the thermal transport structure is maintained.

(Number of Stacked Layers)

The number of stacked graphite sheets in an embodiment of the present invention is preferably not less than 2 and not more than 1000, and more preferably not less than 5 and not more than 100. When the number of stacked graphite sheets is not less than 2, it is possible to obtain a thermal transport structure that is excellent in bendability, heat dissipation property, and lightweight property. When the number of stacked graphite sheets is not more than 1000, it is possible to obtain a thermal transport structure that is excellent in heat dissipation property and lightweight property without losing bendability.

(Method for Producing Thermal Transport Structure)

A thermal transport structure of an embodiment of the present invention is produced by: alternately stacking graphite sheets and a bonding layer(s) that is/are to form at least a fixing portion; and bonding the graphite sheets to each other via the bonding layer(s) by (i) applying pressure to the stack or (i) applying pressure and heat to the stack.

Production Method of Embodiment 1

A method for producing a thermal transport structure of Embodiment 1 of the present invention includes a bonding step by which a fixing portion is formed in the thermal transport structure by alternately stacking graphite sheets and a bonding layer(s) that is/are to form at least the fixing portion and applying pressure to the stack or applying pressure and heat to the stack. In the fixing portion, the graphite sheets are kept in a state in which the graphite sheets are bonded to each other via the bonding layer(s).

Another production method of Embodiment 1 includes: a step of forming a bonding layer on at least part of the graphite sheets such that at least two fixing portions and a thermally conductive portion provided between the fixing portions are formed in the thermal transport structure, the at least part of the graphite sheets being located in the fixing portions; and a subsequent bonding step. The bonding step involves forming, in the thermal transport structure, the fixing portions in which the graphite sheets are kept in a state in which the graphite sheets are bonded to each other via the bonding layer(s), by stacking the graphite sheets and thereafter applying pressure to the graphite sheets or applying pressure and heat to the graphite sheets. In this production method, it is possible to form a bonding layer by, for example, coating a graphite sheet with a material for the bonding layer and drying the material for the boding layer.

According to any of the above-described methods, a bonding layer is present in a portion (which will become a fixing portion of the thermal transport structure) of a multilayer body composed of layers such as graphite sheets, and therefore, when pressure is applied to the multilayer body or pressure and heat are applied to the multilayer body, the portion in which the bonding layer is present becomes a fixing portion whereas a portion in which no bonding layer is present becomes a thermally conductive portion. In other words, in a portion that will become a fixing portion of the thermal transport structure, the bonding layer between graphite sheets extends over this portion. On the other hand, at least part of a portion that will become a thermally conductive portion of the thermal transport structure has no bonding layers between graphite sheets. Preferably, the entire portion has no bonding layers between graphite sheets. Therefore, according to any of the above production methods, it is possible to easily obtain a multilayer body of graphite sheets having bendability. In a case of any of the above production methods, the thermally conductive portion may further include a bonding layer. However, in view of obtaining a thermal transport structure excellent in bendability, it is preferable that the thermally conductive portion do not include the bonding layer.

(Method of Alternately Stacking Bonding Layer and Graphite Sheet)

Bonding layers and graphite sheets may be alternately stacked together by, for example: a method by which a bonding film is placed directly on a graphite sheet and such graphite sheets are stacked on top of each other; a method by which a surface of a graphite sheet is coated with a material for a bonding layer and such graphite sheets are stacked on top of each other; a method by which a graphite sheet and a bonding film are laminated and such graphite sheets are stacked on top of each other; or the like. Any of these methods may be selected as appropriate.

(Method of Bonding Bonding Layer and Graphite Sheet)

Bonding layers and graphite sheets are bonded together suitably by applying pressure with a press. The press is good because, even in a case where as many as ten or more graphite sheets are stacked one over another, such graphite sheets can be bonded together at one time. It should be noted that pressure may be applied to part of a multilayer body of bonding layers and graphite sheets or may be applied to the entire multilayer body.

In a case where pressure is intended to be applied to part of the multilayer body of bonding layers and graphite sheets, or in a case where pressure is intended to be applied to only a portion of the multilayer body of bonding layers and graphite sheets which portion will become a fixing portion, a mold having an uneven surface may be prepared in advance and pressure may be applied with the use of the mold. Furthermore, it is preferable that pressure be applied to the multilayer body being heated, pressure be applied to the multilayer body under vacuum, or pressure be applied to the multilayer body being heated under vacuum, because this makes it possible to prevent or reduce trapping of air and obtain a thermal transport structure in which heat is transferred well between graphite sheets.

(Formation of Pores in Graphite Sheet)

In a case where as many as ten or more graphite sheets stacked on top of each other or graphite sheets having an area as large as 100 square mm or larger stacked on top of each other are bonded together with heat and pressure, a slight amount of gas generated from the bonding layers or a slight amount of air trapped between layers may expand and this may cause partial inflation. This is because graphite sheets have a great gas barrier property. Therefore, in order to address such a situation, it is preferable to previously form pores in a graphite sheet to allow passage of gas. As for the percentage of the area of pores, it is preferable to previously form pores such that the pores occupies an area of 0.5% or more, and more preferably 1% or more of the area of a graphite sheet which has no pores. A shape of each pore is not particularly limited, and may be selected appropriately from, for example, a perfect circle, an ellipse, a triangle, a rectangle, and the like.

(Applications)

A thermal transport structure in accordance with an embodiment of the present invention can be suitably used as a heat dissipating material or a thermally conductive material. Specifically, the thermal transport structure can be used as a heat dissipating material or a thermally conductive material for any of electronic devices, aircraft equipment, space equipment, equipment to be used under a vacuum condition or a low-pressure condition, automobiles, and the like.

Embodiment 2

Figure 2:
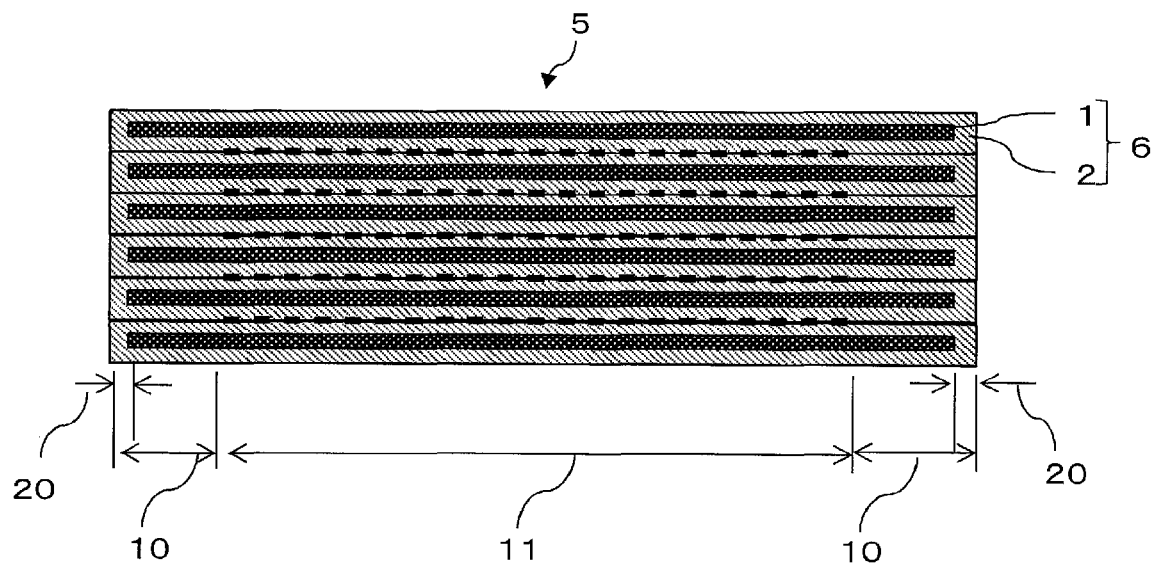
FIG. 2 is a cross sectional view of a thermal transport structure in accordance with an embodiment of the present invention.

FIG. 2 is a cross sectional view schematically illustrating an example of a thermal transport structure of Embodiment 2 of the present invention. Each dashed line represents an area in which graphite composite sheets 6 are not bonded to each other. Embodiment 2 is a thermal transport structure 5 which is constituted by a stack of graphite composite sheets 6, each of which is formed from a graphite sheet 1 and a bonding layer 2 (the bonding layer 2 in Embodiment 2 corresponds to a covering layer) that covers the entire surfaces of the graphite sheet 1, and which thermal transport structure 5 has fixing portions 10 and a thermally conductive portion 11. It should be noted that, in the present embodiment, the same features as in Embodiment 1 are not described and only the features different from those of Embodiment 1 are described in detail.

(Bonding Layer (In Other Words, Covering Layer))

The bonding layer (in other words, a covering layer) of Embodiment 2 may have the same arrangement as the bonding layer of Embodiment 1. The following describes the bonding flayer of Embodiment 2.

In Embodiment 2 of the present invention, the surfaces of a graphite sheet are entirely covered by a bonding layer. This makes it possible to particularly preferably prevent or reduce powder falling and delamination of graphite sheets. Furthermore, assume a case where a thermal transport structure of an embodiment of the present invention is used as a material for use in space. In this case, if, for example, air is trapped in the thermal transport structure, the air in the thermal transport structure expands when the thermal transport structure is exposed to vacuum environment. An embodiment of the present invention is good because it is possible to produce a thermal transport structure without allowing air to be trapped in the thermal transport structure. Furthermore, in order to prevent or reduce trapping of air in the thermal transport structure, it is preferable that a graphite composite sheet has a covering made of the bonding layer not only at the entire surfaces of the graphite composite sheet but also at at least part of an outer peripheral edge(s) of the graphite composite sheet.

It should be noted that the expression "having a covering made of a bonding layer at the entire surfaces of a graphite composite sheet" in Embodiment 2 of the present invention means that the both surfaces (a surface having the largest area and the opposite surface) of a graphite sheet 1 are entirely covered by a bonding layer 2. The phrase "having a covering made of a bonding layer at an outer peripheral edge(s) of a graphite composite sheet" means that a graphite composite sheet 6 is formed by covering a graphite sheet 1 by a bonding layer 2 in a manner such that the bonding layer 2 at the outer peripheral edge(s) has a thickness 20. In view of reducing to a greater extent the powder falling of the thermal transport structure 5, delamination of graphite sheets 1, and trapping of air in the thermal transport structure 5, it is preferable that a graphite composite sheet have a covering made of a bonding layer not only at the entire surfaces of the graphite composite sheet but also at at least part of the outer peripheral edge(s) of the graphite composite sheet, and it is particularly preferable that the covering made of a bonding layer be provided at entire outer peripheral edges. In this case, an area around a through hole (including a side face of the through hole), such as a screw hole for fixing the thermal transport structure to an electronic device or the like, may be left uncovered by the bonding layer.

(Thermally Conductive Portion)

Figure 3:
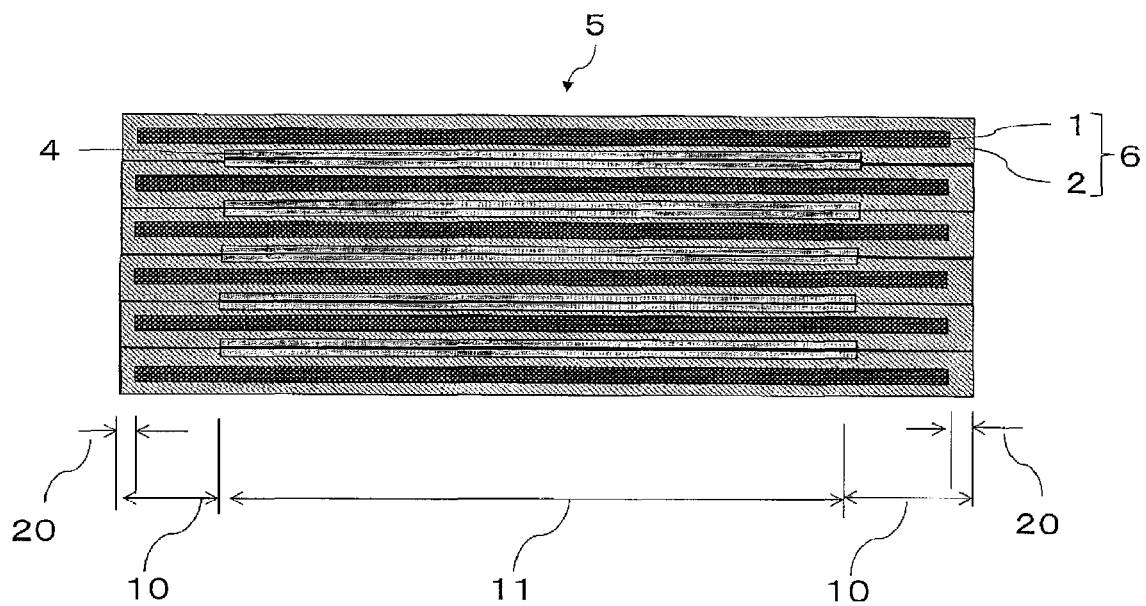
FIG. 3 is a cross sectional view of a thermal transport structure in accordance with an embodiment of the present invention.
Figure 4:
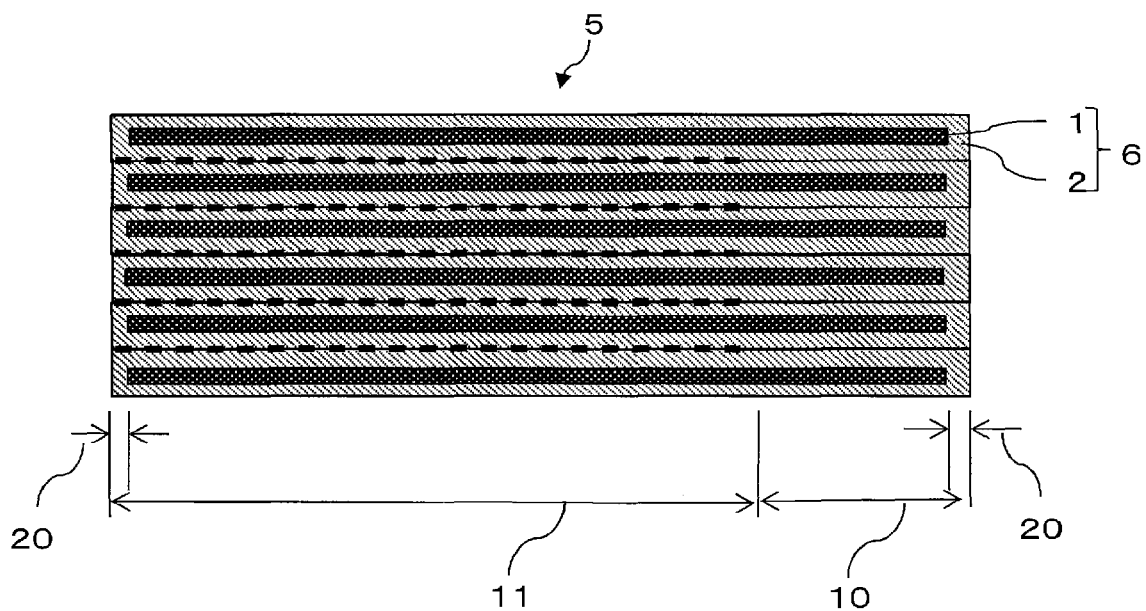
FIG. 4 is a cross sectional view of a thermal transport structure in accordance with an embodiment of the present invention.

In Embodiment 2 of the present invention, a thermally conductive portion 11 may be provided between fixing portions 10 as illustrated in FIG. 2 and in FIG. 3 (described later) or may be provided at an end portion of the thermal transport structure 5 as illustrated in FIG. 4 and in FIG. 5 (described later).

In Embodiment 2 of the present invention, the graphite composite sheets 6, each of which is constituted by a graphite sheet 1 and a bonding layer 2 that entirely covers the surfaces of the graphite sheet 1, are stacked on top of each other. Therefore, in order to form the thermally conductive portion 11 with greater accuracy, it is preferable to provide a non-bonding layer 4 (described later) between graphite composite sheets 6 in a portion that serves as a thermally conductive portion 11, as illustrated in FIGS. 3 and 5. Providing the non-bonding layer 4 is good because the surfaces of the graphite sheet also become more protected and become resistant to mechanical scratching, friction, and the like.

Figure 5:
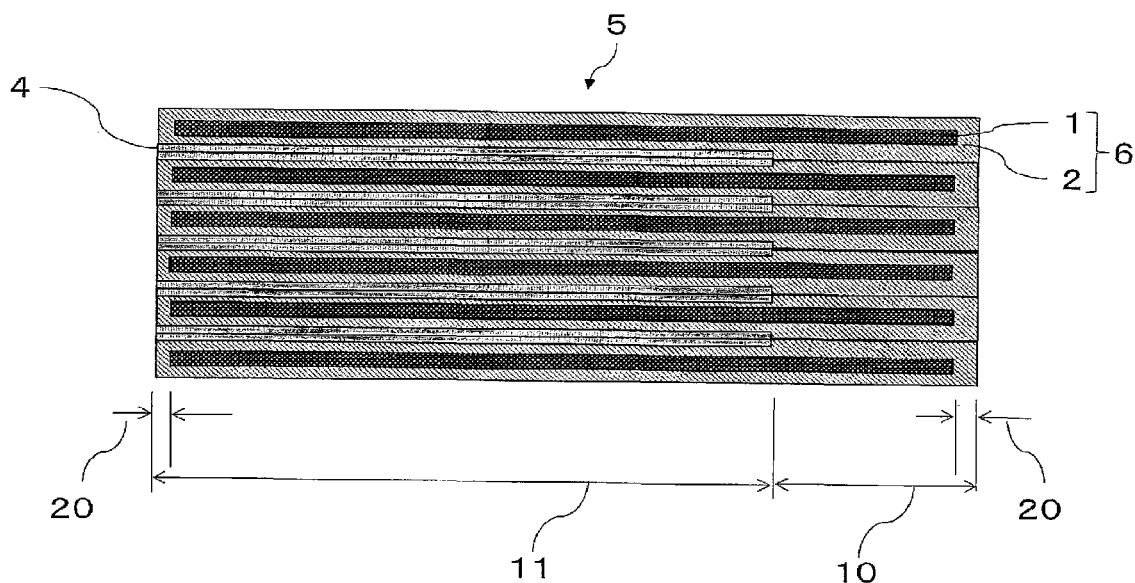
FIG. 5 is a cross sectional view of a thermal transport structure in accordance with an embodiment of the present invention.
Figure 14:
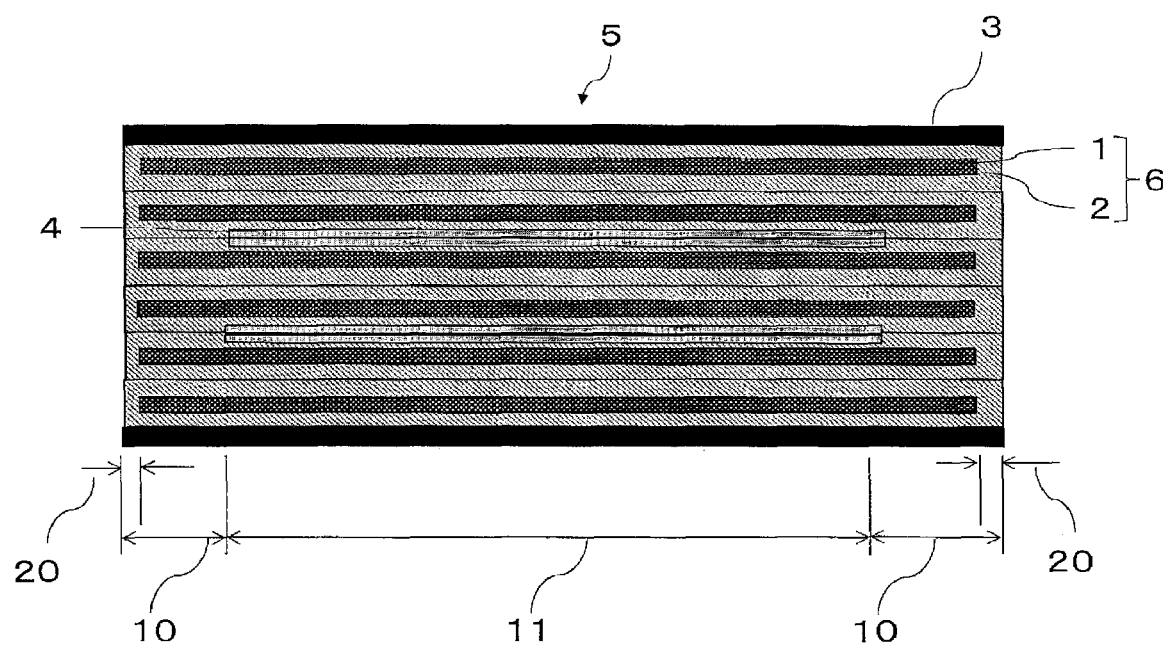
FIG. 14 is a cross sectional view of a thermal transport structure in accordance with an example of the present invention.

It should be noted that, in Embodiment 2 of the present invention, as with Embodiment 1, a thermally conductive portion indicates a portion in which adjacent graphite composite sheets 6 are not bonded together via a bonding layer (portions represented by dashed lines in FIGS. 2 and 4 and portions in which non-bonding layers 4 are in contact with each other in FIGS. 3 and 5). It is not necessary for every adjacent graphite composite sheets 6 of a stack of the graphite composite sheets 6 to be in an unbonded state. As illustrated in FIG. 14, the graphite composite sheets 6 may be in the unbonded state every two or more layers. In a case where the graphite composite sheets 6 are in the unbonded state every two or more layers, the thickness of the bonded sheets, that is, the entire thickness of graphite sheets 1, a bonding layer(s) 2, a non-bonding layer(s) 4, and a protective layer(s) bonded together, is preferably not more than 100 μm for the bendability of the thermal transport structure 5 to be maintained.

(Non-Bonding Layer)

Non-bonding layers are not limited to a particular kind, provided that the non-bonding layers do not adhere to each other.

It is particularly preferable that a non-bonding layer that constitutes a thermally conductive portion of Embodiment 2 of the present invention be a non-bonding layer that can be bonded to a bonding layer. Providing one or more non-bonding layers (for example, one non-bonding layer or two non-bonding layers), which can be bonded to a bonding layer, between adjacent graphite composite sheets is preferred because the adjacent graphite composite sheets are not bonded to each other.

It is also preferable that the non-bonding layer have at least one surface (that is, one surface or both surfaces of the non-bonding layer) provided with a release layer that does not adhere to a bonding layer. In this case, an arrangement may be employed in which one surface or both surfaces of the non-bonding layer, which can be bonded to a bonding layer, is/are provided with a release layer that does not adhere to a bonding layer (hereinafter simply referred to as a non-bonding layer having one surface or both surfaces provided with a release layer). Assume a case where one non-bonding layer is provided between graphite composite sheets. When a non-bonding layer having one surface provided with a release layer is used, the surface provided with no release layer adheres to a graphite composite sheet but the surface provided with a release layer does not adhere to a graphite composite sheet. Accordingly, in this case, a thermally conductive portion is formed. On the other hand, when a non-bonding layer having both surfaces provided with a release layer is used, the both surfaces do not adhere to a graphite composite sheet. Accordingly, in this case, a thermally conductive portion is formed, and the non-bonding layer can be removed from the thermal transport structure in the end and thus a thermal transport structure having good bendability is readily obtained. Therefore this arrangement is preferred.

Alternatively, instead of a non-bonding layer that can be bonded to a bonding layer or a non-bonding layer having one surface or both surfaces provided with a release layer, which are preferred embodiments of non-bonding layers, the release layer alone may be used as a non-bonding layer. This is also preferred because the both surfaces of the release layer do not adhere to a graphite composite sheet and therefore a thermally conductive portion is formed, and the release layer can be removed from the thermal transport structure in the end and a thermal transport structure having good bendability is readily obtained.

(Thickness of Non-Bonding Layer)

A thickness of a non-bonding layer is preferably not less than 0.001 µm and not more than 20 µm, more preferably not less than 1 µm and not more than 20 µm, still more preferably not less than 1 µm and not more than 10 µm, and further preferably not less than 2 µm and not more than 7 µm. A non-bonding layer having a thickness of not less than 0.001 µm (more preferably not less than 1 µm) is good because the non-bonding layer can be placed with no or few wrinkles. A non-bonding layer having a thickness of not more than 20 µm is good because the bendability of the thermal transport structure is maintained, and heat conduction between graphite sheets is not inhibited and heat is transferred well.

(Type of Non-Bonding Layer)

In a case where a non-bonding layer that can be bonded to a bonding layer is used as a preferred embodiment of a non-bonding layer, there is no particular limitation on types of non-bonding layer and various films may be used. Examples of such films include polyethylene terephthalate (PET) films, polypropylene films, polyethylene films, polystyrene films, polyimide films, and paper.

(Type of Release Layer)

In a case where a release layer is used, there is no particular limitation on types of release layer and various resins may be used. It is preferable that the release layer do not adhere to a bonding layer. Examples of a release layer that does not adhere to a bonding layer include silicone resins and fluororesins. In view of durability, cost, and the like, silicone resins are preferable.

(Thickness of Release Layer)

A thickness of a release layer is preferably not less than 1 µm and not more than 20 µm, more preferably not less than 1 µm and not more than 10 µm, and still more preferably not less than 2 µm and not more than 7 µm. A release layer having a thickness of not less than 1 µm is preferred because it is easy to form a thermally conductive portion having a good appearance. A release layer having a thickness of not more than 20 µm is preferred because it is possible to maintain the bendability of the thermal transport structure even in a case where the release layer is not removed from the thermal transport structure at the end.

Production Methods of Embodiment 2

A method for producing a thermal transport structure of Embodiment 2 of the present invention involves: a step of preparing a graphite composite sheet by forming a bonding layer on the entire surfaces of a graphite sheet; and a step of stacking such graphite composite sheets on top of each other and thereafter bonding the sheets together by applying pressure or applying pressure and heat.

First Production Method of Embodiment 2

A first method for producing a thermal transport structure of Embodiment 2 of the present invention includes: a graphite composite sheet preparation step of preparing a graphite composite sheet by forming a bonding layer on the entire surfaces of a graphite sheet; and a bonding step performed after the graphite composite sheet preparation step. In the bonding step, graphite composite sheets and non-bonding layers are alternately stacked on top of each other to form a multilayer body and thereafter pressure is applied to the multilayer body (for example, pressure is applied to the entire surfaces of the multilayer body) or pressure and heat are applied to the multilayer body (for example, pressure and heat are applied to the entire surfaces of the multilayer body), such that the graphite composite sheets are bonded together by a part of the bonding layers.

In this production method, a bonding layer is provided on the entire surfaces of a graphite sheet. Since the surfaces of the graphite sheet are entirely covered by the bonding layer, powder falling and delamination are prevented, which is preferred. It is more preferable that at least part of an outer peripheral edge(s), as well as the entire surfaces, of the graphite sheet be covered by the bonding layer in view of powder falling and delamination. It is particularly preferable that the outer peripheral edges be entirely covered by the bonding layer.

A method for forming a bonding layer may be selected as appropriate from, for example, a method including coating with an adhesive resin and a method including laminating adhesive films. The bonding layer is preferably formed by laminating adhesive films so that at least part of an outer peripheral edge(s) as well as the entire surfaces of a graphite sheet is provided with the bonding layer. That is, it is possible to form a graphite composite sheet in which the entire surfaces and the outer peripheral edge(s) of a graphite sheet are covered, by previously cutting a graphite sheet into a certain shape and thereafter laminating the graphite sheet with adhesive films larger than the graphite sheet.

Furthermore, when a non-bonding layer that can be bonded to a bonding layer or a non-bonding layer having one surface provided with a release layer, each of which is a preferred embodiment of a non-bonding layer, is used as a non-bonding layer constituting a thermally conductive portion, it is possible to easily form a thermally conductive portion. In a case where a non-bonding layer that can be bonded to a bonding layer is used as a non-bonding layer, two such non-bonding layers may be provided between graphite composite sheets. In a case where a non-bonding layer having one surface provided with a release layer is used as a non-bonding layer, one such non-bonding layer may be provided between graphite composite sheets. It is possible to make the bonding layers adhesive by applying pressure or by applying pressure and heat to bonding layers after providing the non-bonding layer(s). In view of an improvement in adhesiveness in the fixing portion and the thermally conductive portion, it is preferable to apply pressure and heat at one time. Furthermore, since the non-bonding layer may remain in the resulting thermal transport structure as a part of the thermal transport structure, a structure produced using the non-bonding layer is good because the surfaces of a graphite film also become more protected and become resistant to mechanical friction and the like.

Second Production Method of Embodiment 2

A second method of producing a thermal transport structure of Embodiment 2 of the present invention includes, as with the first production method of Embodiment 2: a graphite composite sheet preparation step of preparing a graphite composite sheet by forming a bonding layer on the entire surfaces of a graphite sheet; and a bonding step performed after the graphite composite sheet preparation step. In the bonding step, graphite composite sheets and a non-bonding layer(s) having both surfaces provided with a release layer are stacked together or graphite composite sheets and a release layer(s) alone are stacked together, and thereafter pressure is applied or pressure and heat are applied to the entire surfaces of the graphite composite sheets, such that the graphite composite sheets are bonded together by a part of the bonding layers.

In this production method, for easy formation of a thermally conductive portion, a non-bonding layer having both surfaces provided with a release layer or a non-bonding layer constituted by a release layer is placed and thereafter pressure is applied or pressure and heat are applied to the bonding layers as with the first production method of Embodiment 2 to thereby make the bonding layers adhesive. In view of an improvement in adhesiveness in the fixing portion, it is preferable to apply pressure and heat at one time. After the bonding, the non-bonding layer may be removed or may not be removed. Note, however, that this production method preferably includes a step of removing the non-bonding layer in view of obtaining a thermal transport structure having great bendability.

Third Production Method of Embodiment 2

A third method of producing a thermal transport structure of Embodiment 2 of the present invention includes: a graphite composite sheet preparation step of preparing a graphite composite sheet by forming a bonding layer on the entire surfaces of a graphite sheet; and a bonding step performed after the graphite composite sheet preparation step. In the bonding step, graphite composite sheets are stacked one over another and thereafter pressure is applied or pressure and heat are applied to a part of the graphite composite sheets, so that the graphite composite sheets are bonded together by a part of the bonding layers.

This production method is the same as the first and second production methods of Embodiment 2, except that there are no non-bonding layers in the thermally conductive portion and that, in the fixing portion, the graphite composite sheets are bonded together by partially applying pressure or by partially applying pressure and heat. Specifically, by applying pressure only to a portion that will become a fixing portion with the use of a jig or the like, it is possible to bond the graphite composite sheets together with the bonding layers on the surfaces of the graphite composite sheets, such that a thermal transport structure having a fixing portion(s) and a thermally conductive portion(s) is obtained.

Embodiments of the present invention may be arranged as below.

<1> A graphite composite material including at least two graphite sheets stacked on top of each other as layers,
the graphite composite material including at least two bonding portions and a non-bonding portion,
the graphite composite material including, in the bonding portions, a bonding layer between the graphite sheets,
the non-bonding portion lying between the bonding portions.

<2> The graphite composite material as set forth in <1>, wherein the bonding layer is further provided on at least part of (i) a surface(s) of any one or more of the graphite sheets in the non-bonding portion and (ii) an outer peripheral edge(s) of the any one or more of the graphite sheets.

<3> The graphite composite material as set forth in <1> or <2>, wherein the bonding layer is further provided on at least part of (i) a surface(s) of the graphite composite material in the non-bonding portion and (ii) an outer peripheral edge(s) of the graphite composite material.

<4> A graphite composite material including at least two graphite composite sheets, each of which includes a graphite sheet and a bonding layer entirely covering surfaces of the graphite sheet, stacked on top of each other as layers,
the graphite composite material including at least two bonding portions and a non-bonding portion,
wherein, in the bonding portions, the bonding layer is present between the graphite sheets.

<5> The graphite composite material as set forth in <4>, wherein the bonding layer is further provided at at least part of an outer peripheral edge(s) of any one or more of the graphite composite sheets.

<6> The graphite composite material as set forth in <4> or <5>, further including a non-bonding layer provided between the graphite composite sheets in the non-bonding portion.

<7> The graphite composite material as set forth in <6>, wherein two such non-bonding layers are provided between the graphite composite sheets.

<8> The graphite composite material as set forth in <6>, wherein one such non-bonding layer is provided between the graphite composite sheets and has at least one surface provided with a release layer.

<9> The graphite composite material as set forth in any of <1> to <8>, wherein the bonding layer has a thickness of not less than 0.1 μm and not more than 20 μm.

<10> The graphite composite material as set forth in any one of <1> to <9>, wherein a/the non-bonding layer has a thickness of not less than 0.001 μm and not more than 20 μm.

<11> The graphite composite material as set forth in any of <1> to <10>, wherein the graphite sheet has a thickness of not less than 1 μm and not more than 100 μm.

<12> The graphite composite material as set forth in any of <1> to <11>, further including a protective layer provided at at least part of an outer surface(s) of the graphite composite material.

<13> A method for producing a graphite composite material, including a bonding step of bonding graphite sheets together with a bonding layer(s) by applying pressure to a stack obtained by alternately stacking the graphite sheets and the bonding layer(s) that is/are for formation of at least a bonding portion.

<14> A method for producing a graphite composite material, including:
a step of, for bonding portions and a non-bonding portion between the bonding portions to be formed, forming a bonding layer on one or more graphite sheets at least in the bonding portions; and
a bonding step of bonding the graphite sheets to each other with the bonding layer after stacking the graphite sheets on top of each other and thereafter applying pressure to the graphite sheets.

<15> A method for producing a graphite composite material, including:
a graphite composite sheet preparation step of preparing a graphite composite sheet by forming a bonding layer on entire surfaces of a graphite sheet; and
a bonding step of, after alternately stacking such graphite composite sheets and a non-bonding layer(s), bonding the graphite composite sheets to each other with a part of the bonding layers by applying pressure to the graphite composite sheets.

<16> A method for producing a graphite composite material including:

a graphite composite sheet preparation step of preparing a graphite composite sheet by forming a bonding layer on entire surfaces of a graphite sheet; and a bonding step of, after alternately stacking such graphite composite sheets and a release layer(s) or alternately stacking such graphite composite sheets and a non-bonding layer(s) having at least one surface where a release layer is formed, bonding the graphite composite sheets to each other with a part of the bonding layers by applying pressure to the graphite composite sheets.

<17> The method as set forth in <15>, further including a detaching step of detaching the release layer(s) or the non-bonding layer(s) having the at least one surface where a release layer is formed.

<18> A method for producing a graphite composite material including:

a graphite composite sheet preparation step of preparing a graphite composite sheet by forming a bonding layer on entire surfaces of a graphite sheet; and a bonding step of, after stacking such graphite composite sheets on top of each other, bonding the graphite composite sheets to each other with a part of the bonding layers by applying pressure to a part of the graphite composite sheets.

<19> The method as set forth in <15>, wherein a plurality of the non-bonding layers are provided between the graphite composite sheets.

<20> The method as set forth in any of <15> to <19>, wherein the bonding layer is formed so as to cover at least part of an outer peripheral edge(s) of the graphite sheet, in addition to covering all over the surfaces of the graphite sheet.

<21> The method as set forth in any of <13> to <20>, wherein:

before the bonding step, the bonding layer has such an adhesive property that the bonding layer becomes adhesive upon receiving heat and pressure; and in the bonding step, bonding is performed at one time by heat and pressure.

<22> The method as set forth in any of <13> to <21>, wherein the bonding layer has, before the bonding step, an adhesion force of not more than 1 N/25 mm at 25° C.

Embodiment B

The thermal transport structure in accordance with an embodiment of the present invention includes: at least two fixing portions; and a thermally conductive portion between the fixing portions. The fixing portions and the thermally conductive portion each include at least two thermally conductive sheets. In each of the fixing portions, all the thermally conductive sheets may be kept in a state in which the thermally conductive sheets are in contact with each other or bonded to each other. As a member for keeping the thermally conductive sheets, a fixing member (described later) may be used, or the fixing member may not be used. The thermally conductive sheets, each of which includes a graphite sheet, are each a single graphite sheet or a graphite composite sheet including a combination of a graphite sheet and other material.

(Graphite Sheet Which Serves as Embodiment of Thermally Conductive Sheet)

The following describes a single graphite sheet which serves as an embodiment of a thermally conductive sheet used in an embodiment of the present invention.

The graphite sheet used in an embodiment of the present invention is not limited to a specific graphite sheet and can be, for example, a natural graphite sheet or a polymer-based graphite sheet. Since the polymer-based graphite sheet has a high thermal conductivity, a thermal transport structure using the polymer-based graphite sheet can exhibit a higher heat transport performance.

The graphite used in an embodiment of the present invention can be basically the same as the graphite described earlier in [Embodiment A].

For example, a process for producing the natural graphite sheet and a method for producing the polymer-based graphite sheet may be based on the method described earlier in the (Type of graphite sheet) section in [Embodiment A].

A thermal conductivity in a plane direction of the graphite sheet used in an embodiment of the present invention can be measured by the method described earlier in the (Calculation of thermal conductivity in plane direction of graphite sheet) section in [Embodiment A].

Measurement of a thermal diffusivity in a plane direction of the graphite sheet used in an embodiment of the present invention can be carried out based on the method described earlier in the (Measurement of thermal diffusivity in plane direction of graphite sheet using light alternating-current method) section in [Embodiment A].

A specific heat capacity of the graphite sheet used in an embodiment of the present invention can be measured based on the method described earlier in the (Measurement of specific heat capacity of graphite sheet) section in [Embodiment A].

A density of the graphite sheet used in an embodiment of the present invention can be calculated based on the method described earlier in the (Measurement of density of graphite sheet) section in [Embodiment A].

The thermal conductivity in a plane direction of the graphite sheet used in an embodiment of the present invention is not less than 500 W/k·K, more preferably not less than 600 W/k·K, still more preferably 700 W/k·K, even more preferably not less than 800 W/k·K, still more preferably 900 W/k·K, and even more preferably not less than 1000 W/k·K. A graphite sheet having a higher thermal conductivity in a plane direction (e.g., a thermal conductivity in a plane direction of not less than 1000 W/k·K) allows a thermal transport structure to have a high heat transport performance. Moreover, the graphite sheet having such a higher thermal conductivity in a plane direction has a graphite with a highly developed crystal structure, and thus yields the effect of preventing a graphite crystal from being peeled off from a surface(s) of the graphite sheet by vibrations. This facilitates increasing reliability against vibrations.

Further, it is preferable that the graphite sheet included in the thermally conductive sheet have a thickness of not less than 1 μm and not more than 100 μm. With a graphite sheet having a thickness in this preferred range, reliability against vibrations and heat transport performance can be easily obtained.

(Graphite Composite Sheet Which Serves as Embodiment of Thermally Conductive Sheet)

The following describes a graphite composite sheet which serves as another embodiment of a thermally conductive sheet in accordance with an embodiment of the present invention.

The graphite composite sheet includes (a) a graphite sheet having a thermal conductivity in a plane direction of not less than 500 W/k·K and (b) a covering layer which covers at least part of (i) a surface(s) and (ii) an edge(s) of the graphite sheet. The arrangement in which the covering layer covers at least part of (i) a surface(s) and (ii) an edge(s) of the graphite sheet yields the effect of preventing a graphite crystal from being peeled off from a surface(s) of the graphite sheet by vibrations. This facilitates increasing reliability against vibrations. From the viewpoint of preventing a graphite crystal from being peeled off from a surface(s) of the graphite sheet by vibrations, it is particularly preferable that all faces of the graphite sheet be completely covered by the covering layer, the all faces including both surfaces and all edges of the graphite sheet.

It is preferable that the covering layer contain at least one of a thermosetting resin, a thermoplastic resin, and a sticky resin. That is, the thermosetting resin, the thermoplastic resin, and the sticky resin described below may be used singly as a covering layer or may be used in combination.

The thermosetting resin and the thermoplastic resin can be the ones described earlier in the (Type of bonding layer) section in [Embodiment A].

Examples of the sticky resin include an acrylic resin and a silicone resin.

A method for forming a covering layer on a graphite sheet includes several methods below. In the first method, the covering layer is formed by (i) applying, onto a graphite sheet, a coating of a solution in which at least one of a thermosetting resin, a thermoplastic resin, and a sticky resin is dissolved in a solvent and then (ii) volatilizing only the solvent. In the second method, the covering layer is formed by directly applying, onto a graphite sheet, a film made of a precursor of a thermosetting resin or a film made of a thermoplastic resin by, for example, thermal lamination or thermal pressing. In the third method, the covering layer is formed by laminating a film having a sticky resin on its surface and being made from a thermosetting resin or a thermoplastic resin, to apply the film to the graphite sheet via the sticky resin.

A thickness of the covering layer is not particularly limited and is preferably not less than 1 µm and not more than 100 µm. In a case where the thickness of the covering layer is not less than 1 µm, the effect of preventing cohesive fracture of graphite crystals from a graphite sheet is sufficiently provided. On the other hand, in a case where the thickness of the covering layer is not more than 100 µm, the covering layer is not resistant to heat. This prevents a thermal transport structure from having a degraded heat transport performance and prevents a transport structure from having an increased resilience against bending. This achieves a transport structure with a high degree of reliability in thermal performance.

(Fixing Member)

The following describe a fixing member in accordance with an embodiment of the present invention. The fixing member is not particularly limited, provided that it keeps the thermally conductive sheets in a state in which the thermally conductive sheets are in contact with each other or in a state in which the thermally conductive sheets are bonded to each other. A member for keeping the thermally conductive sheets in a state in which the thermally conductive sheets are in contact with each other is preferably a clip or a flat plate. A member for keeping the thermally conductive sheets in a state in which the thermally conductive sheets are bonded to each other is preferably a bonding layer or a double-sided tape. The bonding layer or the double-sided tape is disposed between the thermally conductive sheets.

The clip used as the fixing member is not particularly limited and can be a publicly known clip. Examples of such a clip include a paper clip, a bulldog clip, and a GACHA clip (registered trademark).

The flat plate used as the fixing member is preferably made of metal or ceramic. The metal or ceramic is excellent in hardness and is thus suitable for firmly fixing the thermally conductive sheets. In terms of heat conductivity, the flat plate used as the fixing member is more preferably made of metal, and particularly preferably made of copper or aluminum. Further, as a member for fixing the flat plate, a bolt is preferably used. From the viewpoint of firmly fixing the thermally conductive sheets, a material of the bolt is preferably made of metal or ceramic.

A material of the bonding layer used as the fixing member is not particularly limited and preferably contains at least one of a thermosetting resin, a thermoplastic resin, and a sticky resin. The thermosetting resin, the thermoplastic resin, and/or the sticky resin used as the bonding layer can be the same as the aforementioned materials used as the covering layer. Further, the thermosetting resin, the thermoplastic resin, and/or the sticky resin contained in the bonding layer may be used singly or may be used in combination.

The double-sided tape used as the fixing member is not particularly limited and can be a publicly known double-sided tape. For example, a polyester film with acrylic sticky resin on its both sides can be preferably used.

(Fixing Portion)

The following describes a fixing portion in accordance with an embodiment of the present invention. As illustrated in FIGS. 21 to 26, a fixing portion 202 indicates a position where heat from a heat source is received or a position where heat is passed to a cooling source. That is, the fixing portion 202 includes at least one of a combination of a graphite sheet 213 and a bonding layer 214, a combination of the graphite sheet 213 and a flat plate 218, and a combination of the graphite sheet 213 and a covering layer 215. The heat source is defined as a part where heat is generated. Examples of the heat source include a device, such as a CPU, disposed inside an electronic device in operation. The cooling source is defined as a part where heat is absorbed. Assuming that the heat source is a CPU disposed inside an electronic device in operation, examples of the cooling source include a fin and a Peltier device provided on a body housing of the electronic device or provided inside the electronic device.

As the fixing portion, two or more fixing portions can be provided in one thermal transport structure, in order to enable heat transfer between the heat source and the cooling source. In a case where three or more fixing portions are provided, it is possible to provide the fixing portions in one thermal transport structure such that the fixing portions correspond to a plurality of heat sources on a one-to-one basis. This allows heat from a plurality of heat sources to be simultaneously passed to the cooling source. Further, in a case where three or more fixing portions are provided, it is possible to provide the fixing portions in one thermal transport structure such that the fixing portions correspond to a plurality of cooling sources on a one-to-one basis. This allows heat from the heat source to be simultaneously passed to a plurality of cooling sources. As such, a thermal transport structure having three or more fixing portions is preferable because it reduces the number of members for carrying out heat transport (specifically, thermal transport structures).

A size and a planar shape of the fixing portion 202 are not particularly limited and can be determined as appropriate depending on a dimension(s) of the heat source and/or the cooling source. From the viewpoint of transferring heat smoothly, the size of the fixing portion 202 is preferably a size closer to the size(s) of the heat source and/or the cooling source, and is most preferably a size that is substantially the same as the size(s) of the heat source and/or the cooling source. Specifically, the size of the fixing portion 202 is preferably not less than 5 mm and not more than 200 mm per side and is more preferably not less than 10 mm and not more than 100 mm per side. The fixing portion 202 having a size in this preferred range allows heat to be transferred smoothly between the heat source and the cooling source.

A thickness of the fixing portion 202 is not particularly limited, and is preferably not less than 10 μm and not more than 50 mm, and is more preferably not less than 100 μm and not more than 10 mm. With the fixing portion 202 having a thickness in this preferred range, a thermal transport structure excellent in heat transport performance can be obtained.

Embodiments of Fixing Portion

The following describes embodiments of the fixing portion in accordance with an embodiment of the present invention. In the fixing portion, thermally conductive sheets are kept in a state in which the thermally conductive sheets are in contact with each other or in a state in which the thermally conductive sheets are bonded to each other. As embodiments of the fixing portion, First to Third Embodiments below are preferable from the viewpoint of providing thermal transport structures with heat transport performance and high reliability against vibrations.

First Embodiment is an embodiment in which thermally conductive sheets are bonded to each other via a bonding layer which is a fixing member. Second Embodiment is an embodiment in which thermally conductive sheets are directly bonded to each other via a covering layer without using a fixing member. Third Embodiment is an embodiment in which thermally conductive sheets are in contact with each other by use of a flat plate which is a fixing member.

The following describes preferable embodiments of the fixing portion

Fixing Portion, First Embodiment

Figure 21:
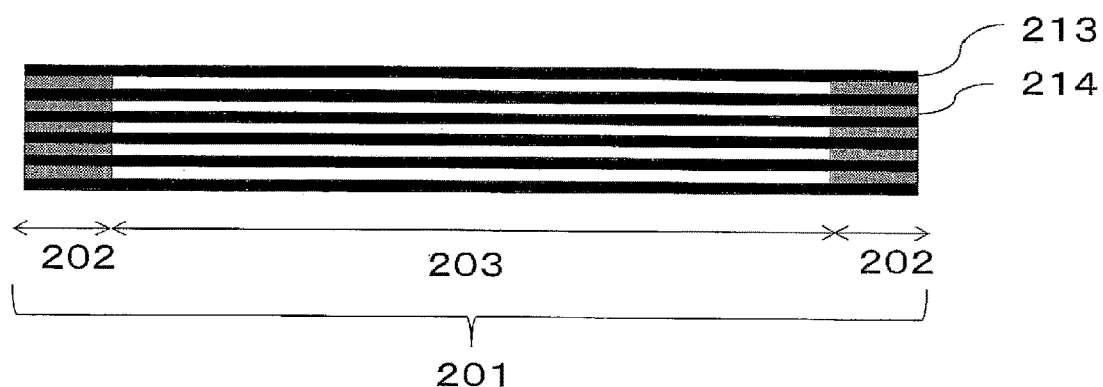
FIG. 21 illustrates an embodiment of a thermal transport structure in accordance with the present invention.

As illustrated in FIG. 21, a thermal transport structure 201 in accordance with First Embodiment is arranged such that graphite sheets 213, which are thermally conductive sheets, are kept via a bonding layer 214, which is a fixing member. A method for forming the thermal transport structure 201 includes several methods.

In the first method, a bonding layer 214 is formed by (i) applying, onto each of graphite sheets 213 in an area where a fixing portion 202 is to be formed, a coating of a solution in which at least one of a thermosetting resin, a thermoplastic resin, and a sticky resin is dissolved in a solvent and then (ii) volatilizing only the solvent. Next, the graphite sheets 213 each having the bonding layer 214 formed thereon are stacked on top of each other, and heating and pressing are carried out such that all the graphite sheets 213 in the fixing portion 202 are bonded together. As a result, the thermal transport structure 201 is obtained.

In the second method, a film containing a precursor of a thermosetting resin or a thermoplastic resin, which film serves as a bonding layer 214, is disposed on each of the graphite sheets 213 in an area where a fixing portion 202 is to be formed. Next, the film is thermally cured or thermally welded by, for example, thermal lamination or thermal pressing so that the graphite sheets 213 are bonded together. As a result, a thermal transport structure 201 is obtained.

In the third method, a film of a sticky resin, which film serves as a bonding layer 214, is disposed on each of graphite sheets 213 in an area where a fixing portion 202 is to be formed. Next, the graphite sheets 213 each having the film formed thereon are stacked on top of each other, and pressure is applied such that all the graphite sheets 213 in the fixing portion 202 are bonded together. As a result, the thermal transport structure 201 is obtained.

Figure 22:
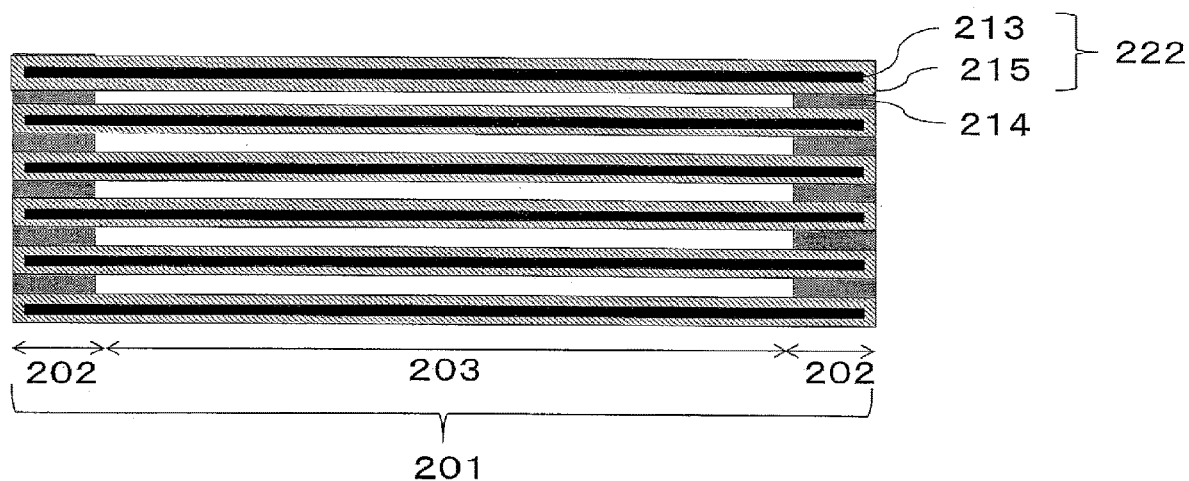
FIG. 22 illustrates an embodiment of a thermal transport structure in accordance with the present invention.

As illustrated in FIG. 22, a thermal transport structure 201, which represents another preferable example embodiment of the First Embodiment, is arranged such that graphite composite sheets 222, each of which includes a graphite sheet 213 having surfaces provided with a covering layer 215, are fixed with a bonding layer 214. A thermal transport structure 201 in accordance with the other preferable example embodiment of the First Embodiment is formed as in the method for forming the embodiment illustrated in FIG. 21, except that a graphite composite sheet 222, which is a thermally conductive sheet each including a graphite sheet 213 having surfaces provided with a covering layer 215, is used. The covering layer 215 contains at least one of a thermosetting resin, a thermoplastic resin, and a sticky resin. However, the covering layer 215 is preferably a stack of a thermosetting resin and a sticky resin or a stack of a thermoplastic resin and a sticky resin because the covering layer 215 is easily bonded to surfaces of the graphite sheet 213 and is less likely to be peeled off by vibrations.

A thickness of the bonding layer 214 is not particularly limited and is preferably not less than 0.1 μm and not more than 100 μm. The bonding layer 214 having a thickness in this preferred range allows the thermal transport structure 201 to be excellent in heat transport performance.

Fixing Portion, Second Embodiment

Figure 23:
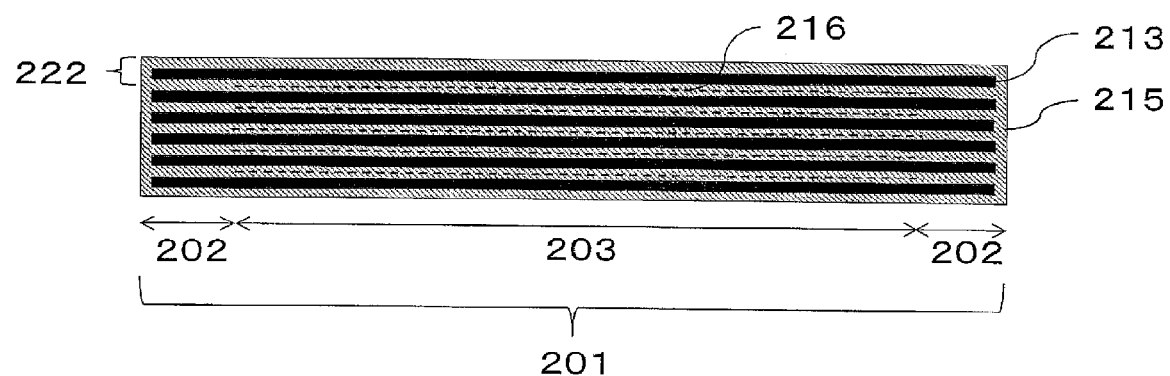
FIG. 23 illustrates an embodiment of a thermal transport structure in accordance with the present invention.

As illustrated in FIG. 23, a thermal transport structure 201 in accordance with Second Embodiment is arranged such that graphite sheets 213 are kept in a state in which all the graphite sheets 213 in a fixing portion 202 are directly bonded together via a covering layer 215. As a method for forming the thermal transport structure 201 in accordance with the Second Embodiment is preferably a method of directly bonding graphite composite sheets 222, which are thermally conductive sheets, to each other with a thermosetting resin, a thermoplastic resin, or a sticky resin contained in a covering layer 215. As the thermosetting resin, the thermoplastic resin, and the sticky resin, the same ones as used in First Embodiment can be used as appropriate. The following describes preferable methods for forming thermal transport structures by using the individual resins.

A preferable method is a method of forming a fixing portion 202 by preparing a plurality of graphite composite sheets 222 each having a graphite sheet 213 and a precursor of a thermosetting resin used as a covering layer 215, the precursor being disposed on all faces of the graphite sheet 213, and then thermally curing the precursor of the thermosetting resin and simultaneously bonding the graphite composite sheets 222 together. In this case, it is preferable that a non-bonding portion 216 be formed by performing non-bonding treatment in advance on a graphite composite sheet 222 in an area where the non-bonding portion 216 is to be formed. A method for performing non-bonding treatment is preferably application of a coating of a release material or disposition of a release film. In a case where application of a coating of a release material is employed, non-bonding treatment can be performed by using a Teflon (registered trademark)-based release spray or a silicon-based release spray. In a case where disposition of a release film is employed, the release film is preferably a Teflon (registered trademark)-based film. The release film can be easily removed from each graphite composite sheet 222 after the fixing portion 2 is formed.

Another preferable method is a method of forming a fixing portion 202 by preparing graphite composite sheets 222 each having a graphite sheet 213 and a thermoplastic resin used as a covering layer 215, the thermoplastic resin being disposed on all faces of the graphite sheet 213, and then bonding the graphite composite sheets 222 together by welding the thermoplastic resin by application of heat to an area where the fixing portion 202 is to be formed. An area where the thermoplastic resin is not welded serves as the non-bonding portion 216. A region partially containing the non-bonding portion 216 serves as a thermally conductive portion 203.

Still another preferable method is a method of forming a fixing portion 202 by preparing graphite composite sheets 222 each having a graphite sheet 213 and a sticky resin used as a covering layer 215, the sticky resin being disposed on all faces of the graphite sheet 213, and then bonding the graphite composite sheets 222 together with use of the sticky resin by application of pressure to an area where the fixing portion 202 is to be formed. In this case, an area where bonding with the sticky resin is not performed serves as the non-bonding portion 216. A region partially containing the non-bonding portion 216 serves as a thermally conductive portion 203.

Further, in forming the fixing portion 202 in the above method for forming the fixing portion 202, unintentional bonding of the graphite composite sheets 222 can occur in a region where the thermally conductive portion 203 is to be formed. In order to prevent the occurrence of such unintentional bonding, it is preferable that in the region corresponding to the thermally conductive portion 203, two films which are, for example, polyimide films and serve as a non-bonding portion-forming layer 217 illustrated in FIG. 24, be disposed in advance in each gap between the graphite composite sheets 222. Although the polyimide films are finally bonded to the graphite composite sheet 222, the polyimide films are not bonded to each other. As a result, the graphite composite sheets 222 in the thermally conductive portion 203 are not bonded. Consequently, the non-bonding portion 216 is formed.

Fixing Portion, Third Embodiment

Figure 25:
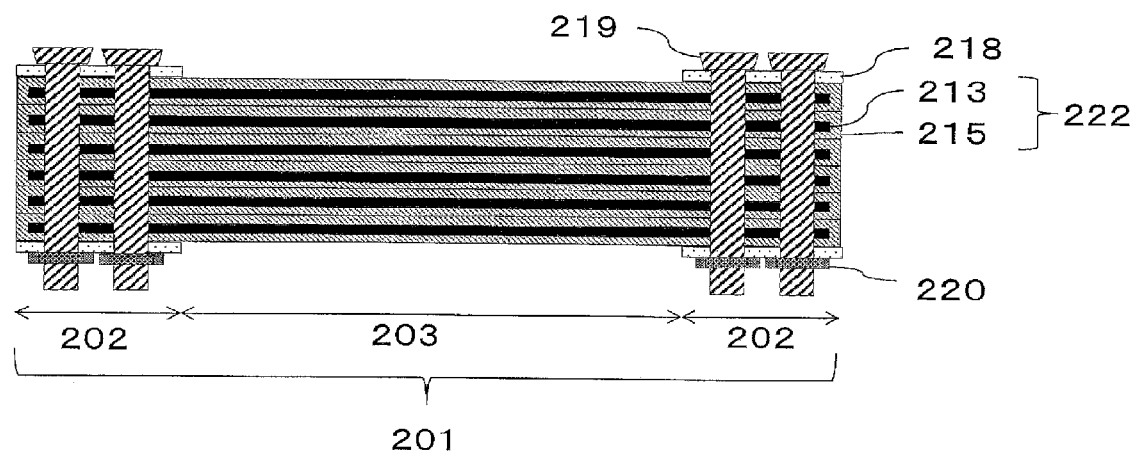
FIG. 25 illustrates an embodiment of a thermal transport structure in accordance with the present invention.

As illustrated in FIG. 25, a thermal transport structure 201 in accordance with Third Embodiment is arranged such that graphite composite sheets 222 are kept in a state in which the graphite composite sheets 222 are in contact with each other, by use of a flat plate 218 which is a fixing member. A method for forming Third Embodiment includes providing the flat plate 218 which is a fixing member, on a graphite composite sheet 222 provided at an outer surface(s) of the fixing portion 202.

A method for keeping the graphite composite sheets 222 in a state in which the graphite sheets 222 are in contact with each other is not particularly limited, and is preferably the following method. First, through the graphite composite sheets 222 and the flat plate 218, a through hole is formed. Then, through the through hole, a bolt 219 is inserted and tightened until the graphite composite sheets 222 are put in a state in which the graphite composite sheets 222 are in contact with each other. Thereafter, the bold 219 is attached with a nut 220. This method fixes all the graphite composite sheets 222 and the flat plate 218 in the fixing portion 202.

A size of the flat plate 218 is not particularly limited. Preferably, the size is the same as that of the fixing portion 202. This is because the flat plate 218 having such a size allows heat to be smoothly transferred between a fixing portion 202 and a heat source and between another fixing portion 202 and a cooling source.

A thickness of the flat plate 218 is not particularly limited. The thickness is preferably not less than 50 µm and not more than 5 mm, and more preferably not less than 100 µm and not more than 2 mm. The flat plate 218 having a thickness in this preferred range allows the graphite composite sheets 222 to be in good contact with each other, so that a thermal transport structure 201 excellent in heat transport performance can be obtained.

The flat plate 218 is provided at least on a graphite composite sheet 222 which is provided at one outer surface of the thermal transport structure 201. It is, however, preferable to provide the flat plate 218 on each of graphite composite sheets 222 that are provided at both outer surfaces of the thermal transport structure 201, respectively. Such provision of the flat plate 218 on each of the graphite composite sheets 222 that are provided at the both outer surfaces of the thermal transport structure 201, respectively, makes it possible to more firmly fix the graphite composite sheets 222. It should be noted that it is not necessary to use the bolt 219 and the nut 220, and instead, it is possible to join, by swaging and/or welding, (i) the flat plate 218 on a graphite composite sheet 218 at one outer surface of the thermal transport structure 201 to (ii) the flat plate 218 on a graphite composite sheet 218 at the other outer surface of the thermal transport structure 201.

Figure 26:
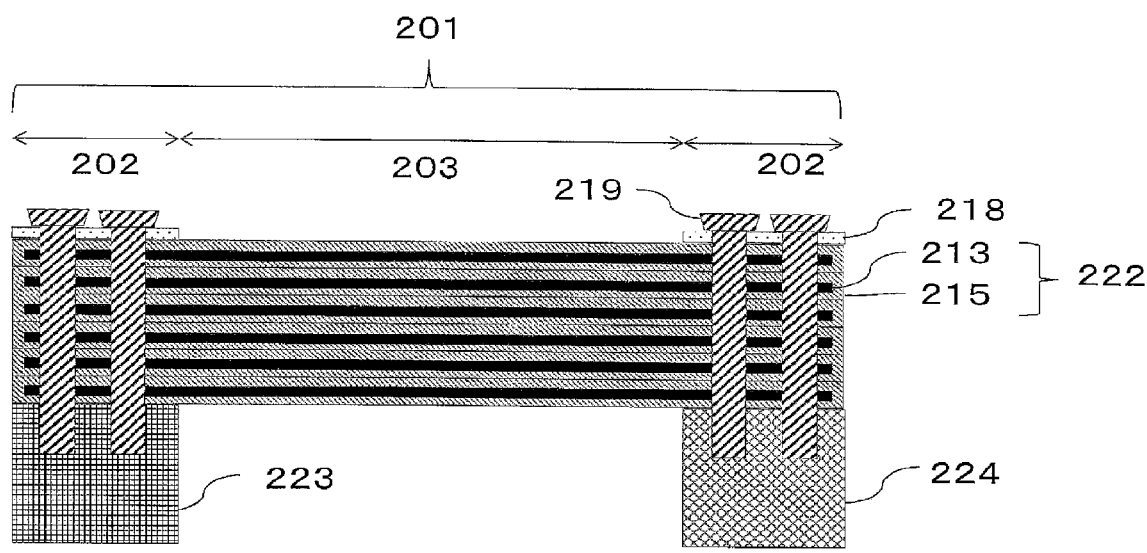
FIG. 26 illustrates an embodiment of a thermal transport structure and fixing portions in accordance with the present invention.

In a case where the flat plate 218 is provided on only one graphite composite sheet 222 which is provided at one outer surface of the thermal transport structure 201, a heat source 223 and a cooling source 224 are directly joined to respective bolts 219 after the blots 219 are each inserted through the flat plate 218 and all the graphite composite sheets 222 in this order in the fixing portion 202, as illustrated in FIG. 26. This arrangement causes tightening force of the bolt 219 to be applied, via the flat plate 218, to all the graphite composite sheets 222 in the fixing portion 202. Accordingly, a good state of contact can be kept between a graphite composite sheet 222 and the heat source 223, between another graphite composite sheet 222 and the cooling source 224, and between the graphite composite sheets 222 in the fixing portion 202, so that heat can be transferred well. In view of cost reduction, provision of the flat plate 218 can be omitted.

A material of the flat plate 218 is not particularly limited. In view of a heat transport property, the material of the flat plate 218 is preferably a metal, such as copper or aluminum, which has a good heat conductivity.

A method for forming the through hole in the fixing portion 202 including the flat plate 218 is not particularly limited, and preferably, the through hole is formed by drilling, using laser, or punching.

A shape of the through hole in the fixing portion 202 including the flat plate 218 is not particularly limited. The shape of the through hole is preferably a circular shape. This is because the bolt 219 is inserted through the through hole. The through hole is not particularly limited in diameter. The diameter of the through hole is preferably in a range of not less than 1 mm and not more than 10 mm. In a case where the diameter is in the above preferred range, smooth heat transfer between graphite composite sheets becomes easy. Particularly in a case where the through hole having a diameter of not more than 10 mm, an area of the fixing portion 202 does not become small.

This allows for smooth transfer of heat to/from a heat source and a cooling source.

The number of through holes is not particularly limited. The number is preferably in a range of not less than 1 and not more than 4 in each fixing portion 202. In a case where there is only one through hole in each fixing portion 202, the through hole is preferably formed in a central region of the fixing portion 202. This is because such an arrangement can evenly put the graphite composite sheets 222 in the fixing portion 202 in contact with each other. Meanwhile, in a case where the number of through holes is four, the through holes are preferably formed at four corners of the fixing portion 202. This is because such an arrangement can evenly put the graphite composite sheets 222 in the fixing portion 202 in contact with each other.

The at least two fixing portions can be provided so as to overlap with each other in a direction in which the graphite sheets are stacked on top of each other as layers. In other words, the thermal transport structure in accordance with an embodiment of the present invention can be formed by stacking at least two thermal transport structures on top of each other. More specifically, the thermal transport structure in accordance with an embodiment of the present invention can be formed by keeping respective fixing portions of at least two component thermal transport structures in a state in which these fixing portions are in contact with each other or bonded to each other.

For example, one thermal transport structure can be formed by integrating at least two component thermal transport structures (in other words, by keeping the at least two component thermal transport structures in contact with each other or bonded to each other). Each of the at least two component thermal transport structures here has a substantially identical shape (e.g., quadrangular prism) and includes fixing portions at substantially identical positions (e.g., both ends of the quadrangular prism), and the at least two component thermal transport structures are integrated with each other in a state in which respective fixing portions of the at least two component thermal transport structures are overlapped with each other in a direction in which the graphite sheets are stacked on top of each other as layers.

More specifically, the following discusses a quadrangular prism-shaped first thermal transport structure having a fixing portion A and a fixing portion B at both ends, respectively, and a quadrangular prism-shaped second thermal transport structure having a fixing portion C and a fixing portion D at both ends, respectively. It is possible to produce one thermal transport structure by integrating the first thermal transport structure and the second thermal transport structure that are provided in a state in which the fixing portion A and the fixing portion C are overlapped with each other and the fixing portion B and the fixing portion D are overlapped with each other in a direction in which graphite sheets are stacked on top of each other as layers (for example, one thermal transport structure can be produced by uniting the fixing portion A and the fixing portion C to each other and uniting the fixing portion B and the fixing portion D to each other). In this case, in the thermal transport structure thus newly formed, new fixing portions are formed by a combined portion of the fixing portion A and the fixing portion C and a combined portion of the fixing portion B and the fixing portion D, respectively. In another aspect, one thermal transport structure can be made of a plurality of thermal transport structures by: (i) uniting the fixing portion A and the fixing portion C that are provided so as to overlap with each other but not uniting the fixing portion B and the fixing portion D that are provided so as to overlap with each other; or (ii) not uniting the fixing portion A and the fixing portion C that are provided so as to overlap with each other, but uniting the fixing portion B and the fixing portion D that are provided so as to overlap with each other.

Alternatively, one thermal transport structure can be produced by integrating the first thermal transport structure and the second thermal transport structure that are provided in a state in which the fixing portion A and the fixing portion C are overlapped with each other but the fixing portion B and the fixing portion D are not overlapped with each other (e.g., by uniting the fixing portion A and the fixing portion C). In this case, in the thermal transport structure thus newly formed, a combined portion of the fixing portion A and the fixing portion C, the fixing portion B, and the fixing portion D form new fixing portions, respectively.

As another alternative, a new thermal transport structure can be formed by replacing a thermally conductive sheet 302 and a thermally conductive sheet 303 illustrated in any one of (a) to (f) of FIG. 27 with thermal transport structures, respectively, and integrating the thermal transport structures with each other. It should be noted that (a) to (f) of FIG. 27 will be discussed later, and therefore a description thereof will be omitted here.

(Thermally Conductive Portion)

The thermally conductive portion in accordance with an embodiment of the present invention indicates a portion where thermally conductive sheets are at least partially out of contact with each other or at least partially not bonded to each other. The thermally conductive portion includes thermally conductive portions 203 illustrated in FIGS. 21 to 26, respectively. The thermally conductive portion 203 is sandwiched between fixing portions 202 one of which provides a position where heat from a heat source is received and the other of which provides a position where a heat is passed to a cooling source. Accordingly, the thermally conductive portion 203 is a portion where heat is transferred from one fixing portion 202 which receives heat from the heat source to the other fixing portion 202 which passes heat to the cooling source.

A length of the thermally conductive portion 203 has is not particularly limited. The length of the thermally conductive portion 203 is preferably not less than 30 mm, and more preferably not less than 60 mm and not more than 500 mm. The thermally conductive portion 203 having a length in such a preferred range makes it possible to obtain a thermal transport structure 201 excellent in heat transport performance and reliability against vibrations.

A width of the thermally conductive portion 203 is not particularly limited. The width of the thermally conductive portion 203 is preferably not less than 5 mm and not more than 200 mm, and more preferably not less than 10 mm and not more than 100 mm. The thermally conductive portion 203 having a width in the above preferred range makes it possible to have both thermal resistance and resilience against bending in a better manner. This consequently makes it possible to obtain a thermal transport structure 201 excellent in heat transport performance and reliability against vibrations.

A thickness of the thermally conductive portion 203 is not particularly limited. The thickness of the thermally conductive portion 203 is preferably not less than 10 μm and not more than 50 mm, and more preferably not less than 100 μm and not more than 10 mm. The thermally conductive portion 203 having a thickness in the above preferred range makes it possible to obtain a thermal transport structure 201 excellent in heat transport performance and reliability against vibrations.

The number of graphite sheets 213 or graphite composite sheets 222 which are the thermally conductive sheets is not particularly limited. The number of graphite sheets 213 or graphite composite sheets 222 is preferably not less than 3 and not more than 100, and particularly preferably not less than 5 and not more than 50. In a case where the number of thermally conductive sheets is in the above preferred range, it is possible to obtain a thermal transport structure 201 excellent in heat transport performance and reliability against vibrations.

In the thermally conductive portion 203 of the thermal transport structure 201, it is preferable that each bonded pair of the graphite sheets 213 or the graphite composite sheets 222 be not entirely bonded to each other, which graphite sheets 213 or graphite composite sheets 222 are the thermally conductive sheets. This is because such an arrangement leads to an excellent resilience against bending (described later).

Further, the thermally conductive portion 203 is not particularly limited in planar shape (shape when viewed from above). The planar shape of the thermally conductive portion 203 can be any shape such as a linear shape, a curved shape, or a trapezoid. Among these shapes, the planar shape is preferably a linear shape since the thermally conductive portion having a linear shape allows for heat transfer through the shortest path and is excellent in heat transport performance.

(Resilience Against Bending)

A resilience against bending in accordance with an embodiment of the present invention can be calculated as follows. After the thermally conductive portion is straightened, a distance between fixing portions is reduced. Then, the thermally conductive portion is bent such that the thermally conductive portion is compressed by 10% in length (the distance between fixing positions). Then, a stress in a heat transfer direction of the thermally conductive portion in a compressed state is measured. The stress in the heat transfer direction thus measured and a length and a cross sectional area of the thermally conductive portion are used to derive a resilience against bending of the thermally conductive portion by the following Equation (2):

$$R = \sigma \times A/L \quad (2)$$

where R is a resilience against bending (N/cm) of the thermally conductive portion, $\sigma$ is a stress (N) in a longitudinal direction of the thermally conductive portion, A is an initial length (cm) of the thermally conductive portion, and L is a cross sectional area (cm$^2$) of the thermally conductive portion. In other words, the resilience against bending can be taken as a unique value indicative of resilience of the thermally conductive portion. Though the resilience against bending of the thermal transport structure is not more than 40 N/cm, the resilience against bending is preferably not more than 30 N/cm and more preferably not more than 20 N/cm since the thermal transport structure having such a resilience against bending is excellent in reliability against vibrations.

In each of Embodiments A and B described above, the graphite sheets and the graphite composite sheets each can be variously arranged.

For example, (a) and (b) of FIG. 27 each are a top view of a thermal transport structure which is formed by overlapping a part of a thermally conductive sheet 302 (the thermally conductive sheet 302 can be a graphite sheet or a graphite composite sheet) and a part of a thermally conductive sheet 303 (the thermally conductive sheet 303 can be a graphite sheet or a graphite composite sheet). The thermal transport structure includes a plurality of fixing portions 310 and a thermally conductive portion between fixing portions 310.

Since (a) and (b) of FIG. 27 are each a top view of the thermal transport structure, only one thermally conductive sheet 302 and one thermally conductive sheet 303 are illustrated in (a) and (b) of FIG. 27. However, a desired number of the thermally conductive sheets 302 and a desired number of the thermally conductive sheets 303 can be stacked as layers in a direction from a front side to a back side of a paper sheet of (a) and (b) of FIG. 27. More specifically, it is possible to alternately stack, as layers, a desired number of the thermally conductive sheets 302 and a desired number of the thermally conductive sheets 303. In regard to this point, a more detailed description will be given with reference to (c) to (f) of FIG. 27. It should be noted that respective arrangements illustrated in (a) to (f) of FIG. 27 are each an example of an arrangement of the thermal transport structure, and an embodiment of the present invention is not limited thereto.

(c) and (d) of FIG. 27 are cross sectional views of thermal transport structures of different embodiments, respectively. Respective top shapes of these thermal transport structures are substantially identical to each other and similar to the shape illustrated in (a) of FIG. 27. Meanwhile, (e) and (f) of FIG. 27 are cross sectional views of thermal transport structures of different embodiments, respectively. Respective top shapes of these thermal transport structures are substantially identical to each other and similar to the shape illustrated in (b) of FIG. 27. The above embodiments will be discussed below in detail.

Embodiment-1

(c) of FIG. 27 is an example of a cross sectional view taken along dotted line in the thermal transport structure illustrated in (a) of FIG. 27. In this case, both of the thermally conductive sheet 302 and the thermally conductive sheet 303 can be graphite sheets.

In a first fixing portion (the fixing portion 310 which is a right side portion of the thermally conductive sheet 302 illustrated in (a) of FIG. 27; in other words, the fixing portion 310 in a right-hand area of the paper sheet of (c) of FIG. 27), a bonding layer 305 is provided on a thermally conductive sheet 302 and on the bonding layer 305, another thermally conductive sheet 302 is provided. In the first fixing portion, these thermally conductive sheets 302 are kept in a state in which the thermally conductive sheets 302 are bonded to each other. It should be noted that the first fixing portion can be arranged to include no bonding layer 305. In such a case, the thermally conductive sheets 302 should be kept in contact with each other by use of the fixing member described earlier.

In a second fixing portion (the fixing portion 310 which is a left side portion of the thermally conductive sheet 302 illustrated in (a) of FIG. 27; in other words, the fixing portion 310 in a left-hand area of the paper sheet of (c) of FIG. 27), a bonding layer 305 is provided on a thermally conductive sheet 302. On the bonding layer 305, a thermally conductive sheet 303 is provided. Further, on this thermally conductive sheet 303, another bonding layer 305 is provided and on the another bonding layer 305, another thermally conductive sheet 302 is provided. In addition, on the another thermally conductive sheet 302, yet another bonding layer 305 is provided and on the yet another bonding layer 305, another thermally conductive sheet 303 is provided. In the second fixing portion, the thermally conductive sheets 302 and the thermally conductive sheets 303 are kept in a state in which the thermally conductive sheets 302 and the thermally conductive sheets 303 are bonded together. It should be noted that the second fixing portion can be arranged to include no bonding layer 305. In this case, the thermally conductive sheets 302 and the thermally conductive sheets 303 should be kept in contact with one another by the fixing member described earlier.

A third fixing portion (the fixing portion 310 below the thermally conductive sheet 303 illustrated in (a) of FIG. 27 (not illustrated in (c) of FIG. 27)) can be provided on the front side of the paper sheet of (c) of FIG. 27 with respect to the second fixing portion of (c) of FIG. 27. More specifically, the two thermally conductive sheets 303 illustrated in the second fixing portion each extend in a direction from the back side to a front side of the paper sheet of (c) of FIG. 27. Further, between respective ends of the two thermally conductive sheets 303, which ends are formed by such extension of the two thermally conductive sheets 303, a bonding layer 305 can be provided. The third fixing portion, like the first fixing portion, can be provided to include no bonding layer 305.

Embodiment-2

(d) of FIG. 27 is another example of a cross sectional view taken along dotted line in the thermal transport structure illustrated in (a) of FIG. 27. In this case, both of the thermally conductive sheet 302 and the thermally conductive sheet 303 can be graphite composite sheets.

In a first fixing portion (the fixing portion 310 which is a right side portion of the thermally conductive sheet 302 illustrated in (a) of FIG. 27; in other words, the fixing portion 310 in a right-hand area of the paper sheet of (d) of FIG. 27), a thermally conductive sheet 302 is provided on another thermally conductive sheet 302. In the first fixing portion, these thermally conductive sheets 302 are kept in a state in which the thermally conductive sheets 302 are bonded to each other.

In a second fixing portion (the fixing portion 310 which is a left side portion of the thermally conductive sheet 302 illustrated in (a) of FIG. 27; in other words, the fixing portion 310 in a left-hand area of the paper sheet of (d) of FIG. 27), a thermally conductive sheet 302 is provided on a thermally conductive sheet 303. Further, on this thermally conductive sheet 303, another thermally conductive sheet 302 is provided. In addition, on the another thermally conductive sheet 302, another thermally conductive sheet 303 is provided. In the second fixing portion, the thermally conductive sheets 302 and the thermally conductive sheets 303 are kept in a state in which the thermally conductive sheets 302 and the thermally conductive sheets 303 are bonded with one another.

A third fixing portion (the fixing portion 310 below the thermally conductive sheet 303 illustrated in (a) of FIG. 27 (not illustrated in (d) of FIG. 27)) can be provided on the front side of the paper sheet of (d) of FIG. 27 with respect to the second fixing portion of (d) of FIG. 27. More specifically, the two thermally conductive sheets 303 illustrated in the second fixing portion each extend in the direction from the back side to the front side of the paper sheet of (d) of FIG. 27. Further, respective ends of the two thermally conductive sheets 303, which ends are formed by such extension of the two thermally conductive sheets 303, are kept bonded to each other.

Embodiment-3

(e) of FIG. 27 is an example of a cross sectional view taken along dotted line in the thermal transport structure illustrated in (b) of FIG. 27. In this case, both of the thermally conductive sheet 302 and the thermally conductive sheet 303 can be graphite sheets.

In a first fixing portion (the fixing portion 310 which is a right side portion of the thermally conductive sheet 302 illustrated in (b) of FIG. 27; in other words, the fixing portion 310 in a right-hand area of the paper sheet of (e) of FIG. 27), a bonding layer 305 is provided on a thermally conductive sheet 302 and on the bonding layer 305, another thermally conductive sheet 302 is provided. In the first fixing portion, these thermally conductive sheets 302 are kept in a state in which the thermally conductive sheets 302 are bonded to each other. It should be noted that the first fixing portion can be arranged to include no bonding layer 305. In such a case, the thermally conductive sheets 302 should be kept in contact with each other by use of the fixing member described earlier.

In a second fixing portion (the fixing portion 310 in the center of the thermally conductive sheet 302 illustrated in (b) of FIG. 27; in other words, the fixing portion 310 in the center of the paper sheet of (e) of FIG. 27), a bonding layer 305 is provided on a thermally conductive sheet 302. On the bonding layer 305, a thermally conductive sheet 303 is provided. Further, on this thermally conductive sheet 303, another bonding layer 305 is provided and on the another bonding layer 305, another thermally conductive sheet 302 is provided. In addition, on the another thermally conductive sheet 302, yet another bonding layer 305 is provided and on the yet another bonding layer 305, another thermally conductive sheet 303 is provided. In the second fixing portion, the thermally conductive sheets 302 and the thermally conductive sheets 303 are kept in a state in which the thermally conductive sheets 302 and the thermally conductive sheets 303 are bonded together. It should be noted that the second fixing portion can be arranged to include no bonding layer 305. In this case, the thermally conductive sheets 302 and the thermally conductive sheets 303 should be kept in contact with one another by the fixing member described earlier.

A third fixing portion (the fixing portion 310 which is a left side portion of the thermally conductive sheet 302 illustrated in (b) of FIG. 27; in other words, the fixing portion 310 in a left-hand area of the paper sheet of (e) of FIG. 27) can be arranged like the first fixing portion.

A fourth fixing portion (the fixing portion 310 below the thermally conductive sheet 303 illustrated in (b) of FIG. 27 (not illustrated in (e) of FIG. 27)) can be provided on the front side of the paper sheet of (e) of FIG. 27 with respect to the second fixing portion of (e) of FIG. 27. More specifically, the two thermally conductive sheets 303 illustrated in the second fixing portion each extend in the direction from the back side to the front side of the paper sheet of (e) of FIG. 27. Further, between respective ends of the two thermally conductive sheets 303, which ends are formed by such extension of the two thermally conductive sheets 303, a bonding layer 305 can be provided. The fourth fixing portion, like the first fixing portion, can be arranged to include no bonding layer 305.

A fifth fixing portion (the fixing portion 310 above the thermally conductive sheet 303 illustrated in (b) of FIG. 27

(not illustrated in (e) of FIG. 27)) can be provided on the back side of the paper sheet of (e) of FIG. 27 with respect to the second fixing portion of (e) of FIG. 27. More specifically, the two thermally conductive sheets 303 illustrated in the second fixing portion each extend in a direction from the front side to the back side of the paper sheet of (e) of FIG. 27. Further, between respective ends of the two thermally conductive sheets 303, which ends are formed by such extension of the two thermally conductive sheets 303, a bonding layer 305 can be provided. The fifth fixing portion, like the first fixing portion, can be arranged to include no bonding layer 305.

Embodiment-4

(f) of FIG. 27 is another example of a cross sectional view taken along dotted line in the thermal transport structure illustrated in (b) of FIG. 27. In this case, both of the thermally conductive sheet 302 and the thermally conductive sheet 303 can be graphite composite sheets.

In a first fixing portion (the fixing portion 310 which is a right side portion of the thermally conductive sheet 302 illustrated in (b) of FIG. 27; in other words, the fixing portion 310 in a right-hand area of the paper sheet of (f) of FIG. 27), a thermally conductive sheet 302 is provided on another thermally conductive sheet 302. In the first fixing portion, these thermally conductive sheets 302 are kept in a state in which the thermally conductive sheets 302 are bonded to each other.

In a second fixing portion (the fixing portion 310 in the center of the thermally conductive sheet 302 illustrated in (b) of FIG. 27; in other words, the fixing portion 310 in the center of the paper sheet of (f) of FIG. 27), a thermally conductive sheet 302 is provided on a thermally conductive sheet 303. Further, on this thermally conductive sheet 303, another thermally conductive sheet 302 is provided.

In addition, on the another thermally conductive sheet 302, another thermally conductive sheet 303 is provided. In the second fixing portion, the thermally conductive sheets 302 and the thermally conductive sheets 303 are kept in a state in which the thermally conductive sheets 302 and the thermally conductive sheets 303 are bonded with one another.

A third fixing portion (the fixing portion 310 which is a left side portion of the thermally conductive sheet 302 illustrated in (b) of FIG. 27; in other words, the fixing portion 310 in a left-hand area of the paper sheet of (f) of FIG. 27) can be arranged like the first fixing portion.

A fourth fixing portion (the fixing portion 310 below the thermally conductive sheet 303 illustrated in (b) of FIG. 27 (not illustrated in (f) of FIG. 27)) can be provided on the front side of the paper sheet of (f) of FIG. 27 with respect to the second fixing portion of (f) of FIG. 27. More specifically, the two thermally conductive sheets 303 illustrated in the second fixing portion each extend in the direction from the back side to the front side of the paper sheet of (f) of FIG. 27. Further, respective ends of the two thermally conductive sheets 303, which ends are formed by such extension of the two thermally conductive sheets 303, are kept bonded to each other.

A fifth fixing portion (the fixing portion 310 above the thermally conductive sheet 303 illustrated in (b) of FIG. 27 (not illustrated in (f) of FIG. 27)) can be provided on the back side of the paper sheet of (f) of FIG. 27 with respect to the second fixing portion of (f) of FIG. 27. More specifically, the two thermally conductive sheets 303 illustrated in the second fixing portion each extend in the direction from the front side to the back side of the paper sheet of (f) of FIG. 27. Further, respective ends of the two thermally conductive sheets 303, which ends are formed by such extension of the two thermally conductive sheets 303, are kept bonded to each other.

It should be noted that as illustrated in each of (c) to (f) of FIG. 27, between fixing portions, a thermally conductive portion 311 is provided.

Though two thermally conductive sheet 302 and two thermally conductive sheets 303 are illustrated in each of (c) to (f) of FIG. 27, the number of thermally conductive sheets 302 and the number of thermally conductive sheets 303 are each not limited thereto.

With arrangements illustrated in FIG. 27, a degree of freedom of configurations of the fixing portions 310 is increased. This makes it possible not only to provide thermal transport structures each having a complex shape but also to improve heat transport capabilities.

EXAMPLES

Example A

<Evaluation of Heat Dissipation Property>

Figure 15:
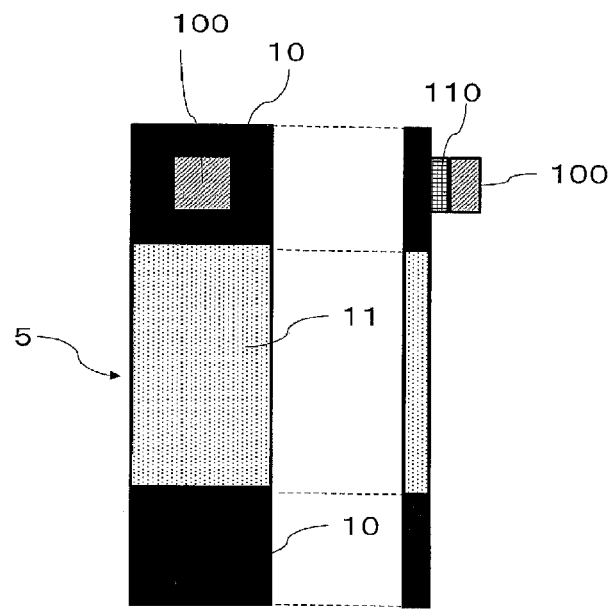
FIG. 15 is a view illustrating a heat dissipation property evaluation method in Examples of the present invention.

As illustrated in FIG. 15 (where a drawing provided on the left side of FIG. 15 illustrates a front view, and a drawing provided on the right side of FIG. 15 illustrates a side view), a micro ceramic heater 100 (MS-3) manufactured by Sakaguchi E.H VOC Corp. was placed in the center of one of fixing portions 10 of a thermal transport structure 5 via a λ GEL sheet 110 (COH-4000LVC) manufactured by Taica Corporation. Under the condition of a room temperature of 23° C., the heater 100 was caused to generate heat by application of 2.1 W to the heater 100, and a maximum temperature of the heater 100 was then measured through thermal image measurement. Evaluation was made as to a temperature of the heater 100 in a steady state after the passage of 1 hour following the initiation of application of a current to the heater. Further, the thermal image measurement was carried out on the heater 100 to which a black body spray (having an emissivity of 0.94) had been applied.

Comparison was made between a temperature T1 of the heater 100, which temperature had been measured in a situation where the thermal transport structure 5 had not been used, and a temperature T2 of the heater 100, which temperature had been measured in a situation where the thermal transport structure 5 had been used as illustrated in FIG. 15. Based on a temperature difference between T1 and T2, evaluation was made as to the amount of decrease in temperature of the heater 100 with use of a thermal transport structure. Specifically, the temperature difference between T1 and T2 means the amount of temperature decrease associated with the use of a thermal transport structure. A case where a value of the amount of temperature decrease was not less than 53° C. was rated as "A", a case where a value of the amount of temperature decrease was not less than 50° C. and less than 53° C. was rated as "B", a case where a value of the amount of temperature decrease was not less than 45° C. and less than 50° C. was rated as "C", a case where a value of the amount of temperature decrease was not less than 40° C. and less than 45° C. was rated as "D", and a case where a value of the amount of temperature decrease was less than 40° C. was rated as "E". The rating "A" represents the largest amount of temperature decrease, and a thermal transport structure having the amount of temperature decrease rated as "A" was determined to be excellent in heat dissipation property.

<Evaluation of Bendability>

Figure 16:
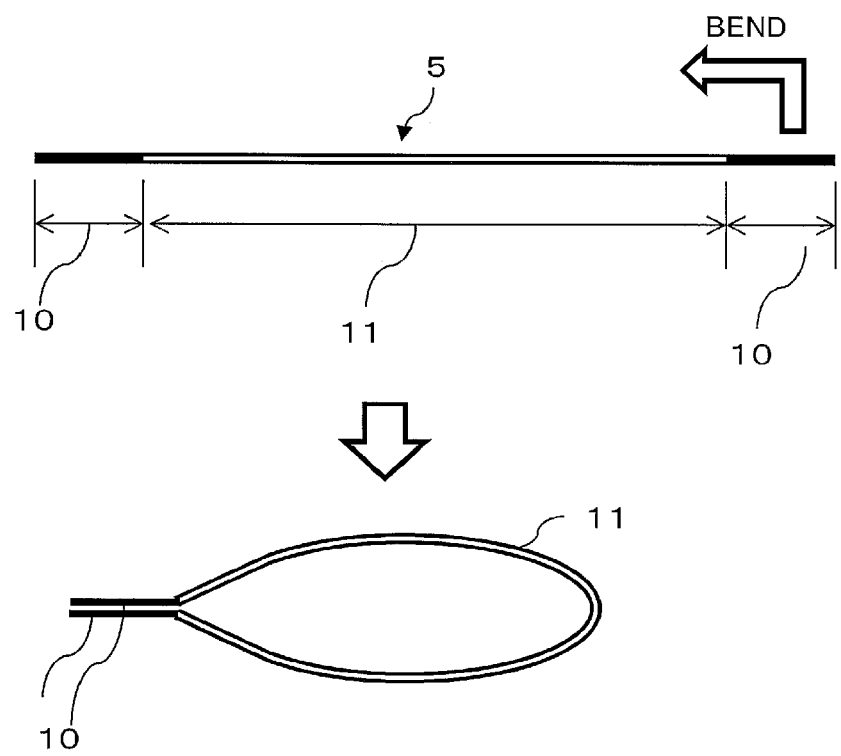
FIG. 16 is a view illustrating a bendability evaluation method in Examples of the present invention.

As illustrated in FIG. 16, an act of bending a thermal transport structure 5 with fixing portions 10 superposed on top of another and then returning the thermal transport structure 5 to its original straight state was repeated 1000 times. At this time, the thermal transport structure 5 was assessed by visual observation. A case where no damage occurred was rated as "A", a case where slight damage such as wrinkles occurred was rated as "B", a case where partial damage to the thermal transport structure 5, such as deformation, occurred was rated as "C", and a case where major damage including a break in the thermal transport structure 5 and peeling of the bonding layer occurred was rated as "D".

<Evaluation of Lightweight Property>

A weight of each thermal transport structure was measured. A case where the weight was less than 6.0 g was rated as "A", a case where the weight was not less than 6.0 g and less than 8.0 g was rated as "B", and a case where the weight was not less than 8.0 g was rated as "D".

<Evaluation of Powder Falling>

An extra-low-adhesion tape (PET75-RB105 manufactured by Nichiei Kakoh Co., Ltd.) was stuck to all externally exposed surfaces of each thermal transport structure (surfaces of the thermal transport structure, respective surfaces of graphite composite sheets in a thermally conductive portion, and outer peripheral edge surfaces). Thereafter, the tape was peeled off at a rate of 10 mm/min while the tape was held at an angle of 180 degrees. Then, the extra-low-adhesion tape was checked by visual observation for adhesion of graphite sheet powder onto the extra-low-adhesion tape. A case where no graphite sheet powder was adhered onto any portions of the tape which portions correspond to the surfaces of the thermal transport structure, the respective surfaces of graphite composite sheets in the thermally conductive portion, and the outer peripheral edge surfaces was rated as "A". A case where graphite sheet powder was adhered onto some portion of the tape which portion corresponds to any one type of the above-described surfaces was rated as "B". A case where graphite sheet powder was adhered onto some portion of the tape which portion corresponds to any two types of the above-described surfaces was rated as "C".

<Evaluation of Expansion in Vacuum>

Each thermal transport structure was placed in an environment where a temperature was 25° C. and pressure was reduced to 200 Pa (absolute pressure). A case where a thermal transport structure did not expand was rated as "A", and a case where a thermal transport structure expanded was rated as "B".

<Evaluation of State of Formation of Thermally Conductive Portion>

A case where a thermal transport structure had a bonded part between graphite composite sheets in a thermally conductive portion of 90 mm×30 mm (or 32 mm) in areas other than both ends (5 mm×30 mm (or 32 mm) each) of the thermally conductive portion on fixing portion sides was rated as "B". A case where a thermal transport structure did not have such a bonded part was rated as <Adhesion Force of Bonding Layer Before Bonding Step>

A first graphite sheet having a 0.05-mm-thick bonding layer used in Examples and Comparative Examples formed thereon was prepared. On this first graphite sheet, a second graphite sheet having no bonding layer formed thereon was stacked. A resulting product was lightly treated with a rubber roller, without undergoing a step of bonding through, for example, application of pressure, so that the graphite sheets and the bonding layer conformed to each other. Note that the bonding layer was formed on an entire area of one surface of the first graphite sheet, and the second graphite sheet was stacked on the first graphite sheet such that the bonding layer was arranged between the first graphite sheet and the second graphite sheet. The product thus prepared was cut to a piece having a size of 25 mm×100 mm. The cut piece was subjected to T-peeling at a width of 25 mm and at a rate of 100 mm/min, and an adhesion force of the cut piece was measured. A case where the adhesion force was not more than 0.1 N per 25 mm at 25° C. was rated as "A", and a case where the adhesion force was more than 0.1 N per 25 mm and not more than 1 N per 25 mm was rated as "B", and a case where the adhesion force was more than 1 N per 25 mm was rated as "C".

Example 1A

An arrangement of Example 1A is illustrated in FIG. 6. A coating of an acrylic adhesive G-2S (manufactured by Jujo Chemical Co., Ltd.), which served as a bonding layer 2, was applied to one surface of each graphite sheet (40 μm in thickness, 1500 W/(m·K) in thermal conductivity in a plane direction, and 5 W/(m·K) in thermal conductivity in a thickness direction) (manufactured by Kaneka Corporation), which served as a graphite sheet 1, so that the bonding layer 2 obtained after drying would have a thickness of 10 μm, and was dried. Application and drying of the coating were carried out as described below. As a result, the graphite sheet 1 having the bonding layer 2 formed thereon was obtained. The coating of the adhesive was applied to both lengthwise ends (30 mm×30 mm each) of the graphite sheet 1 having a size of 30 mm×150 mm. Similarly, a coating of an acrylic adhesive G-2S (manufactured by Jujo Chemical Co., Ltd.), which served as another bonding layer 2, was applied to one surface of each polyimide film (12.5 μm in thickness) (manufactured by Kaneka Corporation), which served as a protective layer 3, so that the bonding layer 2 obtained after drying would have a thickness of 10 μm. Then, the adhesive coating thus applied was dried to form the bonding layer 2 on the protective layer 3. Subsequently, each graphite sheet 1 having the bonding layer 2 formed thereon was stacked in six layers to obtain a multilayer body. Thereafter, on each of both outer surfaces of the multilayer body thus obtained, one polyimide film (protective layer 3) with the bonding layer 2 applied thereon was disposed. A resulting multilayer body was then bonded and laminated by thermal pressing. The thermal pressing was carried out at a pressure of 0.5 MPa at a temperature of 100° C. for 10 minutes. Finally, a resulting laminate was subjected to blanking with a die to obtain a 150 mm×30 mm thermal transport structure 5 having (i) a thermally conductive portion measuring 90 mm×30 mm and (ii) fixing portions each measuring 30 mm×30 mm (formed on respective both lengthwise ends of the thermal transport structure). Further, evaluation results are shown in Tables 1 and 2.

Comparative Example 1A

Comparative Example 1A is identical to Example 1A except that aluminum foils (40 μm in thickness, 200 W/(m·K) in thermal conductivity in a plane direction, and 200 W/(m·K) in thermal conductivity in a thickness direction) were used instead of the graphite sheets. Evaluation results are shown in Tables 1 and 2.

Comparative Example 2A

Comparative Example 2A is identical to Example 1A except that copper foils (40 μm in thickness, 398 W/(m·K) in thermal conductivity in a plane direction, and 398 W/(m·K) in thermal conductivity in a thickness direction) were used instead of the graphite sheets. Evaluation results are shown in Tables 1 and 2.

Comparative Example 3A

Figure 7:
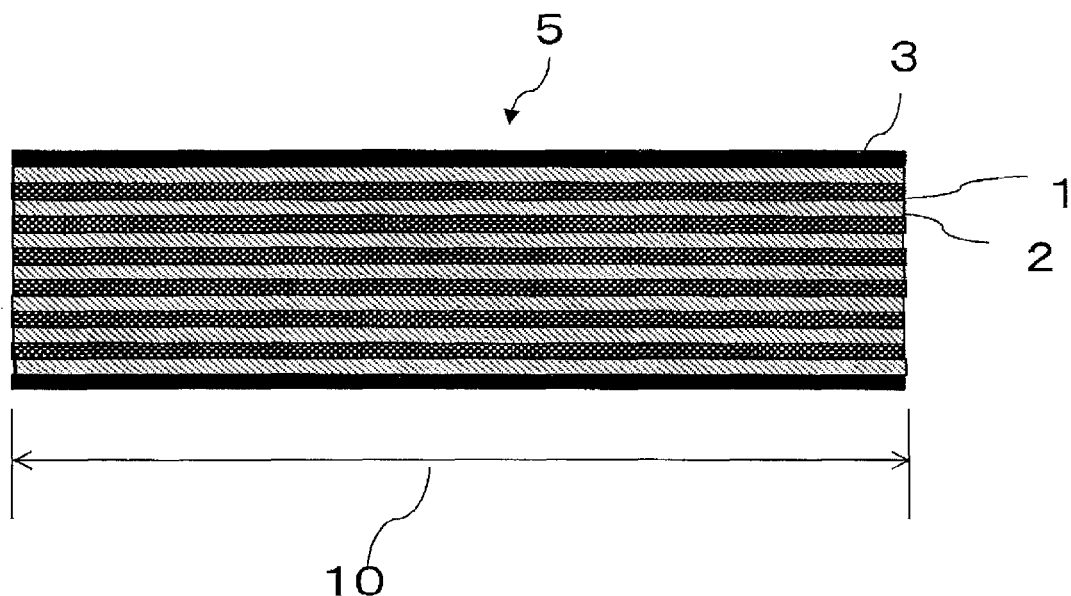
FIG. 7 is a cross sectional view of a thermal transport structure in accordance with a comparative example of the present invention.

An arrangement of Comparative Example 3A is illustrated in FIG. 7. Comparative Example 3A is identical to Example 1A except that a bonding layer 2 was formed on an entire area of one surface of a graphite sheet 1, a double-sided tape Neofix (5 μm in thickness) manufactured by Nichiei Kakoh Co., Ltd. was used as the bonding layer 2, and heating was not carried out during application of pressure. Evaluation results are shown in Tables 1 and 2.

Comparative Example 4A

Figure 8:
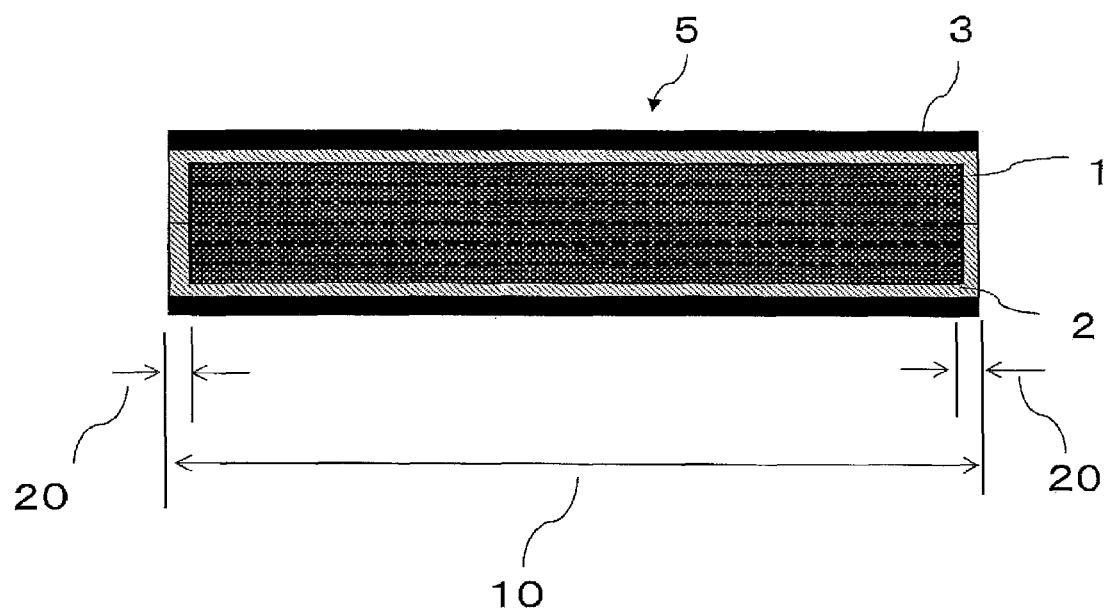
FIG. 8 is a cross sectional view of a thermal transport structure in accordance with a comparative example of the present invention.

An arrangement of Comparative Example 4A is illustrated in FIG. 8. Note that each dashed line represents an area in which graphite composite sheets are not bonded to each other. A thermal transport structure was formed in a manner similar to those of Examples, but no bonding layer 2 was formed between one graphite sheet 1 and another graphite sheet 1. During blanking with a die, a cut was made along an outer peripheral edge so that each graphite sheet was covered by the bonding layers 2 which had been formed on the respective polyimide films (protective layers 3). This produced a thermal transport structure 5 in which a thickness 20 of an outer-peripheral-edge covering part of the bonding layer 2 was 2 mm.

Evaluation results are shown in Tables 1 and 2.

TABLE 1

| | | | Arrangement of thermal transport structure | | | | | | |
|---|---|---|---|---|---|---|---|---|---|
| | | | Thermally conductive material | | | | Covering of both surfaces by bonding layers | Covering of outer peripheral edge by bonding layer | Fixing portion | |
| | FIG. | Type | Thermal Conductivity in plane direction W/(m · K) | Thickness μm | Number of stacked layers | | | | Type of bonding layer | Thickness of bonding layer μm |
| Example 1A | 6 | Graphite sheet | 1500 | 40 | 6 | Absent | Absent | Acryl | 10 |
| Comparative Example 1A | 6 | Aluminum | 200 | 40 | 6 | Absent | Absent | Acryl | 10 |
| Comparative Example 2A | 6 | Copper | 398 | 40 | 6 | Absent | Absent | Acryl | 10 |
| Comparative Example 3A | 7 | Graphite sheet | 1500 | 40 | 6 | Present | Absent | Acryl | 5 |
| Comparative Example 4A | 8 | Graphite sheet | 1500 | 40 | 6 | Absent | Present | Absent | — |

| | Arrangement of thermal transport structure | | | | | | | | |
|---|---|---|---|---|---|---|---|---|---|
| | Thermally conductive portion | | | | | | | | |
| | Every how many layers one unbonded layer of thermally conductive material is provided | Non-bonding film | | | | Protective layer | | Release film | |
| | | Number of non-bonding films in each gap between layers | Type | Thickness μm | Release treatment | Type | Thickness μm | Type | Thickness μm |
| Example 1A | Every one layer | Absent | — | — | — | Polyimide film | 12.5 | — | — |
| Comparative Example 1A | Every one layer | Absent | — | — | — | Polyimide film | 12.5 | — | — |
| Comparative Example 2A | Every one layer | Absent | — | — | — | Polyimide film | 12.5 | — | — |
| Comparative Example 3A | Every six layers (all layers bonded) | Absent | — | — | — | Polyimide film | 12.5 | — | — |
| Comparative Example 4A | Every one layer | Absent | — | — | — | Polyimide film | 12.5 | — | — |

TABLE 2

| | Evaluations | | | | | | | | | |
|---|---|---|---|---|---|---|---|---|---|---|
| | Heat dissipation property | | Bendability | | Lightweight property | | Powder falling | | | |
| | Amount of temperature decrease ° C. | Rating | Visible damage | Rating | Weight g | Rating | Surface(s) corresponding to a powder adhering portion(s) | Rating | | |
| Example 1A | 54.1 | A | No damage | A | 2.35 | A | Outer peripheral edge and non-bonding portion | C | | |
| Comparative Example 1A | 32.4 | E | No damage | A | 2.94 | A | Absent | A | | |
| Comparative Example 2A | 44.1 | D | A damage | No | 8.68 | D | Absent | A | | |
| Comparative Example 3A | 54.1 | A | Cracking | D | 2.97 | A | Outer peripheral edge | B | | |
| Comparative Example 4A | 44.6 | D | No damage | A | 2.24 | A | Outer peripheral edge | B | | |

| | Evaluations | | | |
|---|---|---|---|---|
| | Expansion in vacuum | State of formation of thermally conductive portion | Adhesion force | |
| | | | Adhesion force of bonding layer before bonding step N/25 mm | Rating |
| Example 1A | A | A | 0.01 | A |
| Comparative Example 1A | A | A | 0.01 | A |
| Comparative Example 2A | A | A | 0.01 | A |
| Comparative Example 3A | B | — | 1.2 | C |
| Comparative Example 4A | A | A | — | — |

Comparison between Example 1A and Comparative Example 3A shows that provision of the thermally conductive portion allows a thermal transport structure to have enhanced bendability while maintaining its heat dissipation property and lightweight property and to be used while being bent. This makes it possible to easily transfer heat from a heat source to a place where a temperature is lower and also makes it possible to enhance heat dissipation property. The thermal transport structure in Comparative Example 3A expanded in a vacuum since the thermal transport structure trapped air in the production process due to a high adhesion force of the bonding layer before undergoing the bonding step. Meanwhile, even in a case where the thermally conductive portion was provided, a thermal transport structure using an aluminum foil or a copper foil as a thermally conductive material, as in Comparative Example 1A or Comparative Example 2A, had greatly lowered heat dissipation property. Further, a thermal transport structure using a copper foil, as in Comparative Example 2A, had a greatly increased weight. When it comes to the aluminum foil in Comparative Example 1A, the number of stacked aluminum foils needs to be increased for a greater heat dissipation property. This leads to an increase in weight. In Comparative Example 4A, the graphite sheets are stacked on top of each other with no bonding layers provided therebetween. This achieved a good bendability but greatly decreased heat dissipation property. This is considered to have occurred because an increase in contact thermal resistance due to a slight amount of air present in each interface between the graphite sheets led to an unsuccessful transfer of heat from a heat source between one graphite sheet and another graphite sheet.

Example 2A

Figure 9:
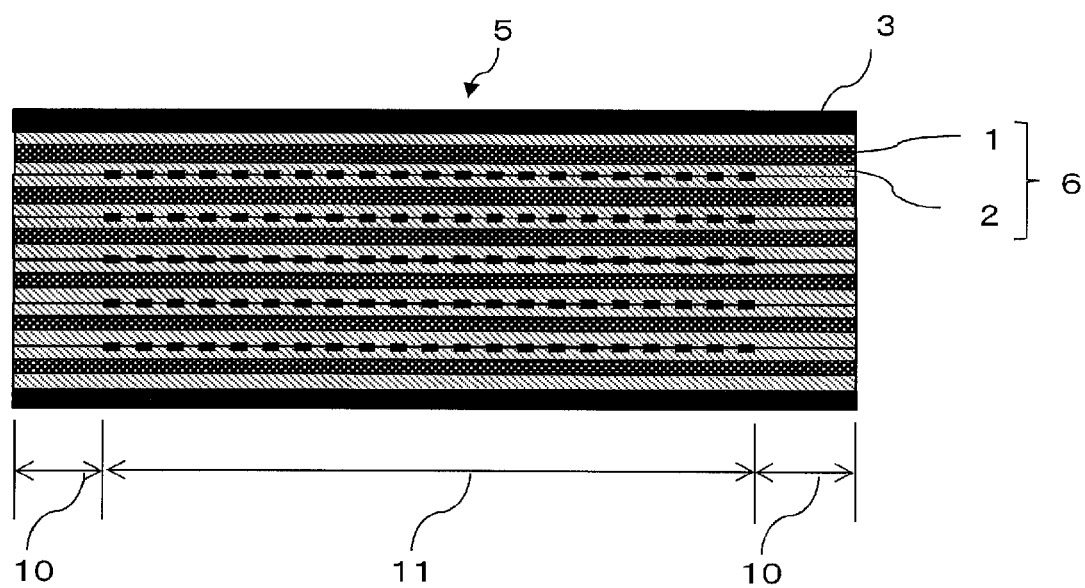
FIG. 9 is a cross sectional view of a thermal transport structure in accordance with an example of the present invention.

An arrangement of Example 2A is illustrated in FIG. 9. Note that each dashed line represents an area in which graphite composite sheets 6 are not bonded to each other. Both surfaces of each graphite sheet (40 µm in thickness, 1500 W/(m·K) in thermal conductivity in a plane direction, and 5 W/(m·K) in thermal conductivity in a thickness direction) (manufactured by Kaneka Corporation), which served as a graphite sheet 1, were laminated, at 100° C., with respective urethane adhesive sheets TSU0041SI (10 µm in thickness) (manufactured by Toyochem Co., Ltd.), which served as bonding layers 2. A resulting multilayer body was cut to a size of 30 mm×150 mm. This produced a graphite composite sheet 6 with both surfaces entirely covered by the bonding layers 2. Subsequently, each graphite composite sheet 6 was stacked in six layers to obtain a multilayer body. Thereafter, on each of both outer surfaces of the multilayer body thus obtained, one polyimide film (12.5 µm in thickness) (protective layer 3) (manufactured by Kaneka Corporation) was disposed. A resulting multilayer body was then bonded and laminated by thermal pressing. This produced a thermal transport structure 5. The thermal pressing was carried out such that a pressure of 0.5 MPa was applied at a temperature of 90° C. for 30 minutes, and then a pressure of 0.5 MPa was applied at a temperature of 150° C. for 60 minutes. In so doing, pressure was applied to only both lengthwise ends (30 mm×30 mm each) of each graphite composite sheet 6. Finally, the thermal transport structure 5 was subjected to blanking with a die to obtain a 30 mm×150 mm thermal transport structure 5 having (i) a thermally conductive portion measuring 90 mm×30 mm and (ii) fixing portions each measuring 30 mm×30 mm (formed on respective both lengthwise ends of the thermal transport structure). Evaluation results are shown in Tables 3 and 4.

Example 3A

Figure 10:
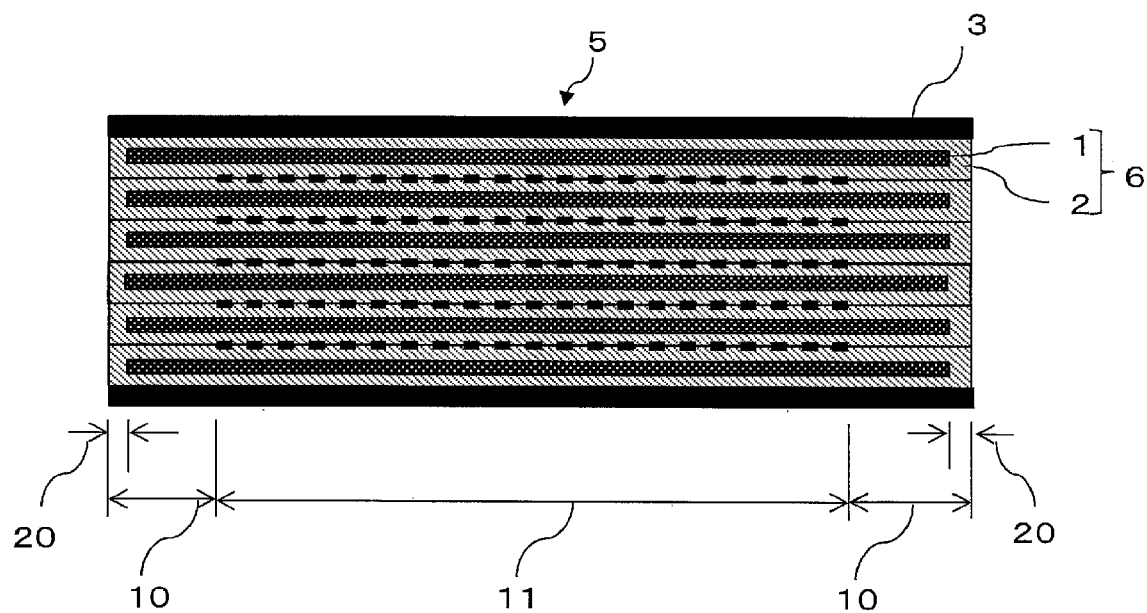
FIG. 10 is a cross sectional view of a thermal transport structure in accordance with an example of the present invention.

An arrangement of Example 3A is illustrated in FIG. 10. Note that each dashed line represents an area in which graphite composite sheets 6 are not bonded to each other. Each graphite sheet (40 μm in thickness, 1500 W/(m·K) in thermal conductivity in a plane direction, and 5 W/(m·K) in thermal conductivity in a thickness direction) (manufactured by Kaneka Corporation), which served as a graphite sheet 1, was cut to a size of 30 mm×150 mm.

Subsequently, both surfaces of the graphite sheet 1 were laminated, at 100° C., with respective urethane adhesive sheets TSU0041SI (10 μm in thickness) (manufactured by Toyochem Co., Ltd.), which served as bonding layers 2. Thereafter, a resulting multilayer body was cut to a size of 32 mm×152 mm. This produced a graphite composite sheet 6 with both surfaces entirely covered by the bonding layers 2 and with an outer peripheral edge entirely covered by the bonding layers 2. Subsequently, each graphite composite sheet 6 was stacked in six layers to obtain a multilayer body. Thereafter, on each of both outer surfaces of the multilayer body thus obtained, one polyimide film (12.5 μm in thickness) (protective layer 3) (manufactured by Kaneka Corporation) was disposed. A resulting multilayer body was then bonded and laminated by thermal pressing. This produced a thermal transport structure 5. The thermal pressing was carried out such that a pressure of 0.5 MPa was applied at a temperature of 90° C. for 30 minutes, and then a pressure of 0.5 MPa was applied at a temperature of 150° C. for 60 minutes. In so doing, pressure was applied to only both lengthwise ends (31 mm×32 mm each) of each graphite composite sheet 6. This produced a 32 mm×152 mm thermal transport structure 5 having (i) a thermally conductive portion measuring 90 mm×32 mm and (ii) fixing portions each measuring 31 mm×32 mm (formed on respective both lengthwise ends of the thermal transport structure), wherein a thickness 20 of an outer-peripheral-edge covering part of the bonding layer 2 was 1 mm. Evaluation results are shown in Tables 3 and 4.

Example 4A

Figure 11:
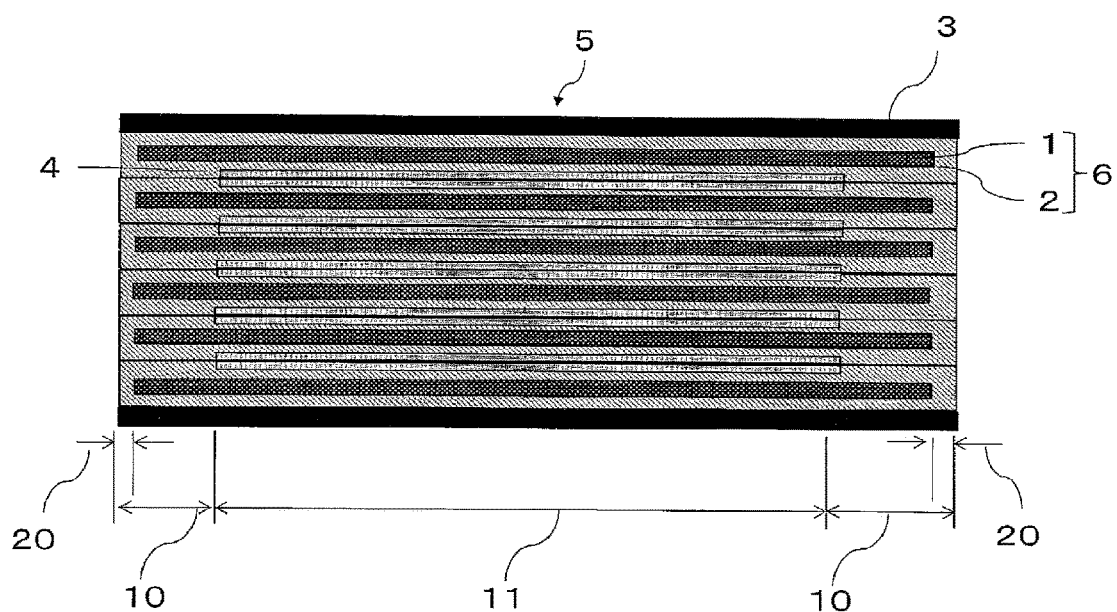
FIG. 11 is a cross sectional view of a thermal transport structure in accordance with an example of the present invention.
Figure 12:
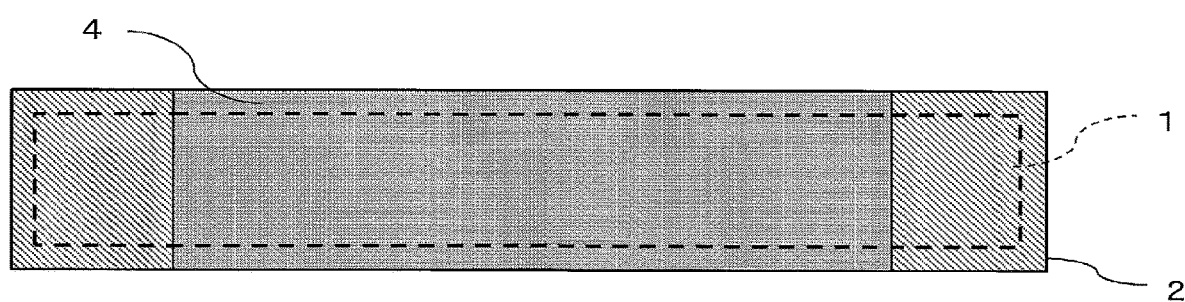
FIG. 12 is a view illustrating an arrangement of materials in a case where the thermal transport structure in accordance with the example of the present invention is viewed from above.

An arrangement of Example 4A is illustrated in FIGS. 11 and 12. Each graphite sheet (40 μm in thickness, 1500 W/(m·K) in thermal conductivity in a plane direction, and 5 W/(m·K) in thermal conductivity in a thickness direction) (manufactured by Kaneka Corporation), which served as a graphite sheet 1, was cut to a size of 30 mm×150 mm. Subsequently, both surfaces of the graphite sheet 1 were laminated, at 100° C., with respective urethane adhesive sheets TSU0041SI (10 μm in thickness) (manufactured by Toyochem Co., Ltd.), which served as bonding layers 2. Thereafter, a resulting multilayer body was cut to a size of 32 mm×152 mm. This produced a graphite composite sheet 6 with both surfaces entirely covered by the bonding layers 2 and with an outer peripheral edge entirely covered by the bonding layers 2. Subsequently, each graphite composite sheet 6 was stacked in six layers. Thereafter, two 90 mm×50 mm polyimide films (12.5 μm in thickness) (manufactured by Kaneka Corporation), which served as non-bonding layers 4, were disposed in the middle of each gap between the graphite composite sheets 6. Further, polyimide films (12.5 μm in thickness) (protective layer 3) (manufactured by Kaneka Corporation) were disposed on respective outermost graphite composite sheets 6. A resulting multilayer body was then bonded and laminated by thermal pressing. This produced a thermal transport structure. Note that, in FIG. 12, the graphite sheet 1 is represented by a dashed line, the bonding layer 2 is represented by a solid line around the dashed line, and the non-bonding layer 4 is represented by an area shown in gray color.

The thermal pressing was carried out such that a pressure of 0.5 MPa was applied at a temperature of 90° C. for 30 minutes, and then a pressure of 0.5 MPa was applied at a temperature of 150° C. for 60 minutes. In so doing, pressure was applied to all faces of each graphite composite sheet 6. Finally, the thermal transport structure was subjected to blanking with a die to obtain a 32 mm×152 mm thermal transport structure 5 having (i) a thermally conductive portion measuring 90 mm×32 mm and (ii) fixing portions each measuring 31 mm×32 mm (formed on respective both lengthwise ends of the thermal transport structure), wherein a thickness 20 of an outer-peripheral-edge covering part of the bonding layer 2 was 1 mm. Evaluation results are shown in Tables 3 and 4.

Example 5A

An arrangement of Example 5A is illustrated in FIG. 13. A coating of an acrylic adhesive G-2S (manufactured by Jujo Chemical Co., Ltd.), which served as a bonding layer 2, was applied to one surface of each graphite sheet (40 μm in thickness, 1500 W/(m·K) in thermal conductivity in a plane direction, and 5 W/(m·K) in thermal conductivity in a thickness direction) (manufactured by Kaneka Corporation), which served as a graphite sheet 1, so that the bonding layer 2 obtained after drying would have a thickness of 10 μm, and was dried. Application and drying of the coating were carried out as described below. As a result, the graphite sheet 1 having the bonding layer 2 formed thereon was obtained. The coating of the adhesive was applied to both lengthwise ends (30 mm×30 mm each) of the graphite sheet 1 having a size of 30 mm×150 mm. Similarly, a coating of an acrylic adhesive G-2S (manufactured by Jujo Chemical Co., Ltd.), which served as another bonding layer 2, was applied to an entire area of one surface of each polyimide film (12.5 μm in thickness) (manufactured by Kaneka Corporation), which served as a protective layer 3, so that the bonding layer 2 obtained after drying would have a thickness of 10 μm. A resulting product was cut to a size of 40 mm×170 mm. Then, the adhesive coating thus applied was dried to form the bonding layer 2 on the protective layer 3. Subsequently, each graphite sheet 1 having the bonding layer 2 formed thereon was stacked in six layers to obtain a multilayer body. Thereafter, on each of both outer surfaces of the multilayer body thus obtained, one polyimide film (12.5 μm in thickness) (protective layer 3) (manufactured by Kaneka Corporation) with the adhesive applied thereon was disposed. A resulting multilayer body was then bonded and laminated by thermal pressing. This produced a thermal transport structure. The thermal pressing was carried out at a pressure of 0.5 MPa at a temperature of 100° C. for 10 minutes. Finally, the thermal transport structure was subjected to blanking with a die to obtain a 32 mm×152 mm thermal transport structure 5 having (i) a thermally conductive portion measuring 90 mm×32 mm and (ii) fixing portions each measuring 31 mm×32 mm (formed on respective both lengthwise ends of the thermal transport structure), wherein a thickness 20 of an outer-peripheral-edge covering part of the bonding layer 2 was 1 mm. Evaluation results are shown in Tables 3 and 4.

TABLE 3

| | | | Arrangement of thermal transport structure | | | | | | |
|---|---|---|---|---|---|---|---|---|---|
| | | | Thermally conductive material | | | | | Fixing portion | |
| | | | | | | Covering of both | Covering of outer peripheral | | |
| | | | Thermal Conductivity in plane | | Number of stacked | surfaces by bonding | edge by bonding | Type of bonding | Thickness of bonding |
| | FIG. | Type | direction | Thickness | layers | layer | layer | layer | layer |
| Example 1A | 6 | Graphite sheet | 1500 | 40 | 6 | Absent | Absent | Acryl | 10 |
| Example 2A | 9 | Graphite sheet | 1500 | 40 | 6 | Present | Absent | Urethane | 10 |
| Example 3A | 10 | Graphite sheet | 1500 | 40 | 6 | Present | Present | Urethane | 10 |
| Example 4A | 11 | Graphite sheet | 1500 | 40 | 6 | Present | Present | Urethane | 10 |
| Example 5A | 13 | Graphite sheet | 1500 | 40 | 6 | Absent | Absent | Acryl | 10 |

| | Arrangement of thermal transport structure | | | | | | | |
|---|---|---|---|---|---|---|---|---|
| | Thermally conductive portion | | | | | | | |
| | Every how many layers one unbonded layer of thermally conductive material is provided | Non-bonding film | | | | Protective layer | | Release film |
| | | Number of non-bonding films in each gap between layers | Type | Thickness | Release treatment | Type | Thickness | Type | Thickness |
| Example 1A | Every one layer | Absent | — | — | — | Polyimide film | 12.5 | — | — |
| Example 2A | Every one layer | Absent | — | — | — | Polyimide film | 12.5 | — | — |
| Example 3A | Every one layer | Absent | — | — | — | Polyimide film | 12.5 | — | — |
| Example 4A | Every one layer | 2 | Polyimide film | 12.5 | Not treated | Polyimide film | 12.5 | — | — |
| Example 5A | Every one layer | Absent | — | — | — | Polyimide film | 12.5 | — | — |

TABLE 4

| | Evaluations | | | | | | | |
|---|---|---|---|---|---|---|---|---|
| | Heat dissipation property | | Bendability | | Lightweight property | | Powder falling | |
| | Amount of temperature decrease | Rating | Visible damage | Rating | Weight | Rating | Surface(s) corresponding to a powder adhering portion(s) | Rating |
| Example 1A | 54.1 | A | No damage | A | 2.35 | A | Outer peripheral edge and non-bonding portion | C |
| Example 2A | 54.1 | A | No damage | A | 2.84 | A | Outer peripheral edge | B |
| Example 3A | 54.1 | A | No damage | A | 2.92 | A | Absent | A |
| Example 4A | 54.1 | A | Wrinkling | B | 3.44 | A | Absent | A |
| Example 5A | 54.1 | A | No damage | A | 2.39 | A | Absent | A |

TABLE 4-continued

| | Evaluations | | | |
|---|---|---|---|---|
| | | State of formation | Adhesion force | |
| | Expansion | of thermally | Adhesion force of bonding layer before | |
| | in vacuum | conductive portion | bonding step | Rating |
| Example 1A | A | A | 0.02 | A |
| Example 2A | A | B | 0.15 | B |
| Example 3A | A | B | 0.15 | B |
| Example 4A | A | A | 0.15 | B |
| Example 5A | B | B | 0.02 | A |

In Example 2A, both surfaces of each graphite sheet 1 were covered by the respective bonding layers 2. As a result, Example 2A achieved reduction of powder falling in comparison with Example 1 in which only areas corresponding to the fixing portions 10 were covered by the bonding layers 2. Powder emanating from the graphite sheet 1 may cause a short circuit when the graphite sheet is used in an electronic device, because the powder is electrically conductive. By preventing this powder falling, it is possible to provide an electronic device of higher reliability. Meanwhile, in Example 3A, the bonding layers 2 were so formed as to be larger in size than the graphite sheets 1, so that the outer peripheral edges of the graphite sheets 1 were covered by the bonding layers 2. This arrangement led to a structure in which the graphite sheets 1 were completely covered by the bonding layers 2 and thus eliminated the occurrence of powder falling. Furthermore, in Example 4A, the non-bonding layers 4 were provided in an area corresponding to the thermally conductive portion 11 in bonding and laminating the graphite composite sheets 6. This arrangement allowed the bonding layers 2 in the thermally conductive portion 11 to be prevented from being partially bonded and thus allowed the fixing portions 10 to be formed with greater accuracy. In contrast, the structure in Example 5A is such that the thermal transport structure 5 produced in Example 1A was entirely covered by the bonding layers 2. In Example 5A, air in the thermal transport structure expanded under a vacuum condition, but no powder falling occurred.

Example 6A

Example 6A is identical to Example 4 except that a 7-μm-thick polyimide film was used as the non-bonding layer 4 to be disposed in each gap between the graphite composite sheets 6. An arrangement of Example 6A is illustrated in FIGS. 11 and 12. Further, evaluation results are shown in Tables 5 and 6.

Example 7A

Example 7A is identical to Example 4A except that a polyethylene terephthalate (PET) film (5 μm in thickness) was used as the non-bonding layer 4 to be disposed in each gap between the graphite composite sheets 6. An arrangement of Example 7A is illustrated in FIGS. 11 and 12. Further, evaluation results are shown in Tables 5 and 6.

Example 8A

Example 8A is identical to Example 4A except that polyimide films (12.5 μm in thickness) which had a release layer formed thereon by undergoing release treatment through application of a silicone release agent to one surface of each of the polyimide films were used as the non-bonding layers 4, and each one of the polyimide films was disposed in each gap between the graphite composite sheets 6. Further, evaluation results are shown in Tables 5 and 6.

TABLE 5

| | Arrangement of thermal transport structure | | | | | | | | |
|---|---|---|---|---|---|---|---|---|---|
| | | Thermally conductive material | | | | Covering of both | Covering of outer | Fixing portion | |
| | | | Thermal | | | surfaces by | peripheral edge | Type of | Thickness of |
| | | | Conductivity | | Number of | bonding | by bonding | bonding | bonding |
| | FIG. | Type | in plane direction | Thickness | stacked layers | layers | layer | layer | layer |
| Example 4A | 11 | Graphite sheet | 1500 | 40 | 6 | Present | Present | Urethane | 10 |
| Example 6A | 11 | Graphite sheet | 1500 | 40 | 6 | Present | Present | Urethane | 10 |
| Example 7A | 11 | Graphite sheet | 1500 | 40 | 6 | Present | Present | Urethane | 10 |
| Example 8A | NA | Graphite sheet | 1500 | 40 | 6 | Present | Present | Urethane | 10 |

TABLE 5-continued

| | Arrangement of thermal transport structure | | | | | | | | |
|---|---|---|---|---|---|---|---|---|---|
| | Thermally conductive portion | | | | | | | | |
| | Every how many | Non-bonding film | | | | Protective layer | | Release film | |
| | layers one unbonded layer of thermally conductive material is provided | Number of non-bonding films in each gap between layers | Type | Thickness | Release treatment | Type | Thickness | Type | Thickness |
| Example 4A | Every one layer | 2 | Polyimide film | 12.5 | Not treated | Polyimide film | 12.5 | — | — |
| Example 6A | Every one layer | 2 | Polyimide film | 7 | Not treated | Polyimide film | 12.5 | — | — |
| Example 7A | Every one layer | 2 | PET film | 5 | Not treated | Polyimide film | 12.5 | — | — |
| Example 8A | Every one layer | 1 | Polyimide film | 12.5 | Treated | Polyimide film | 12.5 | — | — |

TABLE 6

| | Evaluations | | | | | | | |
|---|---|---|---|---|---|---|---|---|
| | Heat dissipation property | Bendability | | | | Powder falling | | |
| | Amount of temperature decrease | Rating | Visible damage | Rating | Lightweight property | | Surface(s) corresponding to a powder adhering portion(s) | Rating |
| | | | | | Weight | Rating | | |
| Example 4A | 54.1 | A | Wrinkling | B | 3.44 | A | Absent | A |
| Example 6A | 54.1 | A | No damage | A | 3.21 | A | Absent | A |
| Example 7A | 54.1 | A | No damage | A | 3.12 | A | Absent | A |
| Example 8A | 54.1 | A | No damage | A | 3.18 | A | Absent | A |

| | Evaluations | | | |
|---|---|---|---|---|
| | | | Adhesion force | |
| | Expansion in vacuum | State of formation of thermally conductive portion | Adhesion force of bonding layer before bonding step | Rating |
| Example 4A | A | A | 0.15 | B |
| Example 6A | A | A | 0.15 | B |
| Example 7A | A | A | 0.15 | B |
| Example 8A | A | A | 0.15 | B |

Comparison between Example 4A, in which the 12.5-μm-thick polyimide film was used as the non-bonding layer 4, and Example 6A, in which the 7-μm-thick polyimide film was used as the non-bonding layer 4, shows that a thermal transport structure using a film having a smaller thickness as the non-bonding layer 4 achieves good bendability. Further, a thermal transport structure using a 5-μm-thick PET film, which had a much smaller thickness, as in Example 7A also exhibited good bendability. In contrast, in Example 8A, the release layer was formed on one surface of each non-bonding layer 4. This arrangement allowed bonding of the graphite composite sheets in the thermally conductive portion to be prevented by using one non-bonding layer 4 in each gap between the graphite composite sheets. The arrangement in Example 8A also achieved better bendability in comparison with the arrangement in Example 4A in which two non-bonding layers 4 were provided in each gap between the graphite composite sheets.

Example 9A

Example 9A is identical to Example 7A except that polyethylene terephthalate (PET) films (5 μm in thickness) as the non-bonding layers 4 were disposed for every two graphite composite sheets 6. An arrangement of Example 9A is illustrated in FIG. 14. Further, evaluation results are shown in Tables 7 and 8.

Example 10A

Example 10A is identical to Example 7A except that a 25-μm-thick graphite sheet was used as the graphite sheet 1, and ten graphite composite sheets 6 were stacked on top of each other. Further, evaluation results are shown in Tables 7 and 8.

Example 11A

Example 11A is identical to Example 7A except that a 10-μm-thick graphite sheet was used as the graphite sheet 1, and 24 graphite composite sheets 6 were stacked on top of each other. Further, evaluation results are shown in Tables 7 and 8.

TABLE 7

| | | | Arrangement of thermal transport structure | | | | | |
| --- | --- | --- | --- | --- | --- | --- | --- | --- |
| | | | Thermally conductive material | | | | Fixing portion | |
| | | | Thermal | | | Covering of both | Covering of outer | Type of | Thickness of |
| | | | Conductivity | | Number of | surfaces by | peripheral edge | bonding | bonding |
| | | | in plane | | stacked | bonding | by bonding | layer | layer |
| | FIG. | Type | direction | Thickness | layers | layers | layer | | |
| Example 9A | 14 | Graphite sheet | 1500 | 40 | 6 | Present | Present | Urethane | 10 |
| Example 7A | 11 | Graphite sheet | 1500 | 40 | 6 | Present | Present | Urethane | 10 |
| Example 10A | NA | Graphite sheet | 1500 | 25 | 10 | Present | Present | Urethane | 10 |
| Example 11A | NA | Graphite sheet | 1500 | 10 | 24 | Present | Present | Urethane | 10 |

| | Arrangement of thermal transport structure | | | | | | | |
| --- | --- | --- | --- | --- | --- | --- | --- | --- |
| | Thermally conductive portion | | | | | | | |
| | Every how many | Non-bonding film | | | | | | |
| | layers one unbonded layer of thermally conductive material is provided | Number of non-bonding films in each gap between layers | Type | Thickness | Release treatment | Protective layer | | Release film | |
| | | | | | | Type | Thickness | Type | Thickness |
| Example 9A | Every two sheets | 2 | PET film | 5 | Not treated | Polyimide film | 12.5 | — | — |
| Example 7A | Every one sheet | 2 | PET film | 5 | Not treated | Polyimide film | 12.5 | — | — |
| Example 10A | Every one sheet | 2 | PET film | 5 | Not treated | Polyimide film | 12.5 | — | — |
| Example 11A | Every one sheet | 2 | PET film | 5 | Not Treated | Polyimide film | 12.5 | — | — |

TABLE 8

| | Evaluations | | | | | | | | |
| --- | --- | --- | --- | --- | --- | --- | --- | --- | --- |
| | Heat dissipation property | | Bendability | | | | Powder falling | | |
| | Amount of temperature decrease | Rating | Visible damage | Rating | Lightweight property | | Surface(s) corresponding to a powder adhering portion(s) | Rating | |
| | | | | | Weight | Rating | | | |
| Example 9A | 54.1 | A | Deformation | C | 3.12 | A | Absent | A | |
| Example 7A | 54.1 | A | No damage | A | 3.12 | A | Absent | A | |
| Example 10A | 52.5 | B | No damage | A | 3.97 | A | Absent | A | |
| Example 11A | 49.7 | C | Slight wrinkling | B | 6.60 | B | Absent | A | |

| | Evaluations | | | |
| --- | --- | --- | --- | --- |
| | | | Adhesion force | |
| | Expansion in vacuum | State of formation of thermally conductive portion | Adhesion force of bonding layer before bonding step | Rating |
| Example 9A | A | A | 0.15 | B |
| Example 7A | A | A | 0.15 | B |

TABLE 8-continued

| | | | | |
|---|---|---|---|---|
| Example 10A | A | A | 0.15 | B |
| Example 11A | A | A | 0.15 | B |

Example 9A employed the arrangement in which one graphite composite sheet 6 for every two graphite composite sheets 6 was unbonded. As a result, Example 7A, in which every one graphite composite sheet 6 was unbonded, exhibited better bendability. From this, decreasing the number of graphite composite sheets to be bonded to another graphite composite sheet in the thermally conductive portion 11 is found to be a better choice. Meanwhile, Examples 10A and 11A used 25-μm-thick graphite sheets 1 and 10-μm-thick graphite sheets 1, respectively, and also adjusted the number of stacked graphite sheets such that a total thickness of the stacked graphite sheets 1 in Examples 10A and 11A would be substantially equal to a total thickness of the stacked graphite sheets 1 in Example 7A. As a result, through a total thickness of the stacked graphite sheets 1 was equal, a larger number of stacked graphite sheets as in Example 10A and Example 11A decreased a heat dissipation property. This is considered to occur because an increase in number of bonding layers having a low thermal conductivity makes it difficult to transfer heat from a heat source between one graphite sheet 1 and another graphite sheet 1. Example 11A, which had an increased number of stacked graphite sheets, was a little lower in not only bendability but also lightweight property. From these results, it is found to be a better choice that the thickness of the graphite sheet 1 is not too small.

Example 12A

Example 12A is identical to Example 7A except that a 20-μm-thick urethane adhesive sheet was used as the bonding layer 2. An arrangement of Example 12A is illustrated in FIGS. 11 and 12. Further, evaluation results are shown in Tables 9 and 10.

Example 13A

Example 13A is identical to Example 7A except that a 10-μm-thick epoxy adhesive sheet was used as the bonding layer 2. An arrangement of Example 13A is illustrated in FIGS. 11 and 12. Further, evaluation results are shown in Tables 9 and 10.

TABLE 9

| | Arrangement of thermal transport structure | | | | | | | |
|---|---|---|---|---|---|---|---|---|
| | Thermally conductive material | | | | | | Fixing portion | |
| | | | Thermal | | | Covering of both | Covering of outer | | |
| | FIG. | Type | Conductivity in plane direction | Thickness | Number of stacked layers | surfaces by bonding layers | peripheral edge by bonding layer | Type of bonding layer | Thickness of bonding layer |
| Example 7A | 11 | Graphite sheet | 1500 | 40 | 6 | Present | Present | Urethane | 10 |
| Example 12A | 11 | Graphite sheet | 1500 | 40 | 6 | Present | Present | Urethane | 20 |
| Example 13A | 11 | Graphite sheet | 1500 | 40 | 6 | Present | Present | Epoxy | 10 |

| | Arrangement of thermal transport structure | | | | | | | |
|---|---|---|---|---|---|---|---|---|
| | Thermally conductive portion | | | | | | | |
| | Every how many layers one unbonded layer of thermally conductive material is provided | Non-bonding film | | | | | | |
| | | Number of non-bonding films in each gap between layers | Type | Thickness | Release treatment | Protective layer | | Release film | |
| | | | | | | Type | Thickness | Type | Thickness |
| Example 7A | Every one layer | 2 | PET film | 5 | Not treated | Polyimide film | 12.5 | — | — |
| Example 12A | Every one layer | 2 | PET film | 5 | Not treated | Polyimide film | 12.5 | — | — |
| Example 13A | Every one layer | 2 | PET film | 5 | Not treated | Polyimide film | 12.5 | — | — |

TABLE 10

| | Evaluations | | | | | | | |
|---|---|---|---|---|---|---|---|---|
| | Heat dissipation property | | | | | Powder falling | | |
| | Amount of temperature decrease | Rating | Bendability | | Lightweight property | | Surface(s) corresponding to a powder adhering portion(s) | Rating |
| | | | Visible damage | Rating | Weight | Rating | | |
| Example 7A | 54.1 | A | No damage | A | 3.12 | A | Absent | A |
| Example 12A | 52.2 | B | Wrinkling | B | 3.97 | A | Absent | A |
| Example 13A | 54.1 | A | No damage | A | 3.12 | A | Absent | A |

| | Evaluations | | | |
|---|---|---|---|---|
| | | | Adhesion force | |
| | Expansion in vacuum | State of formation of thermally conductive portion | Adhesion force of bonding layer before bonding step | Rating |
| Example 7A | A | B | 0.15 | B |
| Example 12A | A | B | 0.15 | B |
| Example 13A | A | A | 0.03 | A |

Comparison between Example 7A, in which the bonding layer 2 had a thickness of 10 μm, and Example 12A in which the bonding layer 2 had a thickness of 20 μm, shows that the use of the bonding layer 2 having a smaller thickness provides a better heat dissipation property and a better bendability. Example 13A, which used an epoxy adhesive as the bonding layer 2, showed a result equivalent to Example 7A in which an urethane adhesive was used.

Example 14A

Example 14A is identical to Example 7A except that a polyethylene terephthalate (PET) film (5 μm) was used as the protective layer 3 disposed on both outermost graphite composite sheets. An arrangement of Example 14A is illustrated in FIG. 11. Further, evaluation results are shown in Tables 11 and 12.

TABLE 11

| | Arrangement of thermal transport structure | | | | | | | | |
|---|---|---|---|---|---|---|---|---|---|
| | Thermally conductive material | | | | | | | Fixing portion | |
| | FIG. | Type | Thermal Conductivity in plane direction | Thickness | Number of stacked layers | Covering of both surfaces by bonding layers | Covering of outer peripheral edge by bonding layer | Type of bonding layer | Thickness of bonding layer |
| Example 7A | 11 | Graphite sheet | 1500 | 40 | 6 | Present | Present | Urethane | 10 |
| Example 14A | 11 | Graphite sheet | 1500 | 40 | 6 | Present | Present | Urethane | 10 |

| | Arrangement of thermal transport structure | | | | | | | |
|---|---|---|---|---|---|---|---|---|
| | Thermally conductive portion | | | | | | | |
| | Every how many layers one unbonded layer of thermally conductive material is provided | Non-bonding film | | | | Protective layer | | Release film |
| | | Number of non-bonding films in each gap between layers | Type | Thickness | Release treatment | Type | Thickness | Type | Thickness |
| Example 7A | Every one layer | 2 | PET film | 5 | Not treated | Polyimide film | 12.5 | — | — |
| Example 14A | Every one layer | 2 | PET film | 5 | Not treated | PET film | 5 | — | — |

TABLE 12

| | Evaluations | | | | | | |
|---|---|---|---|---|---|---|---|
| | Heat dissipation property | | | | | Powder falling | |
| | Amount of temperature decrease | Rating | Bendability | | Lightweight property | | Surface(s) corresponding to a powder adhering portion(s) | Rating |
| | | | Visible damage | Rating | Weight | Rating | | |
| Example 7A | 54.1 | A | No damage | A | 3.12 | A | Absent | A |
| Example 14A | 54.3 | A | No damage | A | 3.01 | A | Absent | A |

| | Evaluations | | | |
|---|---|---|---|---|
| | Expansion in vacuum | State of formation of thermally conductive portion | Adhesion force | |
| | | | Adhesion force of bonding layer before bonding step | Rating |
| Example 7A | A | A | 0.15 | B |
| Example 14A | A | A | 0.15 | B |

Example 14A, which used a PET film (5 μm) as the protective layer 3, showed a result equivalent to a case where a polyimide film (12.5 μm) was used as the protective layer 3.

Example 15A

An arrangement of Example 15A is illustrated in FIG. 10. Note that each dashed line represents an area in which graphite composite sheets 6 are not bonded to each other.

Each graphite sheet (40 μm in thickness, 1500 W/(m·K) in thermal conductivity in a plane direction, and 5 W/(m·K) in thermal conductivity in a thickness direction) (manufactured by Kaneka Corporation), which served as a graphite sheet 1, was cut to a size of 30 mm×150 mm.

Subsequently, both surfaces of the graphite sheet 1 were laminated, at 100° C., with respective urethane adhesive sheets TSU0041SI (10 μm in thickness) (manufactured by Toyochem Co., Ltd.), which served as bonding layers 2. Thereafter, a resulting multilayer body was cut to a size of 32 mm×152 mm. This produced a graphite composite sheet 6 with both surfaces entirely covered by the bonding layers and with an outer peripheral edge entirely covered by the bonding layers. Subsequently, each graphite composite sheet 6 was stacked in six layers to obtain a multilayer body. Thereafter, on each of both outer surfaces of the multilayer body thus obtained, one polyimide film which served as a protective layer 3 was disposed. A resulting multilayer body was then bonded and laminated by thermal pressing. This produced a thermal transport structure 5. Note that in order to form a thermally conductive portion 11, 90 mm×50 mm Teflon (registered trademark) sheets (20 μm in thickness) which served as release layers were each disposed in the middle of each gap between the graphite composite sheets 6. The thermal pressing was carried out such that a pressure of 0.5 MPa was applied at a temperature of 90° C. for 30 minutes, and then a pressure of 0.5 MPa was applied at a temperature of 150° C. for 60 minutes. In so doing, pressure was applied to only both lengthwise ends (31 mm×32 mm each) of each graphite composite sheet 6. Thereafter, the Teflon (registered trademark) sheets were removed. Finally, the thermal transport structure was subjected to blanking with a die to obtain a 32 mm×152 mm thermal transport structure 5 having (i) a thermally conductive portion measuring 90 mm×32 mm and (ii) fixing portions each measuring 31 mm×32 mm (formed on respective both lengthwise ends of the thermal transport structure), wherein a thickness 20 of an outer-peripheral-edge covering part of the bonding layer 2 was 1 mm. Further, evaluation results are shown in Tables 13 and 14.

TABLE 13

| | | Arrangement of thermal transport structure | | | | | | |
|---|---|---|---|---|---|---|---|---|
| | | Thermally conductive material | | | | | Fixing portion | |
| | FIG. | Type | Thermal Conductivity in plane direction | Thickness | Number of stacked layers | Covering of both surfaces by bonding layers | Covering of outer peripheral edge by bonding layer | Type of bonding layer | Thickness of bonding layer |
| Example 3A | 10 | Graphite sheet | 1500 | 40 | 6 | Present | Present | Urethane | 10 |
| Example 15A | 10 | Graphite sheet | 1500 | 40 | 6 | Present | Present | Urethane | 10 |

TABLE 13-continued

| | Arrangement of thermal transport structure | | | | | | | | |
|---|---|---|---|---|---|---|---|---|---|
| | Thermally conductive portion | | | | | | | | |
| | Every how many | Non-bonding film | | | | | | | |
| | layers one unbonded layer of thermally conductive material is provided | Number of non-bonding films in each gap between layers | Type | Thickness | Release treatment | Protective layer | | Release film | |
| | | | | | | Type | Thickness | Type | Thickness |
| Example 3A | Every one layer | Absent | — | — | — | Polyimide film | 12.5 | — | — |
| Example 15A | Every one layer | Absent | — | — | — | Polyimide film | 12.5 | Teflon | 20 |

TABLE 14

| | Evaluations | | | | | | | |
|---|---|---|---|---|---|---|---|---|
| | Heat dissipation property | | | | | Powder falling | | |
| | Amount of temperature decrease | Rating | Bendability | | Lightweight property | | Surface(s) corresponding to a powder adhering portion(s) | Rating |
| | | | Visible damage | Rating | Weight | Rating | | |
| Example 3A | 54.1 | A | No damage | A | 2.92 | A | Absent | A |
| Example 15A | 54.1 | A | No damage | A | 2.92 | A | Absent | A |

| | Evaluations | | | |
|---|---|---|---|---|
| | | | Adhesion force | |
| | Expansion in vacuum | State of formation of thermally conductive portion | Adhesion force of bonding layer before bonding step | Rating |
| Example 3A | A | B | 0.15 | B |
| Example 15A | A | A | 0.15 | B |

The thermal transport structure 5 in Example 15A has an arrangement similar to that of the thermal transport structure 5 in Example 3A. In Example 15A, the thermal transport structure 5 was produced by a method in which the release layers were each disposed in each gap between the graphite composite sheets 6 before thermal pressing, and the release layers were removed after thermal pressing. This allowed the bonding layers in the thermally conductive portion 11 to be prevented from being partially bonded while maintaining properties equivalent to Example 3A, and thus allowed the fixing portions to be formed with greater accuracy.

Examples B

<Evaluation of Resilience Against Bending>

Figure 17:
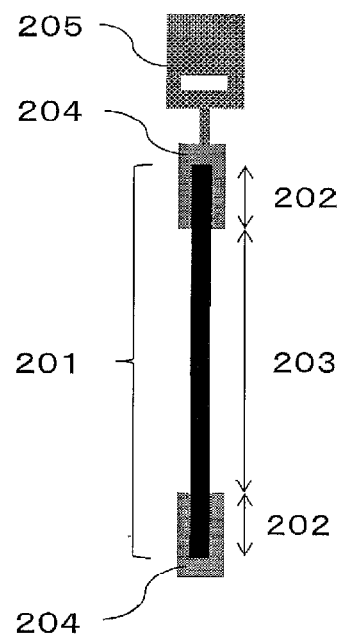
FIG. 17 illustrates an initial state in evaluation of resilience against bending of a thermal transport structure in accordance with an embodiment of the present invention.

As illustrated in FIG. 17, metal jigs 204 were attached to fixing portions 202 provided on both ends of each of the thermal transport structures 201 produced in Examples and Comparative Examples. To one of the metal jigs 204, a force gauge (DS2-2N manufactured by AMADA Co., Ltd.) as a jig for load measurement 205 was further attached. Each thermal transport structure 201 was placed in an upright position such that the metal jig 204 with the jig for load measurement 205 attached thereto was provided on an upper side while the metal jig 204 with no jig for load measurement 205 attached thereto was provided on a lower side. Then, the metal jig 204 with no jig for load measurement 205 attached thereto was fixed so as not to be moved. In this state, a numerical value shown on the force gauge was reset to zero once so that a weight of the thermal transport structure 201 would not be included.

Figure 18:
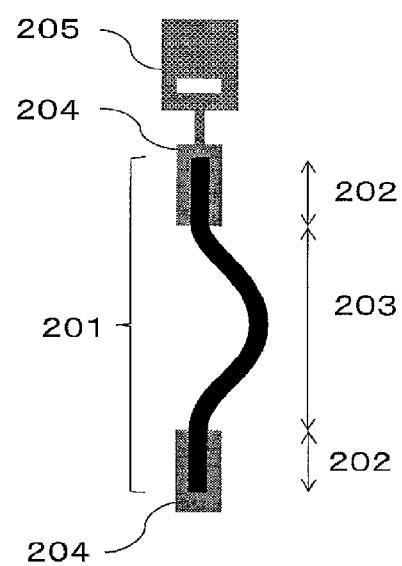
FIG. 18 illustrates a bent form in evaluation of resilience against bending of a thermal transport structure in accordance with an embodiment of the present invention.

Subsequently, as illustrated in FIG. 18, the upper-side fixing portion 202 was moved downward to make the two fixing portions 202 closer to each other, so that a length of the thermally conductive portion 203 was shortened. Specifically, the length of the thermally conductive portion 203 (distance between the fixing portions 202) was shortened so that the length of the thermally conductive portion 203 (distance between the fixing portions 202) in a state of being shortened (in the state illustrated in FIG. 18) becomes smaller by 10% than the length of the thermally conductive portion 203 (distance between the fixing portions 202) in a state of not being shortened (in the state illustrated in FIG. 17). Further, the positions of the two fixing portions 202 were fixed to prevent the metal jig 204 from suffering bending and/or rotation that emanated from an axis of the jig for load measurement 205. By reading a value given by the jig for load measurement 205 in the state illustrated in FIG. 18, a stress in the longitudinal direction was measured. Then, a resilience against bending R was determined based on Equation (2) above and was evaluated.

A case where the resilience against bending R was not more than 20 N/cm was evaluated as "A", a case where the resilience against bending R was more than 20 N/cm and not more than 40 N/cm was evaluated as "B", a case where the resilience against bending R was more than 40 N/cm and less than 80 N/cm was evaluated as "C", and a case where the resilience against bending R was more than N/cm was evaluated as "D". Thermal transport structures having resilience against bending rated as A and B were evaluated as being excellent in resilience against bending.

<Evaluation of Reliability Against Vibrations and Evaluation of Heat Transport Performance>

Figure 19:
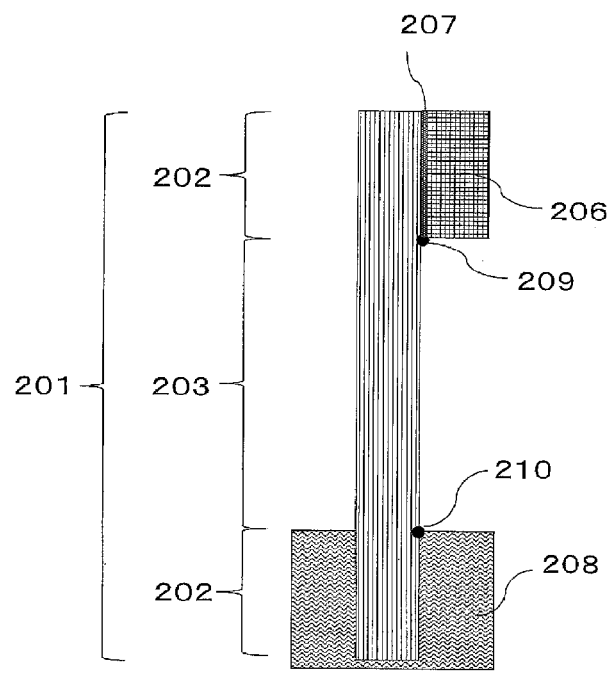
FIG. 19 illustrates a method of evaluating thermal performance of a thermal transport structure in accordance with an embodiment of the present invention.

As illustrated in FIG. 19, on one of fixing portions 202 of a thermal transport structure 201, a heater 206, which was a micro ceramic heater (MS-3) manufactured by Sakaguchi E.H VOC Corp., was placed via a thermally conductive adhesive 207, which was a λ GEL sheet (COH-4000LVC) manufactured by Taica Corporation. The other one of the fixing portions 202 was water-cooled by being immersed in water of 18° C. in a water bath 208, so that thermal performance evaluation was carried out. The heater was caused to generate heat by application of 1 W to the heater and was then let stand in this state for 30 minutes. Temperatures of temperature sensing parts 209 and 210 of the thermally conductive portion were measured with use of a thermocouple. A difference between the temperature thus measured at the temperature sensing part 209 and the temperature thus measured at the temperature sensing part 210 was denoted as an initial temperature T0.

Figure 20:
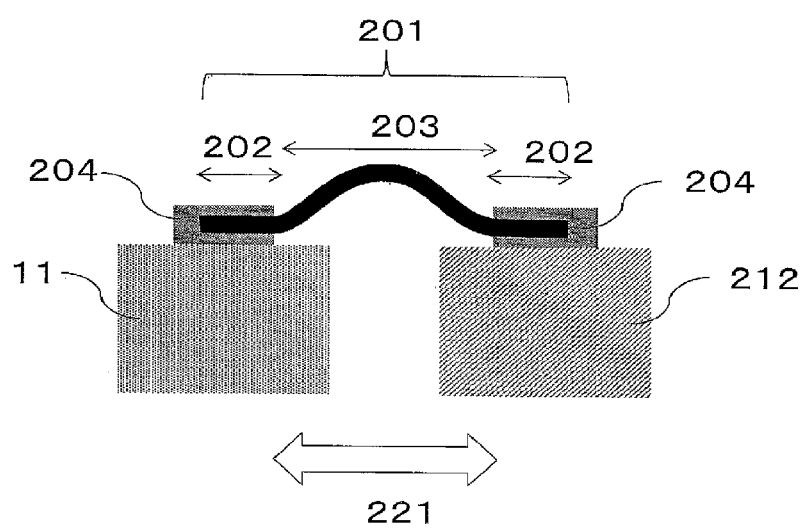
FIG. 20 illustrates a vibration test method for a thermal transport structure in accordance with an embodiment of the present invention.

Next, as illustrated in FIG. 20, a metal jig 204 attached to one of the fixing portions 202 of the thermal transport structure 201 was fixed onto a fixing platform 211. The other one of the fixing portions 202 was attached to a vibration tester 212, which was a compact desktop testing machine (available from AS ONE Corporation; model number: CV-101). In so doing, the other one of the fixing portions 202 was attached to the vibration tester 212 in a state such that the thermally conductive portion 203 was shortened so that the length of the thermally conductive portion 203 became smaller by 10% than the length of the thermally conductive portion 203 in a state of not being bent. In this state, a vibration test in which the vibration tester 12 was vibrated at an amplitude of 1 mm and at a frequency of 10 Hz was carried out for 24 hours. An amplitude direction was a longitudinal direction 221 of the thermally conductive portion 203.

Subsequently, the thermal performance evaluation illustrated in FIG. 19 was carried out again. Assuming that a difference between the temperature thus measured at the temperature sensing part 209 and the temperature thus measured at the temperature sensing part 210 was denoted as T1, a temperature changing rate r (%) of the thermally conductive portion was determined based on Equation (3) below. On the basis of the temperature changing rate r thus determined, reliability against vibrations was evaluated.

$$r=(T1-T0)/T0\times 100 \quad (3)$$

A case where the temperature changing rate was not less than 0% and less than 5% was rated as "A", a case where the temperature changing rate was not less than 5% and less than 10% was rated as "B", a case where the temperature changing rate was not less than 10% and less than 20% was rated as "C", and a case where the temperature changing rate was not less than 20% was rated as "D". Thermal transport structures having a temperature changing rate rated as A and B, which represent low temperature changing rates, were evaluated as being excellent in reliability against vibrations.

Evaluation of heat transport performance was carried out on only thermal transport structures in which the thermally conductive portion 203 of 30 mm in width and 70 mm in length was included and ten thermally conductive sheets were stacked on top of each other. A case where a value of T1 after the vibration test was less than 10° C. was rated as "A", a case where a value of T1 after the vibration test was not less than 10° C. and less than 20° C. was rated as "B", a case where a value of T1 after the vibration test was not less than 20° C. and less than 40° C. was rated as "C", and a case where a value of T1 after the vibration test was not less than 40° C. was rated as "D". Thermal transport structures having a T1 value rated as A and B, which represent small T1 values, were evaluated as being excellent in heat transport performance.

Example 1B

An arrangement of Example 1B is illustrated in FIG. 22. A 37-μm-thick graphite sheet of 1400 W/k·K in thermal conductivity in a plane direction (manufactured by Kaneka Corporation), which served as a graphite sheet 213, was cut to 30 mm in width and 110 mm in length. Both surfaces of the graphite sheet 213 were laminated with respective 10-μm-thick polyethylene terephthalate (PET) tapes (GL-10B manufactured by Nichiei Kakoh Co., Ltd.; having a sticky resin on one surface), which served as covering layers 215. Then, in a state in which the covering layers 215 were formed entirely on both surfaces and edges of the graphite sheet 213, unwanted portions of the PET tape were cut away to obtain a graphite composite sheet 222, which was a thermally conductive sheet measuring 32 mm in width and 112 mm in length.

Next, in order to form fixing portions 202, respective double-sided tapes (NeoFix5S2 manufactured by Nichiei Kakoh Co., Ltd.), which served as bonding layers 214, were disposed on both lengthwise ends (each of which had a 32-mm-wide and 21-mm-long area) of the graphite composite sheet 222. Each graphite composite sheet 222 on which the bonding layers 214 were disposed was stacked in 10 layers, and the stacked layers were then bonded to each other. This produced a thermal transport structure 201 having a thermally conductive portion 203 (32 mm in width, 70 mm in length, and 680 μm in thickness) which was provided between the fixing portions 202. Results are shown in Table 15.

Example 2B

An arrangement of Example 2B is illustrated in FIG. 22. A 37-μm-thick graphite sheet of 1400 W/k·K in thermal conductivity in a plane direction (manufactured by Kaneka Corporation), which served as a graphite sheet 213, was cut to 30 mm in width and 70 mm in length. Both surfaces of the graphite sheet 213 were laminated with respective 10-μm-thick polyethylene terephthalate (PET) tapes (GL-10B manufactured by Nichiei Kakoh Co., Ltd.; having a sticky resin on one surface), which served as covering layers 215. Then, the covering layers were cut to mm in width and 72 mm in length such that the covering layers were formed entirely on both surfaces and edges of the graphite sheet 213. As a result, a graphite composite sheet 222, which was a thermally conductive sheet, was obtained. Next, in order to form fixing portions 202, respective double-sided tapes (NeoFix5S2 manufactured by Nichiei Kakoh Co., Ltd.), which served as bonding layers 214, were disposed on both ends (each of which had a 32-mm-wide and 21-mm-long area) of the graphite composite sheet 222. Each graphite composite sheet 222 was stacked in 10 layers, and the stacked layers were then bonded to each other. This produced a thermal transport structure 201 having a thermally conductive portion 203 (32 mm in width, 70 mm in length, and 680 μm in thickness) which was provided between the fixing portions 202. Results are shown in Table 15.

Example 3B

An arrangement of Example 3B is illustrated in FIG. 22. A 37-μm-thick graphite sheet of 1400 W/k·K in thermal conductivity in a plane direction (manufactured by Kaneka Corporation), which served as a graphite sheet 213, was cut to 30 mm in width and 440 mm in length. Both surfaces of the graphite sheet 213 were laminated with respective 10-μm-thick polyethylene terephthalate (PET) tapes (GL-10B manufactured by Nichiei Kakoh Co., Ltd.; having a sticky resin on one surface), which served as covering layers 215. Then, the covering layers were cut to 32 mm in width and 442 mm in length such that the covering layers were formed entirely on both surfaces and edges of the graphite sheet 213. As a result, a graphite composite sheet 222, which was a thermally conductive sheet, was obtained. Next, in order to form fixing portions 202, respective double-sided tapes (NeoFix5S2 manufactured by Nichiei Kakoh Co., Ltd.), which served as bonding layers 214, were disposed on both ends (each of which had a 32-mm-wide and 21-mm-long area) of the graphite composite sheet 222. Each graphite composite sheet 222 was stacked in 10 layers, and the stacked layers were then bonded to each other. This produced a thermal transport structure 201 having a thermally conductive portion 203 (32 mm in width, 400 mm in length, and 680 μm in thickness) which was provided between the fixing portions 202. Results are shown in Table 15.

Example 4B

An arrangement of Example 4B is illustrated in FIG. 22. A polyimide film (75AH) manufactured by Kaneka Corporation was carbonized by being preliminarily heated to a temperature of 1000° C. in an inert gas. Thereafter, the carbonized film was graphitized by being heat-treated to a temperature of 2800° C. under pressure in an inert gas atmosphere. This produced a 100-μm-thick graphite sheet 213 of 500 W/m·K in thermal conductivity in a plane direction. The graphite sheet 213 was processed as in Example 1B. This produced a thermal transport structure 201 having a thermally conductive portion 203 (32 mm in width, 70 mm in length, and 1200 μm in thickness) which was provided between the fixing portions 202. Evaluation results are shown in Table 15.

Example 5B

An arrangement of Example 5B is illustrated in FIG. 22. A polyimide film (75AH) manufactured by Kaneka Corporation was carbonized by being preliminarily heated to a temperature of 1000° C. in an inert gas. Thereafter, the carbonized film was graphitized by being heat-treated to a temperature of 2800° C. under pressure in an inert gas atmosphere. The graphitized film was pressed to a predetermined thickness in a thickness direction. This produced a 50-μm-thick graphite sheet 213 of 1000 W/m·K in thermal conductivity in a plane direction. The graphite sheet 213 was processed as in Example 1B. This produced a thermal transport structure 201 having a thermally conductive portion 203 (32 mm in width, 30 mm in length, and 810 μm in thickness) which was provided between the fixing portions 202. Evaluation results are shown in Table 15.

Example 6B

An arrangement of Example 6B is illustrated in FIG. 21. A 37-μm-thick graphite sheet of 1400 W/m·K in thermal conductivity in a plane direction (manufactured by Kaneka Corporation), which served as a graphite sheet 213, was cut to 30 mm in width and 110 mm in length. Next, in order to form fixing portions 202, respective double-sided tapes (NeoFix5S2 manufactured by Nichiei Kakoh Co., Ltd.), which served as bonding layers 214, were disposed on both ends (each of which had a 30-mm-wide and 20-mm-long area) of the graphite sheet 213. Each graphite sheet 213 was stacked in 10 layers, and the stacked layers were then bonded to each other. This produced a thermal transport structure 201 having a thermally conductive portion 203 (30 mm in width, 70 mm in length, and 370 μm in thickness) which was provided between the fixing portions 202. Evaluation results are shown in Table 15.

Example 7B

An arrangement of Example 7B is illustrated in FIG. 23. Note that each dashed line represents a non-bonding portion 216 and means a state in which graphite composite sheets 222, which are thermally conductive sheets, are not bonded to each other. A 37-μm-thick graphite sheet of 1400 W/k·K in thermal conductivity in a plane direction (manufactured by Kaneka Corporation), which served as a graphite sheet 213, was cut to 30 mm in width and 110 mm in length. On both surfaces of the graphite sheet 213, respective 40-mm-wide and 120-mm-long polyethylene terephthalate (PET) films (manufactured by Toray Industries, Inc.; 12 μm in thickness), which served as covering layers 215, were disposed. Then, thermal welding was carried out by pressing at a pressure of 10 MPa for 5 minutes under heating at 250° C. Then, the covering layers were cut to 32 mm in width and 112 mm in length such that the covering layers were formed entirely on both surfaces and edges of the graphite sheet 213. As a result, a graphite composite sheet 222, which was a thermally conductive sheet, was obtained. Each graphite composite sheet 222 was stacked into 10 layers. In order to form fixing portions 202, only each 32-mm-wide and 21-mm-long area of both ends of the graphite composite sheet 222 was pressed at a pressure of 1 MPa for 1 minute under heating at 240° C. This produced a thermal transport structure 201 having a thermally conductive portion 203 (32 mm in width, 70 mm in length, and 610 μm in thickness) which was provided between the fixing portions 202. Evaluation results are shown in Table 15.

Example 8B

Figure 24:
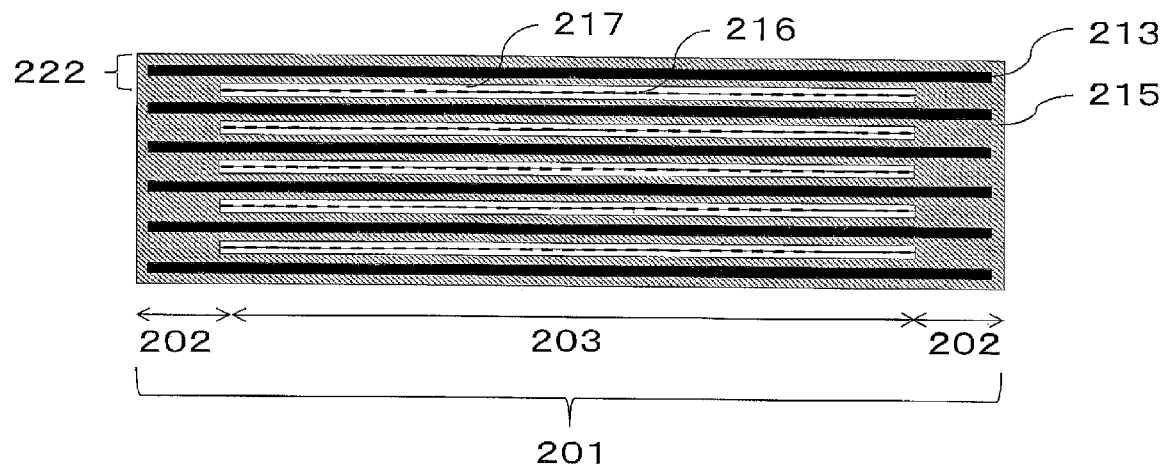
FIG. 24 illustrates an embodiment of a thermal transport structure in accordance with the present invention.

An arrangement of Example 8B is illustrated in FIG. 24. Note that each dashed line represents a non-bonding portion 216 and means a state in which graphite composite sheets 222 are not bonded to each other. A 37-μm-thick graphite sheet of 1400 W/k·K in thermal conductivity in a plane direction (manufactured by Kaneka Corporation), which served as a graphite sheet 213, was cut to 30 mm in width and 110 mm in length. Both surfaces of the graphite sheet 213 were laminated, at 100° C., with respective urethane adhesive sheets TSU0041SI (10 μm in thickness) (manufactured by Toyochem Co., Ltd.), which served as covering layers 215. Thereafter, the covering layers were cut to 32 mm in width and 112 mm in length such that surfaces of the graphite sheet 213 were entirely covered by the covering layers 215. As a result, a graphite composite sheet 222, which was a thermally conductive sheet, was obtained. Each graphite composite sheet 222 was stacked into 10 layers. In so doing, two polyimide films (12.5 µm in thickness) (manufactured by Kaneka Corporation), which served as non-bonding portion-forming layers 217, cut to 32 mm in width and 70 mm in length, were disposed in the middle of each gap between the graphite composite sheets 222. Then, thermal pressing was carried out entirely on the stacked layers. Thermal pressing was carried out such that a pressure of 0.5 MPa was applied at a temperature of 90° C. for 30 minutes, and then a pressure of 0.5 MPa was applied at a temperature of 150° C. for 60 minutes. This produced a thermal transport structure 1 having a thermally conductive portion 203 (32 mm in width, 70 mm in length, and 810 µm in thickness) which was provided between the fixing portions 202. Evaluation results are shown in Table 15.

Example 9B

An arrangement of Example 9B is illustrated in FIG. 25. A 37-µm-thick graphite sheet of 1400 W/k·K in thermal conductivity in a plane direction (manufactured by Kaneka Corporation), which served as a graphite sheet 213, was cut to 30 mm in width and 110 mm in length. Both surfaces of the graphite sheet 213 were laminated with respective 10-µm-thick polyethylene terephthalate (PET) tapes (GL-10B manufactured by Nichiei Kakoh Co., Ltd.; having a sticky resin on one surface), which served as covering layers 215. Then, the covering layers were cut to 32 mm in width and 112 mm in length such that the covering layers were formed entirely on both surfaces and edges of the graphite sheet 213. As a result, a graphite composite sheet 222, which was a thermally conductive sheet, was obtained. Next, each graphite composite sheet 222 was stacked in 10 layers to obtain a multilayer body. Respective aluminum plates of 32 mm in width, 21 mm in length, and 0.5 mm in thickness, which served as flat plates 218, were disposed on both ends of each of upper and lower surfaces of the multilayer body. In this state, through holes were formed at four corners of each of the flat plates 218 with use of a 5-mm-diameter drill. A total of eight through holes were formed. This simultaneously formed corresponding through holes in each graphite composite sheet 222. SUS M4 bolts, which served as bolts 219, were inserted through the corresponding through holes and were then secured with use of SUS M4 screws, which served as nuts 220. This produced a thermal transport structure 201 having two fixing portions 202 and a thermally conductive portion 203 (32 mm in width, 70 mm in length, and 680 µm in thickness) which was provided between the fixing portions 202. Evaluation results are shown in Table 15.

Example 10B

An arrangement of Example 10B is illustrated in FIG. 25. A 37-µm-thick graphite sheet of 1400 W/k·K in thermal conductivity in a plane direction (manufactured by Kaneka Corporation), which served as a graphite sheet 213, was cut to 100 mm in width and 110 mm in length. Both surfaces of the graphite sheet 213 were laminated with respective 10-µm-thick polyethylene terephthalate (PET) tapes (GL-10B manufactured by Nichiei Kakoh Co., Ltd.; having a sticky resin on one surface), which served as covering layers 215. Then, the covering layers were cut to 102 mm in width and 112 mm in length such that the covering layers were formed entirely on both surfaces and edges of the graphite sheet 213. As a result, a graphite composite sheet 222, which was a thermally conductive sheet, was obtained. Next, each graphite composite sheet 222 was stacked in 10 layers to obtain a multilayer body. Respective aluminum plates of 102 mm in width, 21 mm in length, and 0.5 mm in thickness, which served as flat plates 218, were disposed on both ends of each of upper and lower surfaces of the multilayer body. In this state, through holes were formed at four corners of each of the flat plates 218 with use of a 5-mm-diameter drill. A total of eight through holes were formed. This simultaneously formed corresponding through holes in each graphite composite sheet 222. SUS M4 bolts, which served as bolts 219, were inserted through the corresponding through holes and were then secured with use of SUS M4 screws, which served as nuts 220. This produced a thermal transport structure 201 having two fixing portions 202 and a thermally conductive portion 203 (32 mm in width, 70 mm in length, and 680 µm in thickness) which was provided between the fixing portions 202. Evaluation results are shown in Table 16.

Comparative Example 1B

A 37-µm-thick graphite sheet of 1400 W/k·K in thermal conductivity in a plane direction (manufactured by Kaneka Corporation), which was a graphite sheet 213 was cut to 30 mm in width and 110 mm in length. Both surfaces of the graphite sheet 213 were laminated, at 100° C., with respective urethane adhesive sheets TSU0041SI (10 µm in thickness) (manufactured by Toyochem Co., Ltd.), which served as covering layers 215.

Thereafter, the covering layers were cut to 32 mm in width and 112 mm in length such that surfaces of the graphite sheet 213 were entirely covered by the covering layers 215. As a result, a graphite composite sheet 222, which was a thermally conductive sheet, was obtained. Each graphite composite sheet 222 was stacked into 10 layers, and then thermal pressing was carried out entirely on the stacked layers. Thermal pressing was carried out such that a pressure of 0.5 MPa was applied at a temperature of 90° C. for 30 minutes, and then a pressure of 0.5 MPa was applied at a temperature of 150° C. for 60 minutes. This produced a thermal transport structure 201 having a thermally conductive portion 203 (32 mm in width, 70 mm in length, and 600 µm in thickness) which was provided between two fixing portions 202 (32 mm in width, 21 mm in length, and 600 µm in thickness). Evaluation results are shown in Table 15.

Comparative Example 2B

An arrangement of Comparative Example 2B is illustrated in FIG. 22. A 80-µm-thick graphite sheet of 200 W/k·K in thermal conductivity in a plane direction (manufactured by Toyo Tanso Co., Ltd.) was used as a graphite sheet 213 and processed as in Example 1B. This produced a thermal transport structure 201 having a thermally conductive portion 203 (32 mm in width, 70 mm in length, and 1000 µm in thickness) which was provided between two fixing portions 202 (32 mm in width, 21 mm in length, and 1000 µm in thickness). Evaluation results are shown in Table 15.

Comparative Example 3B

An arrangement of Comparative Example 3B is illustrated in FIG. 25. Note that a 40-µm-thick copper foil of 398

W/k·K in thermal conductivity in a plane direction was used instead of the graphite sheet 213. The copper foil was cut to 30 mm in width and 110 mm in length. Next, in order to form fixing portions 202, respective double-sided tapes (NeoFix5S2 manufactured by Nichiei Kakoh Co., Ltd.), which served as bonding layers 214, were disposed on both ends (each of which had a 30-mm-wide and 20-mm-long area) of the copper foil. Each copper foil was stacked in 10 layers, and the stacked layers were then bonded to each other. This produced a thermal transport structure 201 having a thermally conductive portion 203 (30 mm in width, 70 mm in length, and 400 μm in thickness) which was provided between the fixing portions 202. Evaluation results are shown in Table 15.

Comparative Example 4B

An arrangement of Comparative Example 4B is illustrated in FIG. 25. Note that a 40-μm-thick copper foil of 398 W/k·K in thermal conductivity in a plane direction was used instead of the graphite sheet 213. The copper foil was cut to 30 mm in width and 70 mm in length. Next, in order to form fixing portions 202, respective double-sided tapes (NeoFix5S2 manufactured by Nichiei Kakoh Co., Ltd.), which served as bonding layers 214, were disposed on both ends (each of which had a 30-mm-wide and 20-mm-long area) of the copper foil. Each copper foil was stacked in 10 layers, and the stacked layers were then bonded to each other. This produced a thermal transport structure 201 having a thermally conductive portion 203 (30 mm in width, 30 mm in length, and 400 μm in thickness) which was provided between the fixing portions 202. Evaluation results are shown in Table 16.

Comparative Example 5B

An arrangement of Comparative Example 5B is illustrated in FIG. 25. Note that a 40-μm-thick copper foil of 398 W/k·K in thermal conductivity in a plane direction was used instead of the graphite sheet 213. The copper foil was cut to 30 mm in width and 440 mm in length. Next, in order to form fixing portions 202, respective double-sided tapes (NeoFix5S2 manufactured by Nichiei Kakoh Co., Ltd.), which served as bonding layers 214, were disposed on both ends (each of which had a 30-mm-wide and 20-mm-long area) of the copper foil. Each copper foil was stacked in 10 layers, and the stacked layers were then bonded to each other. This produced a thermal transport structure 201 having a thermally conductive portion 203 (30 mm in width, 400 mm in length, and 400 μm in thickness) which was provided between the fixing portions 202. Evaluation results are shown in Table 16.

Comparative Example 6B

An arrangement of Comparative Example 6B is illustrated in FIG. 25. Note that a 40-μm-thick copper foil of 398 W/k·K in thermal conductivity in a plane direction was used instead of the graphite sheet 213. The copper foil was cut to 100 mm in width and 110 mm in length. Next, in order to form fixing portions 202, respective double-sided tapes (NeoFix5S2 manufactured by Nichiei Kakoh Co., Ltd.), which served as bonding layers 214, were disposed on both ends (each of which had a 30-mm-wide and 20-mm-long area) of the copper foil. Each copper foil was stacked in 10 layers, and the stacked layers were then bonded to each other. This produced a thermal transport structure 201 having a thermally conductive portion 203 (100 mm in width, 70 mm in length, and 400 μm in thickness) which was provided between the fixing portions 202. Evaluation results are shown in Table 16.

TABLE 15

| | Thermally conductive sheet | | | Thermally conductive portion | | |
|---|---|---|---|---|---|---|
| | Type | Thermal conductivity W/m · K | Fixing portion Fixing member | Width mm | Length mm | Bonding or Contact |
| Example 1B | Graphite composite sheet | 1400 | Double-sided tape | 30 | 70 | Absent |
| Example 4B | Graphite composite sheet | 500 | Double-sided tape | 30 | 70 | Absent |
| Example 5B | Graphite composite sheet | 1000 | Double-sided tape | 30 | 70 | Absent |
| Example 6B | Graphite sheet | 1400 | Double-sided tape | 30 | 70 | Absent |
| Example 7B | Graphite composite sheet | 1400 | Absent (covering layer bonding) | 30 | 70 | Absent |
| Example 8B | Graphite composite sheet | 1400 | Absent (covering layer bonding | 30 | 70 | Absent |
| Example 9B | Graphite composite sheet | 1400 | Aluminum plate | 30 | 70 | Absent |
| Comparative Example 1B | Graphite composite sheet | 1400 | Absent (covering layer bonding | 30 | 70 | Present |
| Comparative Example 2B | Graphite composite sheet | 200 | Double-sided tape | 30 | 70 | Absent |
| Comparative Example 3B | Copper foil | 398 | Double-sided tape | 30 | 70 | Absent |

| | Resilience against bending | | Heat transport performance T1 | | Reliability against vibrations Temperature changing rate | |
|---|---|---|---|---|---|---|
| | N/cm | Rating | ° C. | Rating | % | Rating |
| Example 1B | 13.7 | A | 8.7 | A | 2.4 | A |
| Example 4B | 34.7 | B | 12.2 | B | 9.7 | B |
| Example 5B | 17.3 | A | 9.2 | A | 4.5 | A |

TABLE 15-continued

| | | | | | | |
|---|---|---|---|---|---|---|
| Example 6B | 10.1 | A | 7.3 | A | 7.4 | B |
| Example 7B | 11.5 | A | 8.3 | A | 3.8 | A |
| Example 8B | 12.8 | A | 8.3 | A | 3.8 | A |
| Example 9B | 13.7 | A | 9.1 | A | 3.4 | A |
| Comparative Example 1B | 91.1 | D | Unmeasurable (due to breakage of thermally conductive portion) | | | |
| Comparative Example 2B | 16.3 | A | 42 | D | 31.3 | D |
| Comparative Example 3B | 58.3 | C | 22.5 | C | 12.4 | C |

TABLE 16

| | Thermally conductive sheet | | Fixing portion Fixing member | Thermally conductive portion | | |
|---|---|---|---|---|---|---|
| | Type | Thermal conductivity W/m · K | | Width mm | Length mm | Bonding or Contact |
| Example 1B | Graphite composite sheet | 1400 | Double-sided tape | 30 | 70 | Absent |
| Example 2B | Graphite composite sheet | 1400 | Double-sided tape | 30 | 30 | Absent |
| Example 3B | Graphite composite sheet | 1400 | Double-sided tape | 30 | 400 | Absent |
| Example 10B | Graphite composite sheet | 1400 | Aluminum plate | 100 | 70 | Absent |
| Comparative Example 3B | Copper foil | 398 | Absent (covering layer bonding) | 30 | 70 | Absent |
| Comparative Example 4B | Copper foil | 398 | Double-sided tape | 30 | 30 | Absent |
| Comparative Example 5B | Copper foil | 398 | Double-sided tape | 30 | 400 | Absent |
| Comparative Example 6B | Copper foil | 398 | Double-sided tape | 100 | 70 | Absent |

| | Resilience against bending | | Heat transport performance T1 | | Reliability against vibrations Temperature changing rate | |
|---|---|---|---|---|---|---|
| | N/cm | Rating | ° C. | Rating | % | Rating |
| Example 1B | 13.7 | A | 8.7 | A | 2.4 | A |
| Example 2B | 35.3 | B | 3.3 | Not rated | 10.0 | B |
| Example 3B | 19.6 | A | 48 | Not rated | 7.3 | B |
| Example 10B | 15.4 | A | 3 | Not rated | 3.1 | A |
| Comparative Example 3B | 58.3 | C | 22.5 | C | 12.4 | C |
| Comparative Example 4B | 153.1 | D | 10.2 | Not rated | 22.1 | D |
| Comparative Example 5B | 84.2 | D | 112 | Not rated | 14.1 | C |
| Comparative Example 6B | 64.8 | C | 8.3 | Not rated | 12.9 | C |

Examples 1B, 2B, and 3B, whose thermally conductive portions 203 had different lengths, showed that setting the thermally conductive portion 203 to have a length in a preferred range kept the resilience against bending low and thus achieved an excellent temperature changing rate.

Examples 1B, 4B, and 5B, in which thermal conductivity fell within a preferred range, showed not only an excellent T1 but also an excellent temperature changing rate. This is considered to have been achieved because cohesive fracture of the graphite crystals due to vibrations was less likely to occur because of a high degree of orientation of crystals of graphite in the graphite sheets. In contrast, Comparative Example 2B was poor in thermal conductivity and was also poor in heat transport performance and temperature changing rate.

Examples 1B, 6B, 7B, 8B, and 9B, in which the thermal transport structures had thermally conductive sheets in different forms and fixing portions in different forms, showed that the thermal transport structures were excellent in T1 and temperature changing rate regardless of forms as long as the thermally conductive sheets and the fixing portions are in preferable forms.

Example 10B, whose thermally conductive portion 203 was changed in width from the thermally conductive portion 203 in Example 1B, showed that an excellent temperature changing rate was achieved regardless of width.

Comparative Example 1B, in which the thermally conductive sheets in the thermally conductive portion were all bonded to each other, showed a poor resilience against bending. It was impossible to evaluate T1 and a temperature changing rate in Comparative Example 1B since the thermally conductive portion 203 was broken during the vibration test.

Comparative Example 3B showed a poor resilience against bending and a poor thermal conductivity. Accordingly, T1 and a temperature changing rate were also poor. Such a poor temperature changing rate is considered to have occurred because a stress emanating from the thermally conductive portion was transmitted to the fixing portions 202, so that a property of bonding copper foils to each other in the fixing portions 202 was decreased. The thermal transport structures in Comparative Examples 3B, 4B, 5B, and 6B are identical in size to those in Examples 1B, 2B, 3B, and 10B, respectively. Comparison between the thermal transport structures of the same size showed that the thermal transport structures in Examples 1B, 2B, 3B, and 10B were more excellent and were excellent in heat transport performance.

As described above, the thermal transport structures in Examples 1B to 10B were all excellent in T1 and temperature changing rate, since they each had the thermally conductive portion 203 having a length of not less than 30 mm, had a resilience against bending of not more than 40 N/cm, and had a thermal conductivity of not less than 500 W/m·K in a plane direction of the thermally conductive sheet. In contrast, the thermal transport structures in Comparative Examples 1B to 3B were all poor in T1 and temperature changing rate. From this, it is clear that the thermal transport structures in Examples of the present invention have an excellent heat transport performance and a high reliability against vibrations.

INDUSTRIAL APPLICABILITY

An embodiment of the present invention can be suitably used as a heat dissipating material or a thermally conductive material. Specifically, an embodiment of the present invention can be used as a heat dissipating material or a thermally conductive material for any of electronic devices, aircraft equipment, space equipment, equipment to be used under a vacuum condition or a low-pressure condition, automobiles, and the like.

Further, an embodiment of the present invention can be used as a heat dissipating material or a thermally conductive material in production of any of electronic devices, aircraft equipment, space equipment, equipment to be used under a vacuum condition or a low-pressure condition, and automobiles.

REFERENCE SIGNS LIST 1 graphite sheet
2 bonding layer
3 protective layer
4 non-bonding layer
5 thermal transport structure
6 graphite composite sheet
7 bonding layer
10 fixing portion
11 thermally conductive portion
20 thickness of covering part at outer peripheral edge
100 heater
110 A GEL sheet
201 thermal transport structure
202 fixing portion
203 thermally conductive portion
204 metal jig
205 jig for load measurement
206 heater
207 thermally conductive adhesive
208 water bath
209 temperature sensing part
210 temperature sensing part
211 fixing platform
212 vibration tester
213 graphite sheet
214 bonding layer
215 covering layer
216 non-bonding portion
217 non-bonding portion-forming layer
218 flat plate
219 bolt
220 nut
221 longitudinal direction
222 graphite composite sheet
223 heat source
224 cooling source
302 thermally conductive sheet
303 thermally conductive sheet
305 bonding layer
310 fixing portion
311 thermally conductive portion

The invention claimed is:

1. A thermal transport structure comprising:
at least two fixing portions; and
a thermally conductive portion between the fixing portions,
wherein the thermal transport structure has a resilience against bending of not more than 40 N/cm in a case where a distance between the fixing portions is shortened and the thermally conductive portion is compressed by 10% in length,
wherein the fixing portions and the thermally conductive portion are provided with at least two thermally conductive sheets,
wherein the thermally conductive sheets each is a graphite sheet or a graphite composite sheet obtained by covering, by a covering layer, at least a part of (i) a surface and (ii) an edge of the graphite sheet, and
wherein the graphite sheet has a thermal conductivity in a plane direction of not less than 900 W/m·K.

2. The thermal transport structure of claim 1, wherein:
the graphite sheet has a thermal conductivity in a plane direction of not less than 1,000 W/m·K.

3. The thermal transport structure of claim 1, wherein:
in each of the fixing portions, the thermally conductive sheets are kept in a state in which the thermally conductive sheets are bonded to each other via a bonding layer which comprises at least one selected from the group consisting of a thermosetting resin, a thermoplastic resin, and a sticky resin.

4. The thermal transport structure of claim 1, wherein:
the covering layer comprises at least one selected from the group consisting of a thermosetting resin, a thermoplastic resin, and a sticky resin; and
in each of the fixing portions, the covering layer is subjected to thermal curing or thermal welding, or made adhesive, so that the thermally conductive sheets are kept in a state in which the thermally conductive sheets are bonded to each other.

5. The thermal transport structure of claim 1, further comprising:
a flat plate provided on at least one side of at least one fixing portion, wherein each fixing portion and the flat plate have through holes, respectively, and wherein each fixing portion and the flat plate are fixed by a bolt inserted through the through holes such that the thermally conductive sheets are kept in a state in which the thermally conductive sheets are in contact with each other.

6. The thermal transport structure of claim 1, wherein:

in each of the fixing portions, the thermally conductive sheets are kept in a state in which the thermally conductive sheets are in contact with each other or bonded to each other; and in the thermally conductive portion, the thermally conductive sheets are at least partially out of contact with each other or at least partially not bonded to each other.

\* \* \* \* \*